US010204943B2

(12) United States Patent
Suzuki et al.

(10) Patent No.: US 10,204,943 B2
(45) Date of Patent: Feb. 12, 2019

(54) IMAGE SENSOR, METHOD OF MANUFACTURING THE SAME, AND CAMERA WITH PIXEL INCLUDING LIGHT WAVEGUIDE AND INSULATION FILM

(71) Applicant: CANON KABUSHIKI KAISHA, Tokyo (JP)

(72) Inventors: Sho Suzuki, Yokohama (JP); Hideomi Kumano, Tokyo (JP); Koki Takami, Sagamihara (JP); Koichi Fukuda, Tokyo (JP); Kohei Okamoto, Yokohama (JP); Tomoyuki Tezuka, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/668,967

(22) Filed: Aug. 4, 2017

(65) Prior Publication Data

US 2018/0047768 A1 Feb. 15, 2018

(30) Foreign Application Priority Data

Aug. 10, 2016 (JP) .................................. 2016-158129
Jun. 9, 2017 (JP) .................................. 2017-114551

(51) Int. Cl.
*H04N 5/225* (2006.01)
*H01L 27/146* (2006.01)
*H04N 5/232* (2006.01)

(52) U.S. Cl.
CPC .... *H01L 27/14603* (2013.01); *H01L 27/1462* (2013.01); *H01L 27/1463* (2013.01);
(Continued)

(58) Field of Classification Search
CPC ..................... H04N 5/23212; H01L 27/14603
(Continued)

(56) References Cited

U.S. PATENT DOCUMENTS 4,410,804 A 10/1983 Stauffer
8,681,259 B2 3/2014 Yamada
(Continued)

FOREIGN PATENT DOCUMENTS

JP 2009-158800 A 7/2009
JP 2012-114882 A 6/2012
(Continued)

OTHER PUBLICATIONS

U.S. Appl. No. 15/467,919, filed Mar. 23, 2017 (First Named Inventor: Koki Takami).

*Primary Examiner* — Usman A Khan
(74) *Attorney, Agent, or Firm* — Venable LLP

(57) ABSTRACT

An image sensor includes a plurality of pixels. At least a pixel of the plurality of pixels includes a plurality of photoelectric converters arranged in a semiconductor substrate and a light waveguide provided for the plurality of photoelectric converters. The light waveguide includes a main waveguide surrounded by an insulation film so as to pass light entering the plurality of photoelectric converters, and a plurality of sub waveguides each arranged between the main waveguide and a corresponding photoelectric converter of the plurality of photoelectric converters. The plurality of sub waveguides are separated from each other by a separator including an electrically conductive member.

22 Claims, 33 Drawing Sheets

(52) U.S. Cl.
CPC .. *H01L 27/14614* (2013.01); *H01L 27/14621* (2013.01); *H01L 27/14623* (2013.01); *H01L 27/14625* (2013.01); *H01L 27/14627* (2013.01); *H01L 27/14636* (2013.01); *H01L 27/14645* (2013.01); *H01L 27/14685* (2013.01); *H04N 5/23212* (2013.01)

(58) Field of Classification Search
USPC ........................................................ 348/340
See application file for complete search history.

(56) References Cited

U.S. PATENT DOCUMENTS

| | | |
|---|---|---|
| 8,970,769 B2 | 3/2015 | Shinohara et al. |
| 9,059,059 B2 | 6/2015 | Yamada |
| 9,165,964 B2 | 10/2015 | Fukuda |
| 9,219,855 B2 | 12/2015 | Ikemoto |
| 9,307,170 B2 | 4/2016 | Numata |
| 9,369,640 B2 | 6/2016 | Ikemoto |
| 9,437,642 B2 | 9/2016 | Kimura |
| 9,443,891 B2 | 9/2016 | Numata |
| 9,450,008 B2 | 9/2016 | Kikuchi |
| 9,590,004 B2 | 3/2017 | Nobayashi |
| 9,627,427 B2 | 4/2017 | Numata |
| 9,659,991 B2 | 5/2017 | Kumano |
| 2013/0277541 A1* | 10/2013 | Ikemoto ................ G02B 7/34 250/227.11 |
| 2015/0301275 A1* | 10/2015 | Andle ................... G02B 6/293 385/43 |
| 2016/0064447 A1 | 3/2016 | Kimura |
| 2016/0337604 A1 | 11/2016 | Numata |
| 2016/0337608 A1 | 11/2016 | Numata |
| 2016/0351614 A1 | 12/2016 | Kimura |
| 2016/0358963 A1 | 12/2016 | Kikuchi |
| 2017/0084653 A1 | 3/2017 | Nakata |
| 2017/0170230 A1 | 6/2017 | Kumano |

FOREIGN PATENT DOCUMENTS

| | | |
|---|---|---|
| JP | 2013-150314 A | 8/2013 |
| JP | 2014-056067 A | 3/2014 |
| JP | 2014-093343 A | 5/2014 |
| JP | 2014-216970 A | 11/2014 |
| JP | 2015-008535 A | 1/2015 |
| JP | 2015-032610 A | 2/2015 |
| JP | 2015-060855 A | 3/2015 |
| JP | 2015-078855 A | 4/2015 |
| JP | 2015-152739 A | 8/2015 |
| JP | 2015-164283 A | 9/2015 |
| JP | 2015-230963 A | 12/2015 |
| JP | 2015-233043 A | 12/2015 |
| JP | 2016-031993 A | 3/2016 |
| JP | 2016-048711 A | 4/2016 |

* cited by examiner

STEP410

STEP420

STEP430

STEP510

STEP520

F I G. 19A
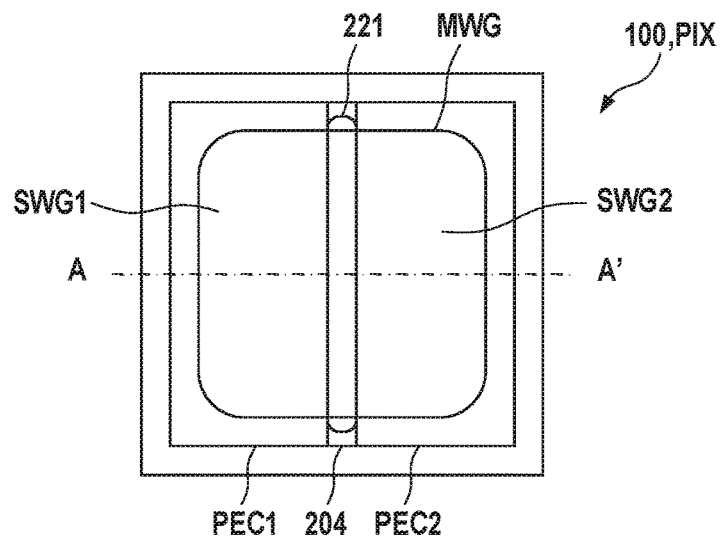
F I G. 19B
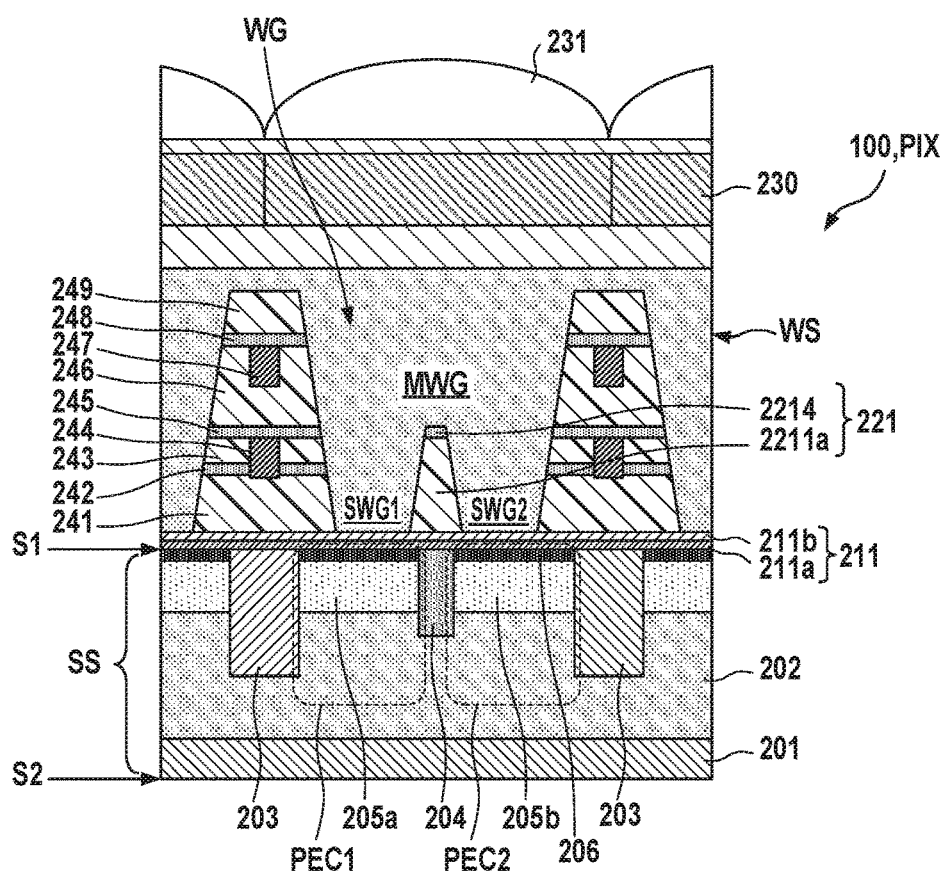

F I G. 25
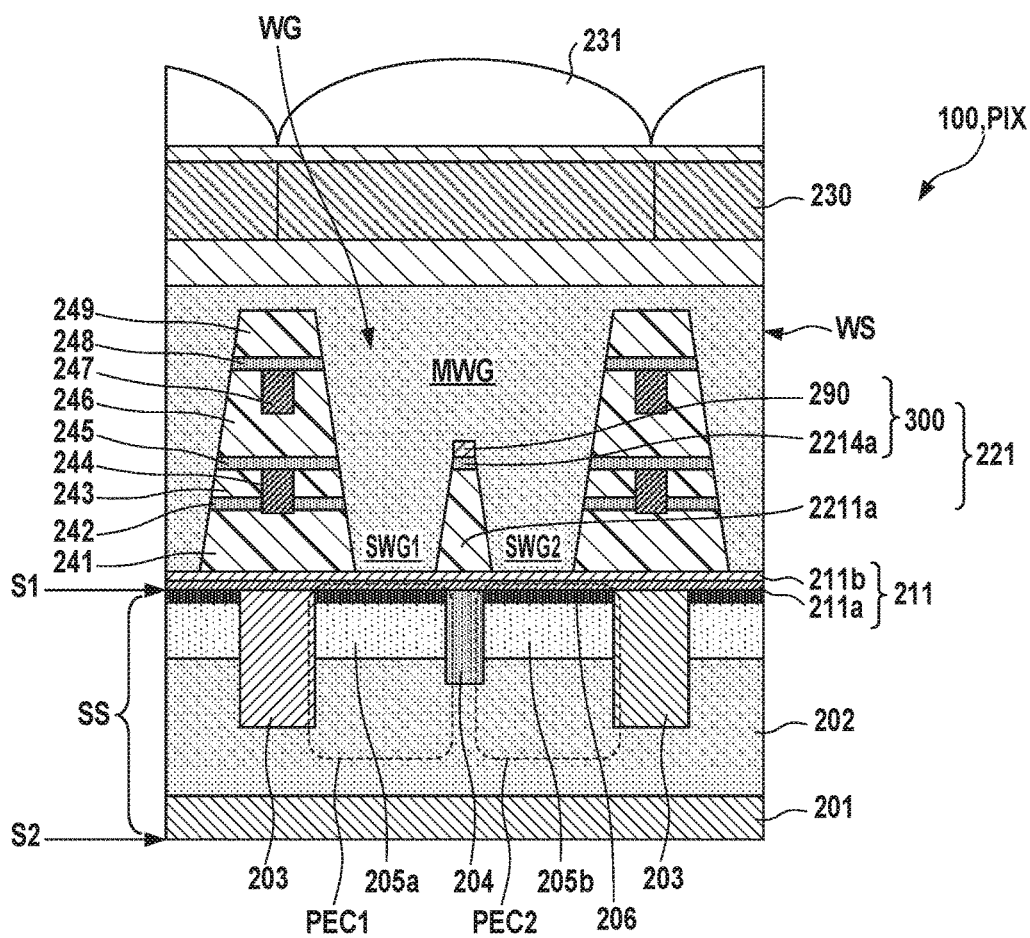

STEP710

STEP720

STEP730

STEP740

IMAGE SENSOR, METHOD OF MANUFACTURING THE SAME, AND CAMERA WITH PIXEL INCLUDING LIGHT WAVEGUIDE AND INSULATION FILM

BACKGROUND OF THE INVENTION

Field of the Invention

The present invention relates to an image sensor, a method of manufacturing the same, and a camera.

Description of the Related Art

There is a solid-state image sensor in which a plurality of photoelectric converters are assigned to one microlens and the plurality of photoelectric converters individually receive a plurality of light beams that have passed through a plurality of regions different from each other in a pupil of an imaging lens. It is possible, by processing the output of such a solid-state image sensor, to detect a phase difference between the plurality of light beams and perform focus detection (detection of defocus amount) from this phase difference.

In order to improve a focus detection accuracy in the solid-state image sensor having a focus detection function as described above, the plurality of light beams, respectively, that have passed through the regions different from each other in the pupil of the imaging lens need to be separated from each other and detected by the plurality of photoelectric converters. Consequently, if a distance between the plurality of photoelectric converters assigned to one microlens is made larger, a pixel density and a resolution are decreased. It is therefore desired that the plurality of light beams be separated from each other while making the distance between the plurality of photoelectric converters assigned to one microlens as small as possible. In order to achieve this, however, an advanced process technology is required.

SUMMARY OF THE INVENTION

The present invention provides a technique advantageous in separating a plurality of light beams in an image sensor.

One of aspects of the present invention provides an image sensor including a plurality of pixels, wherein at least a pixel of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides each arranged between the main waveguide and a corresponding photoelectric converter of the plurality of photoelectric converters, and the plurality of sub waveguides are separated from each other by a separator including an electrically conductive member.

Further features of the present invention will become apparent from the following description of exemplary embodiments with reference to the attached drawings.

BRIEF DESCRIPTION OF THE DRAWINGS

FIGS. 19A and 19B are a schematic plan view and a schematic sectional view showing one pixel of a solid-state image sensor according to the sixth embodiment of the present invention;

FIG. 25 is a schematic sectional view showing one pixel of a solid-state image sensor according to the seventh embodiment of the present invention;

DESCRIPTION OF THE EMBODIMENTS

An image sensor and a method of manufacturing the same of the present invention will be described below through exemplary embodiments with reference to the accompanying drawings. The image sensor can include a solid-state image sensor.

Figure 1A:
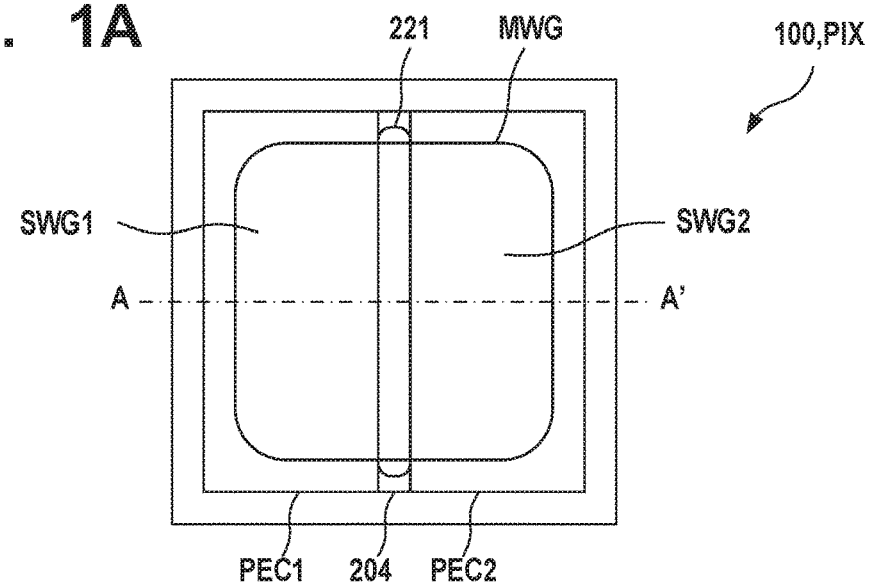
FIGS. 1A and 1B are a schematic plan view and a schematic sectional view showing one pixel of a solid-state image sensor according to the first embodiment of the present invention.
Figure 1B:
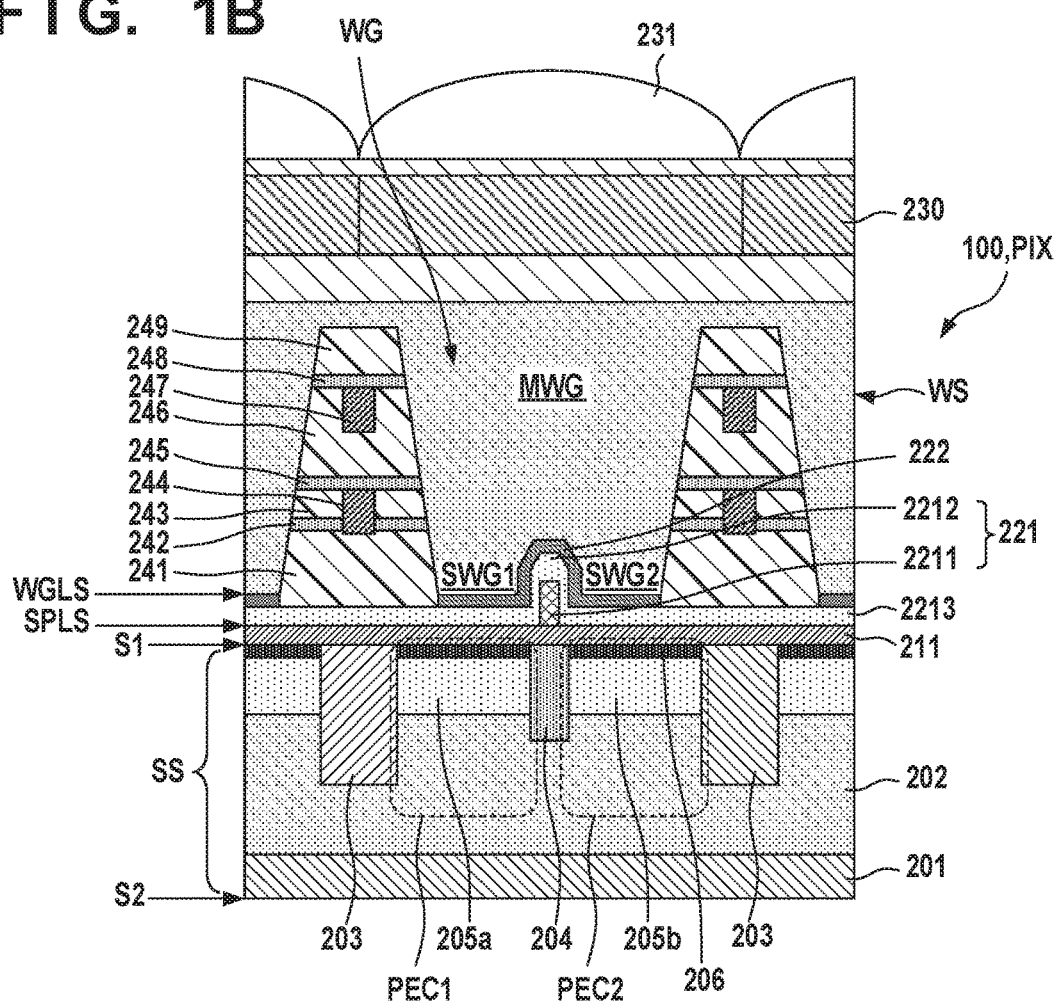

First, the first embodiment of the present invention will be described with reference to FIGS. 1A to 5. FIG. 1A is a schematic plan view showing one pixel PIX as a part of a solid-state image sensor 100 according to the first embodiment of the present invention. FIG. 1B is a schematic sectional view taken along a line A-A' in FIG. 1A. The solid-state image sensor 100 is a solid-state image sensor having a focus detection function, and the pixel PIX that includes a plurality of pixels arranged two-dimensionally all or some (that is, at least some of the plurality of pixels) of which have a focus detection function as shown in FIGS. 1A and 1B. Each pixel without the focus detection function typically includes a single photoelectric converter.

The pixel PIX includes a plurality of photoelectric converters PEC1 and PEC2 arranged in a semiconductor substrate SS, and a light waveguide WG provided for the plurality of photoelectric converters PEC1 and PEC2. The light waveguide WG includes a main waveguide MWG surrounded by insulation films so as to pass light entering the plurality of photoelectric converters PEC1 and PEC2. The light waveguide WG also includes a plurality of sub waveguides SWG1 and SWG2 arranged between the main waveguide MWG and the semiconductor substrate SS. The lights respectively enter the plurality of photoelectric converters PEC1 and PEC2 individually and respectively pass through the plurality of sub waveguides SWG1 and SWG2. The pixel PIX includes an optical separator 221, and the plurality of sub waveguides SWG1 and SWG2 are separated from each other by the separator 221. In this example, the number of photoelectric converters in one pixel PIX is two, and the number of sub waveguides is two accordingly. However, the number of photoelectric converters and the number of sub waveguides in one pixel PIX may be other than two (for example, four). The separator 221 includes a portion having a function of separating the plurality of sub waveguides SWG1 and SWG2 from each other.

A light beam that has passed through the first region in the pupil of an imaging lens (not shown) passes through the main waveguide MWG and the first sub waveguide SWG1, and enters the first photoelectric converter PEC1. A light beam that has passed through the second region different from the first region in the pupil passes through the main waveguide MWG and the second sub waveguide SWG2, and enters the second photoelectric converter PEC2. The phase difference between two light beams is detected based on signals detected by photoelectric conversion in the first photoelectric converters PEC1 of the plurality of pixels PIX and signals detected by photoelectric conversion in the second photoelectric converters PEC2 of the plurality of pixels PIX. Consequently, a focus (defocus amount) is detected.

The separator 221 includes an electrically conductive member 2211 having electrical conductivity. The electrically conductive member 2211 can include a metal material. The separator 221 includes the electrically conductive member 2211, making it possible to increase the separation characteristics of the plurality of light beams that have passed through the regions different from each other in the pupil of the imaging lens, and/or to facilitate the manufacture (for example, simplify a process).

The semiconductor substrate SS can be formed by, for example, a silicon substrate. The semiconductor substrate SS can include, for example, a first semiconductor region 201 of the first conductivity type, a second semiconductor region 202 of the second conductivity type arranged on the first semiconductor region 201, and charge accumulation regions (third semiconductor regions) 205a and 205b of the first conductivity type arranged on the second semiconductor region 202. The semiconductor substrate SS can further include a fourth semiconductor region 206 of the second conductivity type on the charge accumulation regions 205a and 205b. The first photoelectric converter PEC1 can be formed by the second semiconductor region 202, the charge accumulation region 205a, and the fourth semiconductor region 206. The second photoelectric converter PEC2 can be formed by the second semiconductor region 202, the charge accumulation region 205b, and the fourth semiconductor region 206. The first conductivity type and the second conductivity type are conductivity types different from each other. In one example, the first conductivity type is an n type, and the second conductivity type is a p type. In another example, the first conductivity type is the p type, and the second conductivity type is the n type.

The charge accumulation regions 205a and 205b of the plurality of photoelectric converters PEC1 and PEC2 are electrically separated by the fifth semiconductor region of the second conductivity type serving as an electrical separator 204. The charge accumulation portions of the adjacent pixels PIX are electrically separated by electrical separators 203.

Although not shown, a charge-voltage converter (floating diffusion) and a transistor such as a transfer transistor which transfers the charges of the charge accumulation portions to the charge-voltage converter can further be arranged in the semiconductor substrate SS. The electrical separators 203 and 204 can be formed by, for example, an insulator (for example, an STI (Shallow Trench Isolation)) and/or a semiconductor region of the second conductivity type.

The semiconductor substrate SS has a first face S1 and a second face S2 on sides opposite to each other. The light waveguide WG is arranged on the side of the first face S1 of the semiconductor substrate SS. An insulation film 211 can be arranged between the light waveguide WG and the first face S1 of the semiconductor substrate SS. The insulation film 211 can be formed by one or a plurality of insulation layers. The insulation film 211 can function as an antireflection film.

A wiring structure WS is arranged on the side of the first face S1 of the semiconductor substrate SS. A color filter layer 230 and a microlens 231 can be arranged above the wiring structure WS. The wiring structure WS can include, for example, interlayer insulation films 241, 243, 246, and 249, an etching stopper film (insulation film) 242, anti-diffusion films (insulation films) 245 and 248, wiring patterns 244 and 247, a contact plug, a via plug, and the like. The wiring pattern 244 can be arranged so as to extend through the etching stopper film 242. The anti-diffusion film 245 can be arranged so as to cover the upper face of the wiring pattern 244. The anti-diffusion film 248 can be arranged so as to cover the upper face of the wiring pattern 247. The wiring patterns 244 and 247 can contain, for example, copper as a principal component. Alternatively, the wiring patterns 244 and 247 can contain, as a principal component, aluminum or tungsten. Each of the interlayer insulation films 241, 243, 246, and 249 can include at least one of, for example, a silicon oxide film and a silicon oxycarbide film. Each of the etching stopper film 242, and the anti-diffusion films 245 and 248 can include at least one of, for example, a silicon carbide film, a silicon oxycarbide film, a silicon carbonitride film, a silicon oxynitride film, and a silicon nitride film. The light waveguide WG is surrounded by insulation films such as the interlayer insulation films 241, 243, 246, and 249, the etching stopper film 242, the anti-diffusion films 245 and 248, and the like.

The waveguide WG can be formed by forming an opening in the wiring structure WS and filling the opening with an insulator. The refractive index of the insulator is higher than those of the interlayer insulation films 241, 243, 246, and 249. The insulator that forms the waveguide WG can be, for example, silicon nitride.

The optical separator 221 can include the electrically conductive member 2211 as described above. The separator 221 can be arranged between the insulation film 211 and the main waveguide MWG. The separator 221 can also include a cover portion 2212 arranged between the electrically conductive member 2211 and the main waveguide MWG so as to cover the electrically conductive member 2211. The cover portion 2212 can be made of a material having a lower refractive index than the waveguide WG. If the refractive index of the main waveguide MWG and those of the sub waveguides SWG1 and SWG2 are different, the cover portion 2212 can be made of a material lower in refractive index than the main waveguide MWG, and at least one, preferably both of the sub waveguides SWG1 and SWG2 of the waveguide WG. In one example, the waveguide WG can be made of silicon nitride, and the cover portion 2212 can be made of silicon oxide. The cover portion 2212 may be arranged so as to cover only the upper face of the electrically conductive member 2211, arranged so as to cover the upper face and side faces of the electrically conductive member 2211, or may be arranged so as not to cover at least some of the side faces of the electrically conductive member 2211. The side faces of the electrically conductive member 2211 are along the sub waveguides SWG1 and SWG2. Alternatively, in another viewpoint, the side faces of the electrically conductive member 2211 face the sub waveguides SWG1 and SWG2 directly or via another layer (for example, the cover portion 2212).

The cover portion 2212 can be made of the same material as an insulation film 2213 arranged so as to cover the insulation film 211. The insulation film 2213 may extend between the insulation film 211 and the wiring structure WS (interlayer insulation film 241). The insulation film 2213 can form an antireflection film together with the insulation film 211. The cover portion 2212 and the insulation film 2213 can be covered with an insulation film 222 which functions as an etching stopper film. The insulation film 222 can be made of, for example, silicon nitride.

Figure 2A:
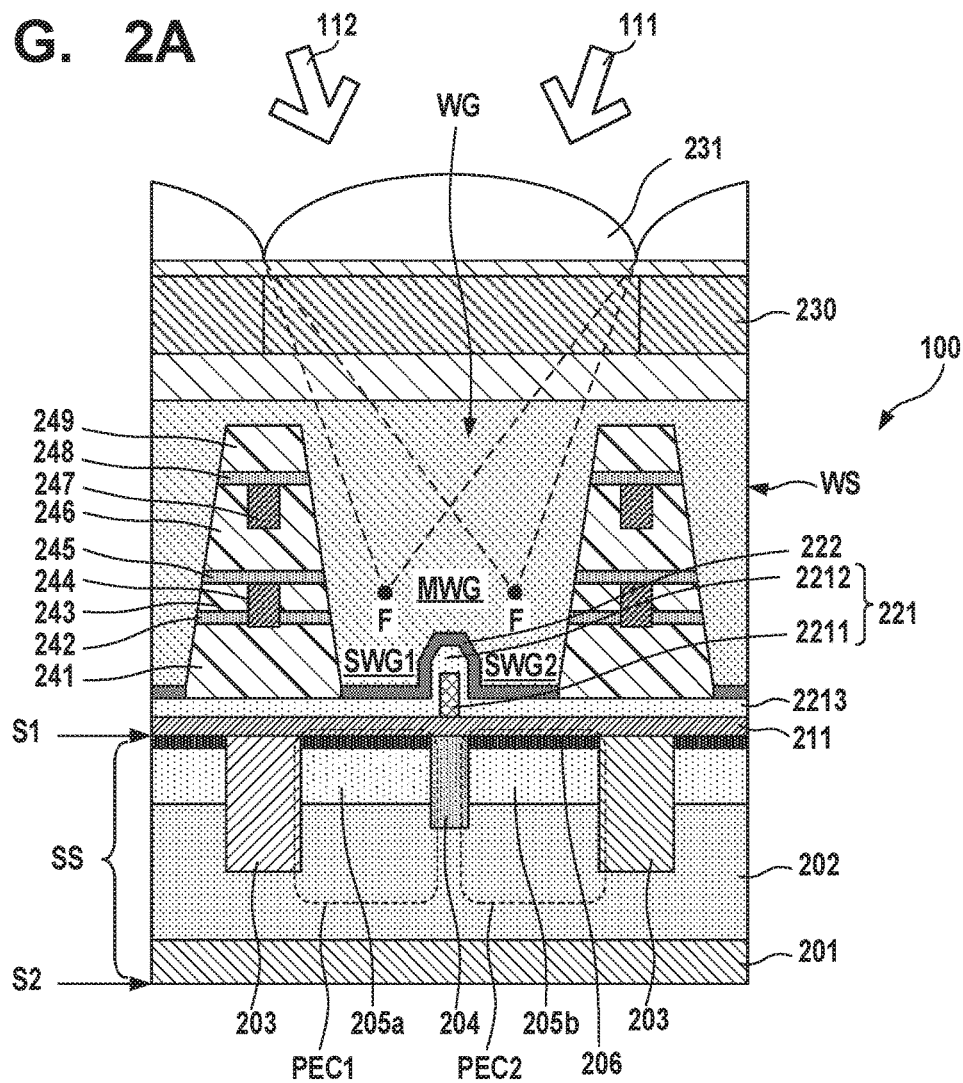
FIGS. 2A and 2B are schematic sectional views for explaining one pixel of the solid-state image sensor according to the first embodiment of the present invention.

FIG. 2A schematically shows light beams 111 and 112 which pass through the plurality of regions different from each other in the pupil of the imaging lens, and enter the plurality of photoelectric converters PEC1 and PEC2 in one pixel of the solid-state image sensor 100. The first light beam 111 that has passed through the first region in the pupil of the imaging lens enters the main waveguide MWG, and then travels to the first sub waveguide SWG1 and further enters the first photoelectric converter PEC1. The second light beam 112 that has passed through the second region in the pupil of the imaging lens enters the main waveguide MWG, and then travels to the second sub waveguide SWG2 and further enters the second photoelectric converter PEC2. The first sub waveguide SWG1 and the second sub waveguide SWG2 are optically separated from each other by the separator 221. Therefore, the separation characteristics of the first light beam 111 and the second light beam 112 are improved so that the almost entire first light beam 111 enters the first photoelectric converter PEC1, and the almost entire second light beam 112 enters the second photoelectric converter PEC2. It is desirable that the distance between the upper face of the separator 221 and the first face S1 of the semiconductor substrate SS is smaller than the distance between the first face S1 of the semiconductor substrate SS, and focuses F of the microlens 231 which condense the first light beam 111 and the second light beam 112.

The electrically conductive member 2211 of the separator 221 can be made of a metal such as tungsten or aluminium, or a metal compound such as TiN. The cover portion 2212 can function as, for example, an antireflection film or a scatterer which scatters light entering the separator 221. If the cover portion 2212 is configured to function as the antireflection film, the separation characteristics of the first light beam 111 and the second light beam 112 can be improved. If the cover portion 2212 is configured to function as the scatterer, light entering the cover portion 2212 can be distributed to one of the first photoelectric converter PEC1 and the second photoelectric converter PEC2 before reflected by the electrically conductive member 2211. Therefore, the sensitivity of the pixel PIX can be improved. Note that an antireflection film on an underlying layer is a film which makes the reflectance of a structure formed by the underlying layer and the antireflection film smaller than the reflectance of the underlying layer if the antireflection film does not exist.

Figure 2B:
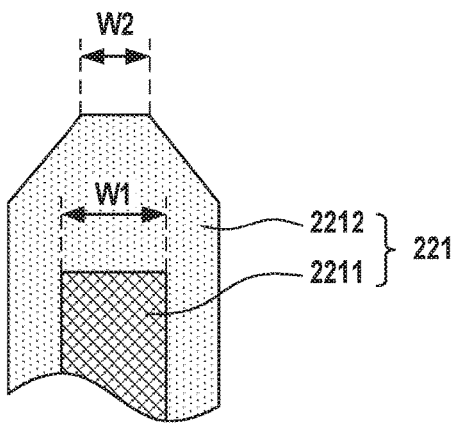

As exemplified in FIG. 2B, the upper portion of the cover portion 2212 preferably includes a taper-shaped portion which tapers as it becomes more spaced apart from the semiconductor substrate SS (the first face S1 thereof). It is possible, by providing the taper-shaped portion, to improve the sensitivity of the pixel PIX while improving the separation characteristics of the first light beam 111 and the second light beam 112. For example, a width W2 of the upper face of the cover portion 2212 can be made smaller than a width W1 of the upper face of the electrically conductive member 2211.

The lower portion of the separator 221 is preferably buried in an insulation film (for example, the insulation film 2213) between a lower face WGLS of the light waveguide WG and the semiconductor substrate SS (the first face S1 thereof). In other words, it is desirable that the distance between a lower face SPLS of the separator 221 and the semiconductor substrate SS (the first face S1 thereof) is smaller than the distance between the lower face WGLS of the light waveguide WG and the semiconductor substrate SS (the first face S1 thereof). Alternatively, it is desirable that the distance between the lower face SPLS of the separator 221 and the second face S2 of the semiconductor substrate SS is smaller than the distance between the lower face of the light waveguide WG and the second face S2. This is advantageous in order to improve the separation characteristics of the first light beam 111 and the second light beam 112. The lower face SPLS of the separator 221 may be positioned between a plane with the upper face of the insulation film 211 and a plane with the lower face. Alternatively, the lower face SPLS of the separator 221 may be positioned between a plane with the first face S1 of the semiconductor substrate SS and a plane with the second face S2. The lower face WGLS of the light waveguide WG is the lower face of each of the sub waveguides SWG1 and SWG2, and can match the upper face of the insulation film 222 which functions as the etching stopper film to be described later if the insulation film 222 exists. In an arrangement in which the separator 221 includes the electrically conductive member 2211 as in the first embodiment, the lower face SPLS of the separator 221 can be defined as the lower face of the electrically conductive member 2211.

Figure 3:
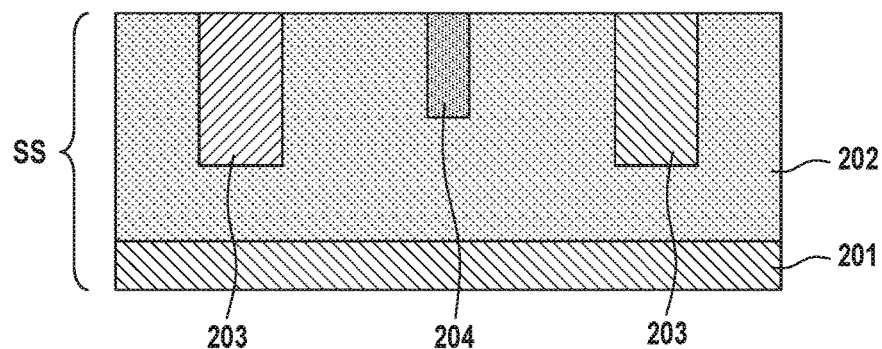
FIG. 3 shows sectional views of a method of manufacturing the solid-state image sensor according to the first embodiment of the present invention.
Figure 3:
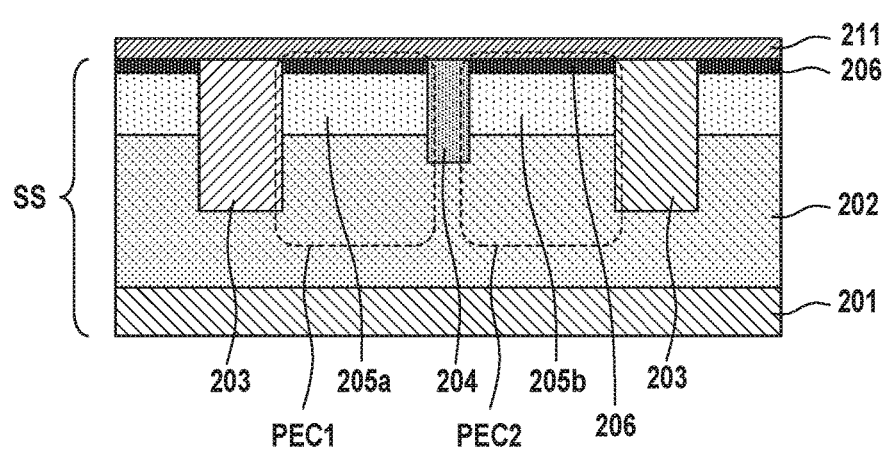
Figure 3:
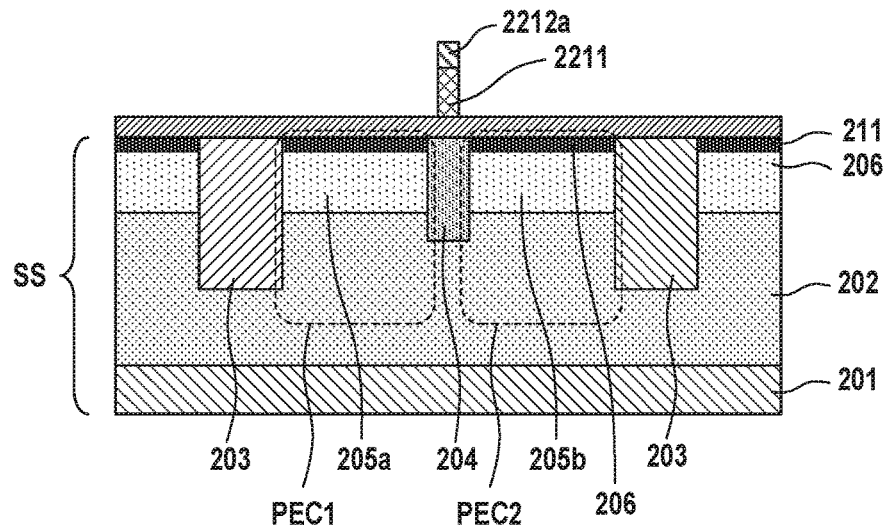
Figure 4:
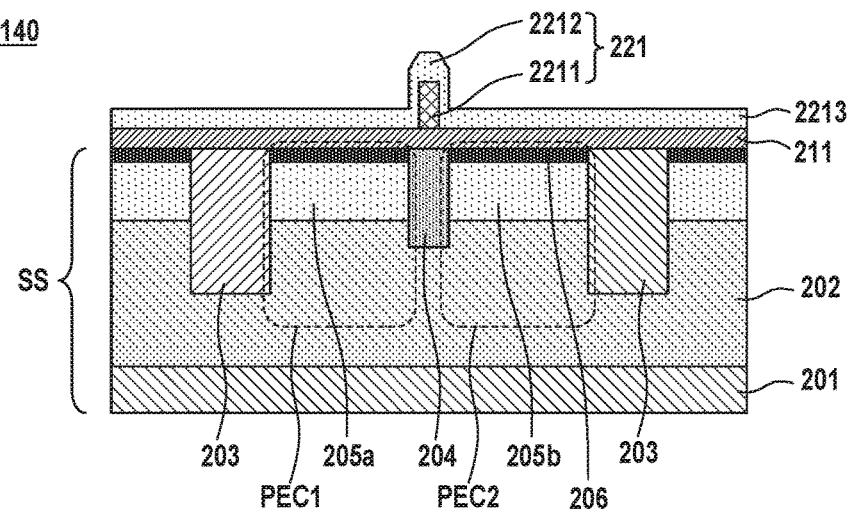
FIG. 4 shows sectional views of the method of manufacturing the solid-state image sensor according to the first embodiment of the present invention.
Figure 4:
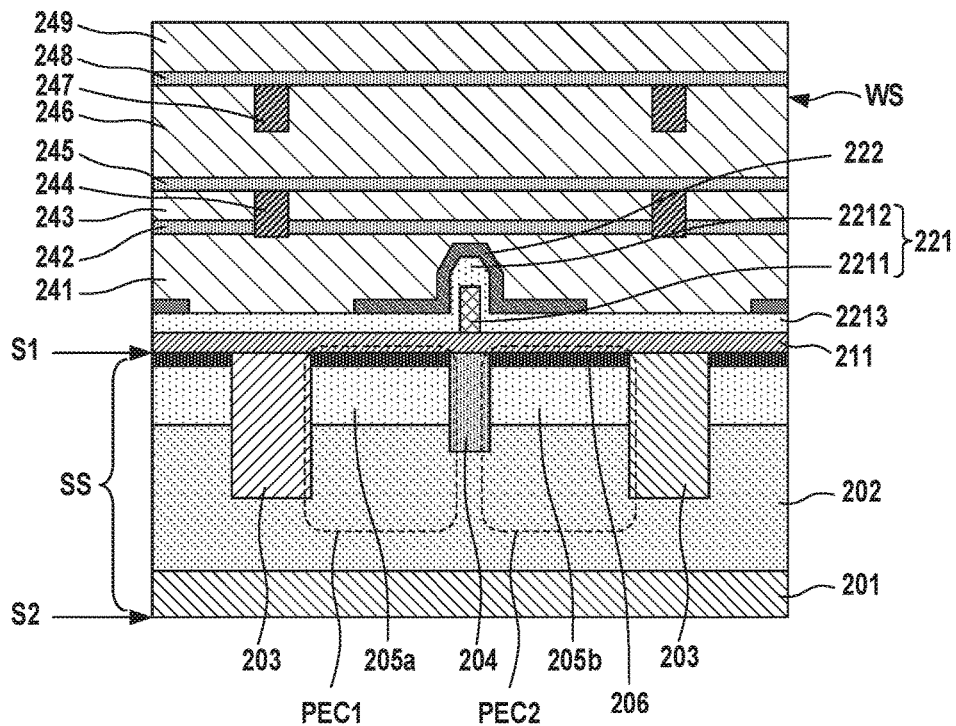
Figure 5:
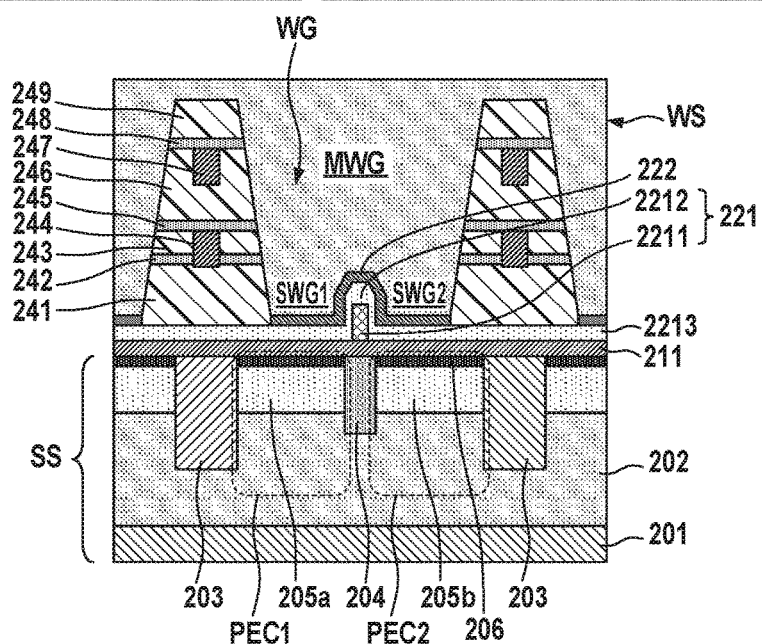
FIG. 5 shows sectional views of the method of manufacturing the solid-state image sensor according to the first embodiment of the present invention.
Figure 5:
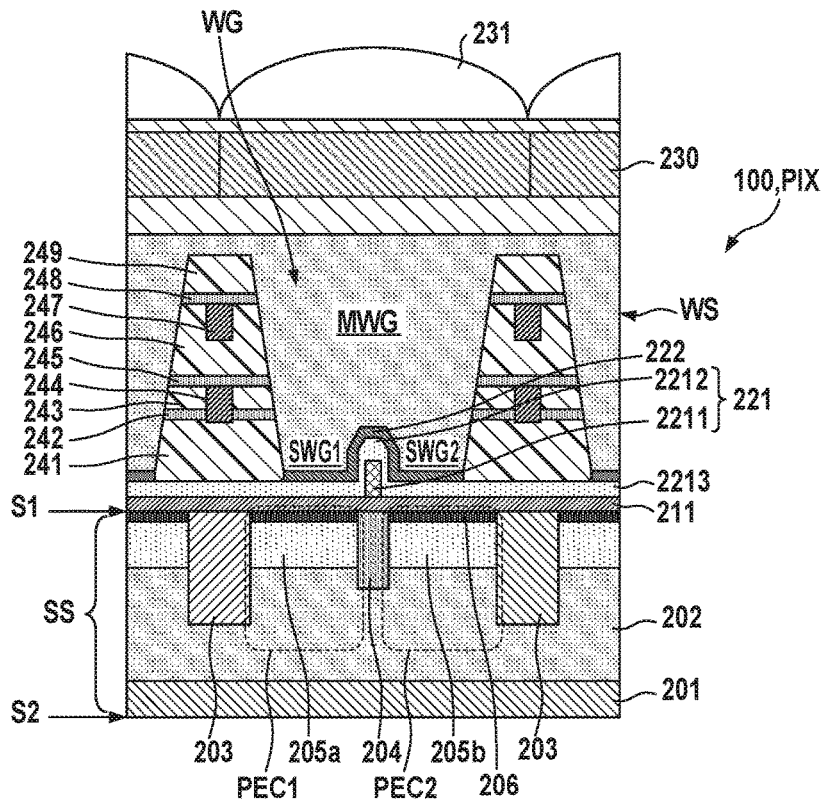

A method of manufacturing the solid-state image sensor 100 according to the first embodiment of the present invention will exemplarily be described below with reference to FIGS. 3 to 5. In a step 110, the second semiconductor region 202, and the separators 203 and 204 can be formed in the semiconductor substrate SS which includes the first semiconductor region 201. The separators 203 and 204 can be formed by, for example, the insulator (for example, an STI (Shallow Trench Isolation)) and/or the semiconductor region of the second conductivity type.

Then, in a step 120, first, a photoresist pattern having an opening can be formed on the semiconductor substrate SS, annealing can be performed after ions (impurity) are implanted into the second semiconductor region 202 via the opening, and the charge accumulation regions 205a and 205b of the first conductivity type can be formed. In the step 120, next, the gate insulation film and gate electrode (not shown) of a transistor can be formed, and diffusion layers (not shown) of the source and drain of the transistor can be formed in the semiconductor substrate SS. In the step 120, next, the fourth semiconductor region 206 of the second conductivity type is formed in the semiconductor substrate SS, and the insulation film 211 is further formed on the semiconductor substrate SS.

Then, in a step 130, an electrically conductive material film can be formed on the insulation film 211, an insulation film such as silicon oxide film can be formed on the electrically conductive material film, and by patterning them, a stacked structure of the electrically conductive member 2211 and an insulation film 2212a (a part of the cover portion) can be formed. Note that the electrically conductive material film can be a metal film of tungsten, aluminium, or the like or a metal compound film of TiN or the like. In a step 140, an insulation film (another part of the cover portion 2212 or the insulation film 2213) such as a silicon oxide film is formed so as to cover the electrically conductive member 2211 and the insulation film 2212a. Consequently, the separator 221 which includes the electrically conductive member 2211 and the cover portion 2212 is formed. Note that it is possible, by forming the insulation film by HDP-CVD (high density plasma chemical vapor deposition) in the step 140, to form the cover portion 2212 which includes the taper-shaped portion as exemplified in FIG. 2B.

Then, in a step 150, the insulation film 222 and the wiring structure WS can be formed. More specifically, in the step 150, first, the insulation film 222 used as the etching stopper film when the wiring structure WS is etched in order to form the waveguide WG can be formed. The insulation film 222 can be arranged in a region where at least the waveguide WG is formed, and can typically be arranged so as to have a region wider than the lower face of the waveguide WG. The insulation film 222 can be made of, for example, silicon nitride. In the step 150, next, the interlayer insulation film 241, the etching stopper film (insulation film) 242, the interlayer insulation film 243, and the wiring pattern 244 can be formed. Note that contact holes can be formed in the interlayer insulation film 241 after the interlayer insulation film 241 is formed, and contact plugs can be formed by filling the contact holes with an electrically conductive material. The wiring pattern 244 can be formed by a damascene process after the interlayer insulation film 243 is formed. At this time, trenches are formed in the interlayer insulation film 243 by etching, and the etching stopper film 242 can be used in order to control the stop of this etching. After etching is stopped by using the etching stopper film 242, etching can further be performed so as to expose the contact plugs buried in the interlayer insulation film 241. Then, the wiring pattern 244 can be formed by depositing the electrically conductive material so as to fill the trenches with the electrically conductive material to form the wiring pattern and removing the unnecessary electrically conductive material by CMP (Chemical Mechanical Polishing) or the like.

In the step 150, next, the anti-diffusion film 245 can be formed so as to cover the interlayer insulation film 243 and the wiring pattern 244. In the step 150, next, the interlayer insulation film 246, the wiring pattern 247, the anti-diffusion film 248, and the interlayer insulation film 249 can be formed. Note that the wiring pattern 247 can be formed by a dual damascene process after the interlayer insulation film 246 is formed. Then, the anti-diffusion film 248 can be formed so as to cover the interlayer insulation film 246 and the wiring pattern 247, and subsequently, the interlayer insulation film 249 can be formed so as to cover the anti-diffusion film 248.

Then, in a step 160, the light waveguide WG is formed in the wiring structure WS. More specifically, in the step 160, first, an opening for forming the light waveguide WG can be formed first in the wiring structure WS by photolithography. At this time, the insulation film 222 can be used as the etching stopper film. In the step 160, next, the opening is filled with an insulator of silicon nitride or the like, forming the light waveguide WG. Note that planarization such as CMP can be performed as needed after the opening is filled with the insulator. Then, in a step 170, an inner lens (not shown), a passivation film, a planarizing film, and the like are formed, and then the color filter layer 230 and the microlens 231 are formed.

In the example above, the wiring structure WS has a two-layer wiring pattern. However, the number of layers for the wiring pattern can be determined arbitrarily. The light waveguide WG may partially be formed while the wiring structure WS is formed.

Figure 6:
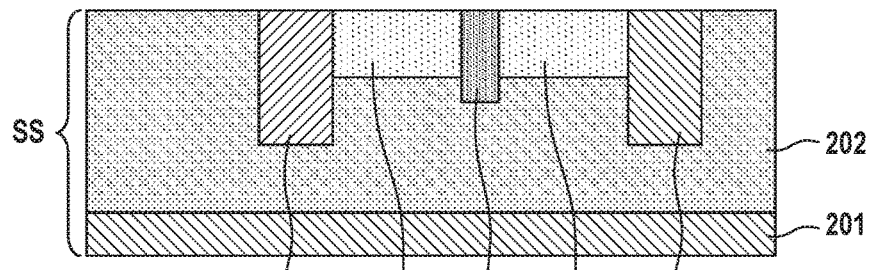
FIG. 6 shows sectional views of a method of manufacturing a solid-state image sensor according to the second embodiment of the present invention.
Figure 6:
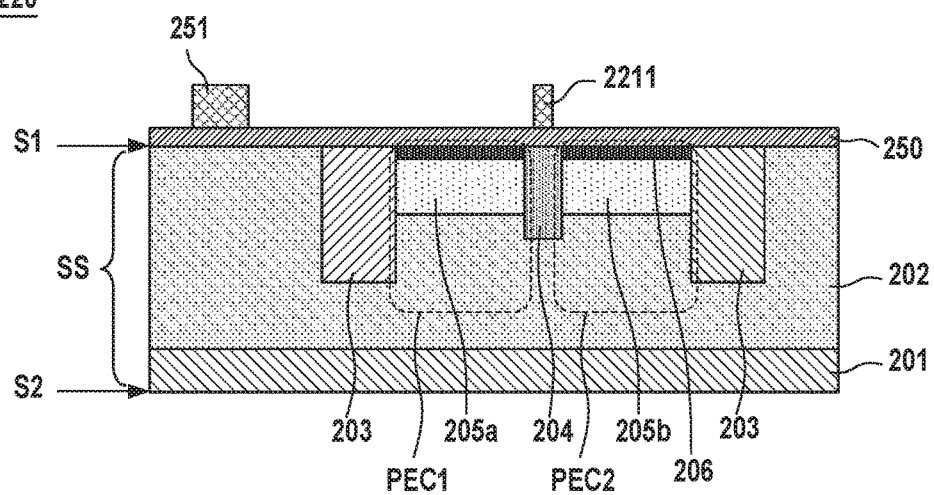
Figure 6:
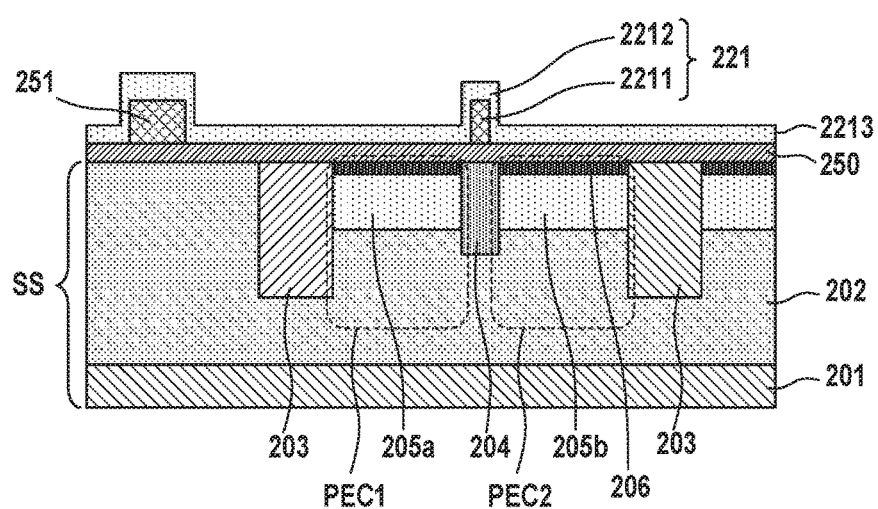
Figure 7:
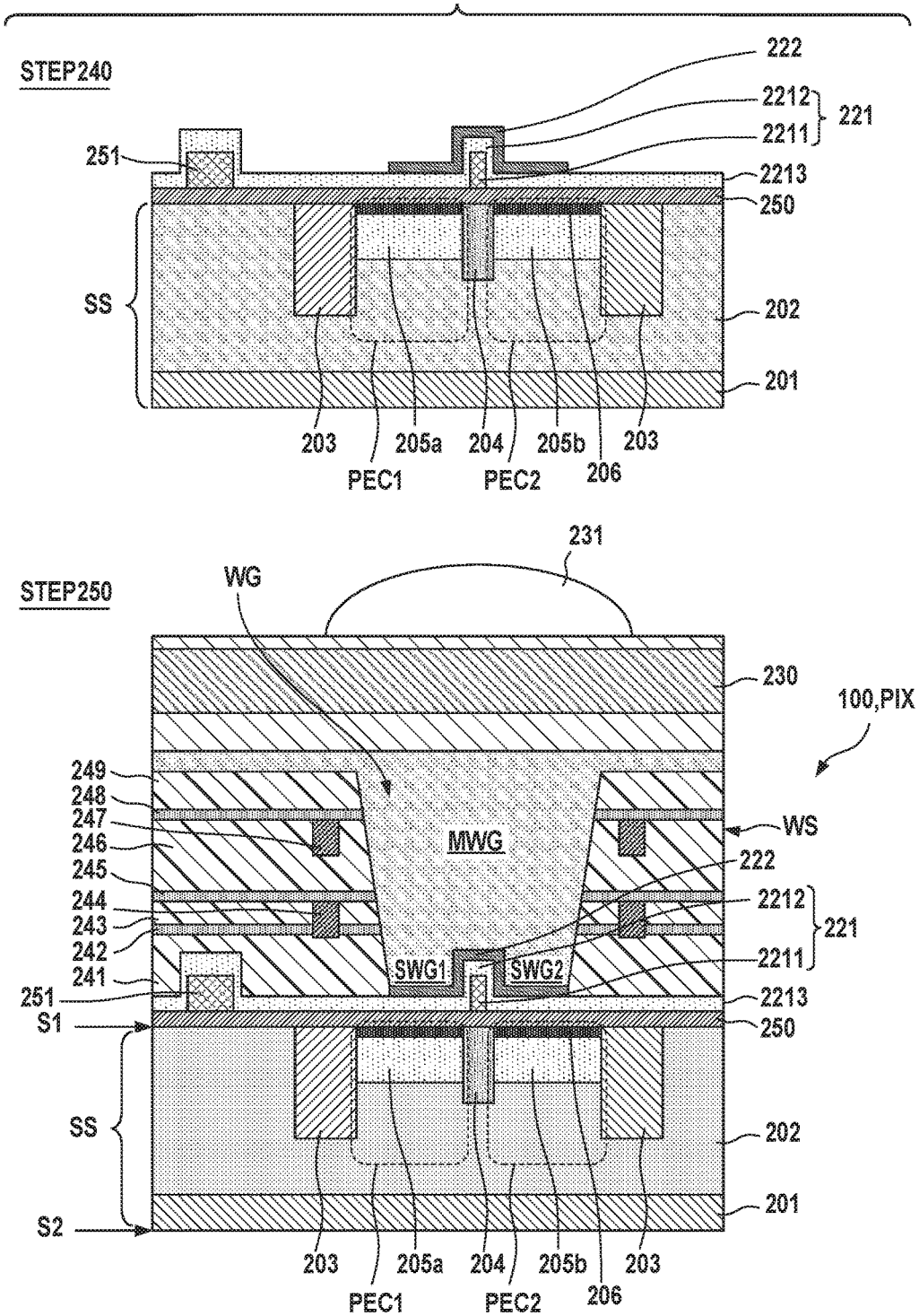
FIG. 7 shows sectional views of the method of manufacturing the solid-state image sensor according to the second embodiment of the present invention.

A method of manufacturing a solid-state image sensor 100 according to the second embodiment of the present invention will exemplarily be described below with reference to FIGS. 6 and 7. Note that matters that are not mentioned in the second embodiment can comply with the first embodiment. The second embodiment is different from the first embodiment in that an electrically conductive member 2211 of an optical separator 221 is formed by a gate electrode material (for example, polysilicon) simultaneously with a gate electrode. Note that the gate electrode material means the same material as a material that forms the gate electrode.

In a step 210, a photoresist pattern having an opening can be formed on a semiconductor substrate SS where a second semiconductor region 202, and separators 203 and 204 are formed, and annealing can be performed after ions are implanted into the second semiconductor region 202 via the opening. Consequently, charge accumulation regions 205a and 205b of the first conductivity type can be formed.

In a step 220, first, a gate insulation film 250 and a gate electrode material film (electrically conductive material film) can be formed sequentially on a first face S1 of the semiconductor substrate SS, and a transfer electrode 251, and the electrically conductive member 2211 can be formed by patterning the gate electrode material film. Consequently, a structure is obtained in which the transfer electrode 251 (gate electrode) are arranged on the gate insulation film 250 on the semiconductor substrate SS, and the electrically conductive member 2211 of the separator 221 is arranged on the gate insulation film 250. Only the transfer electrodes are shown as the gate electrodes here. However, the gate electrode of another transistor can also be formed simultaneously with the electrically conductive member 2211. In the step 220, next, a fourth semiconductor region 206 of the second conductivity type can be formed in the semiconductor substrate SS on the gate insulation film 250.

Then, in a step 230, a cover portion 2212 can be formed so as to cover the gate insulation film 250, the transfer electrode 251, and the electrically conductive member 2211. Then, in a step 240, an insulation film 222 used as an etching stopper film at the time of etching to form a waveguide WG can be formed. The insulation film 222 can be made of, for example, silicon nitride. Then, in a step 250, a wiring structure WS, the light waveguide WG, a color filter layer 230, and a microlens 231 can be formed, as in the first embodiment.

In the second embodiment, the electrically conductive member 2211 of the optical separator 221 is formed by the gate electrode material simultaneously with the transfer electrodes 251a and 251b, simplifying a process and facilitating the manufacture.

A solid-state image sensor 100 according to the third embodiment of the present invention will be described below with reference to FIGS. 8A to 10. Note that matters that are not mentioned in the third embodiment can comply with the first embodiment. The third embodiment is different from the first embodiment in that a metal member as an electrically conductive member 2211 of an optical separator 221 is formed by a light blocking material simultaneously with a light blocking portion.

Figure 8A:
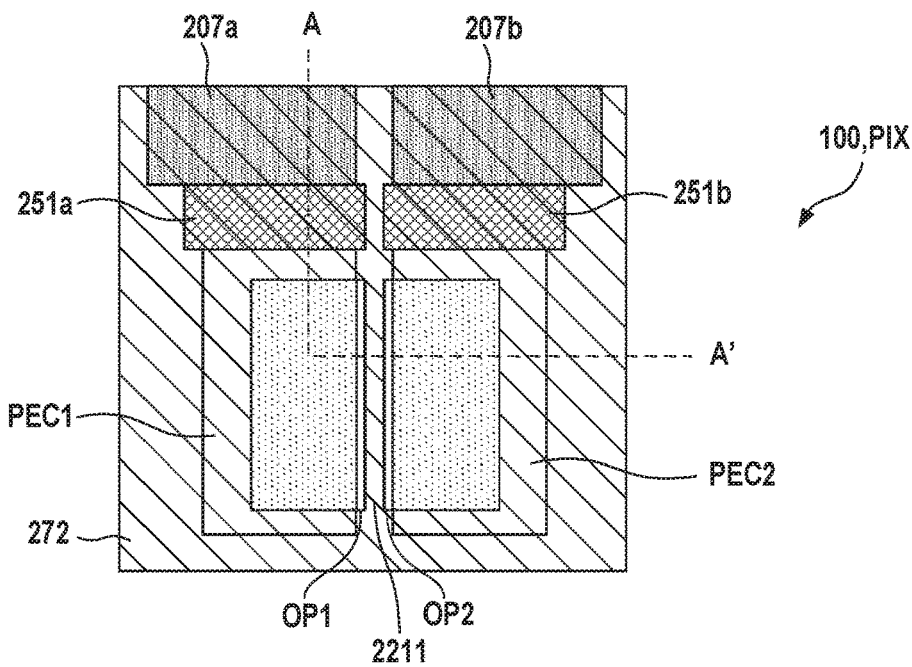
FIGS. 8A and 8B are a schematic plan view and a schematic sectional view showing one pixel of a solid-state image sensor according to the third embodiment of the present invention.
Figure 8B:
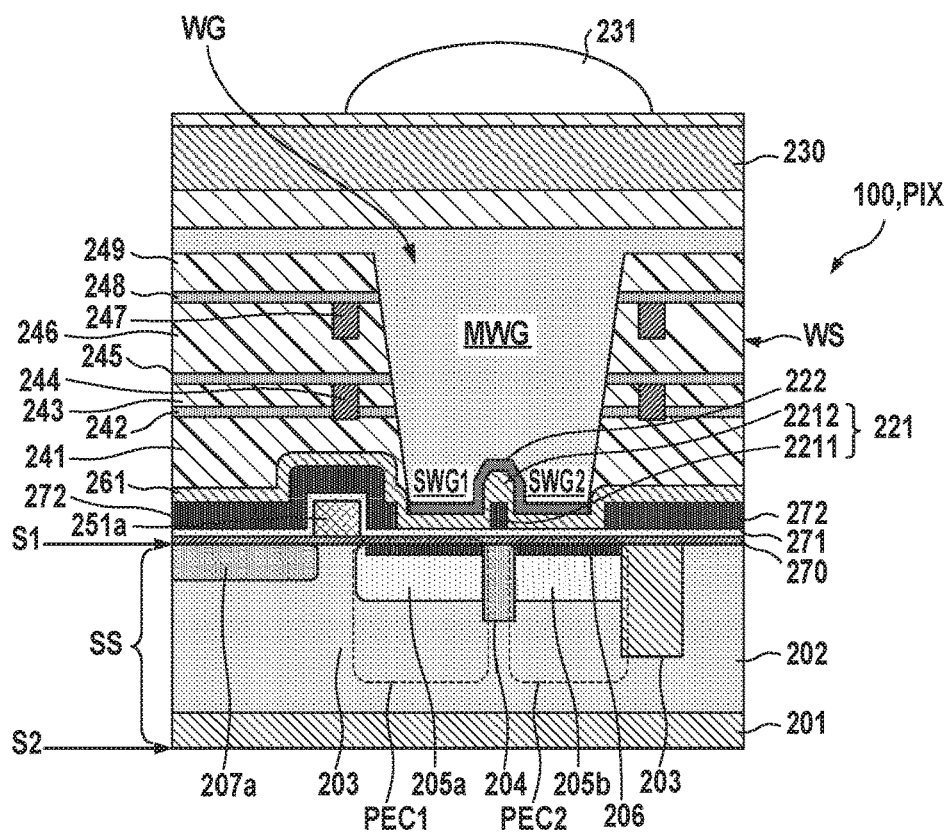

FIG. 8A is a schematic plan view showing one pixel PIX as a part of the solid-state image sensor 100 according to the third embodiment of the present invention. FIG. 8B is a schematic sectional view taken along a line A-A' in FIG. 8A. The solid-state image sensor 100 is a solid-state image sensor having a focus detection function, and the pixel PIX that includes a plurality of pixels arranged two-dimensionally all or some of which have a focus detection function as shown in FIGS. 8A and 8B. Each pixel without the focus detection function typically includes a single photoelectric converter. In FIG. 8A, the illustration of a light waveguide WG is omitted for the sake of clarity of an arrangement.

The solid-state image sensor 100 of the third embodiment implements, in each pixel, a global electronic shutter function by transferring charges accumulated in a photoelectric converter to a charge holding portion and holding them by the charge holding portion. The solid-state image sensor 100 of the third embodiment is different from that in the first embodiment in that the electrically conductive member 2211 of the optical separator 221 is formed simultaneously with a light blocking portion 272 which covers charge holding portions 207a and 207b, and transfer electrodes 251a and 251b (gate electrodes).

The pixel PIX includes the plurality of charge holding portions 207a and 207b, and the plurality of transfer electrodes 251a and 251b so as to correspond to a plurality of photoelectric converters PEC1 and PEC2, respectively. The pixel PIX can further include a plurality of transfer transistors (transfer electrodes) and one or a plurality of floating diffusions, although not shown. The charges of the photoelectric converter can be transferred to the corresponding charge holding portions by the transfer electrodes, and then transferred to the floating diffusions via the corresponding transfer transistors. A signal corresponding to the charges transferred to the floating diffusions can be output to a column signal line via a readout transistor such as an amplification transistor. The light blocking portion 272 which covers the charge holding portions 207a and 207b, and the transfer electrodes 251a and 251b (gate electrodes) has a plurality of opening portions OP1 and OP2 between a plurality of sub waveguides SWG1 and SWG2, and the plurality of photoelectric converters PEC1 and PEC2. The electrically conductive member 2211 of the separator 221 is arranged between the plurality of opening portions OP1 and OP2.

Figure 9:
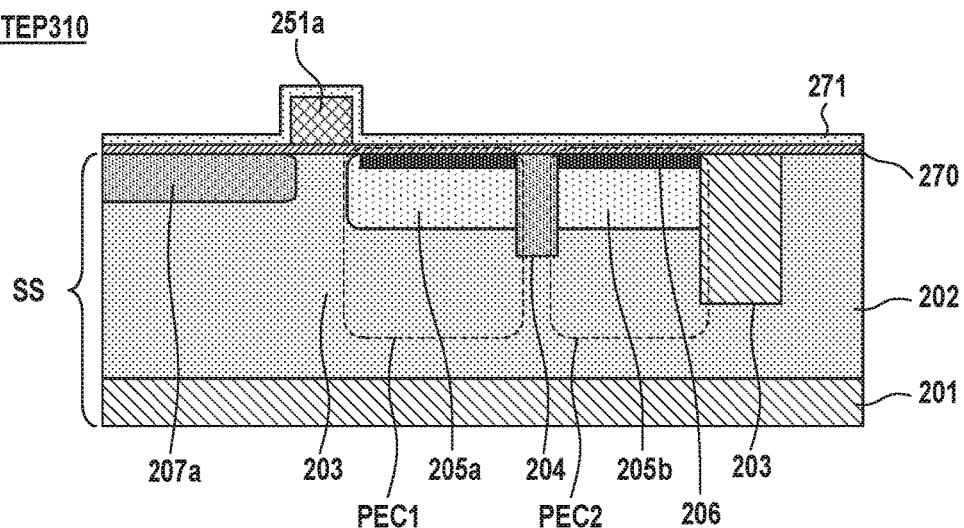
FIG. 9 shows sectional views of a method of manufacturing the solid-state image sensor according to the third embodiment of the present invention.
Figure 9:
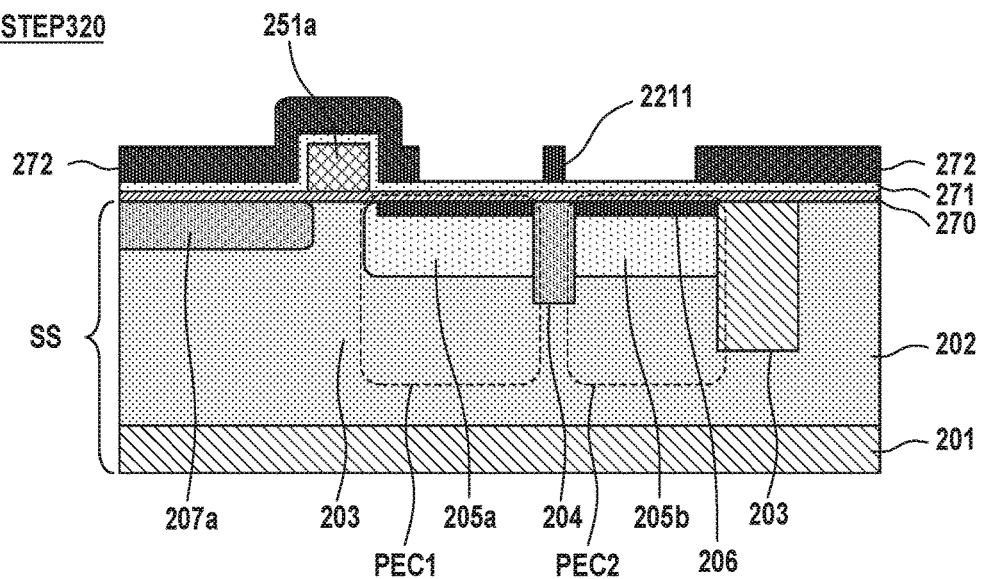
Figure 10:
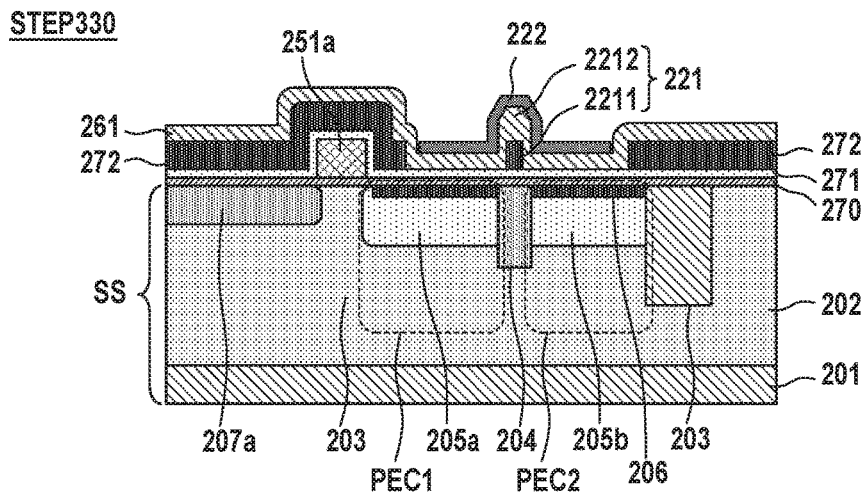
FIG. 10 shows sectional views of the method of manufacturing the solid-state image sensor according to the third embodiment of the present invention.
Figure 10:
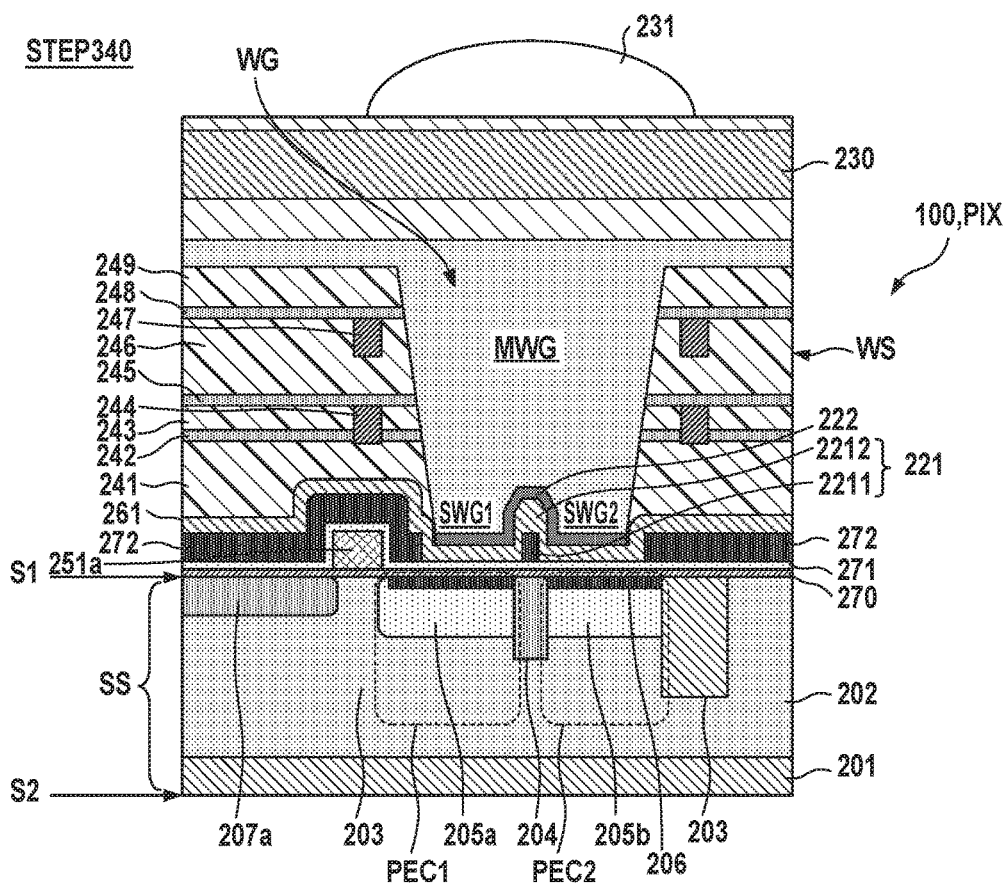

A method of manufacturing the solid-state image sensor 100 according to the third embodiment of the present invention will exemplarily be described below with reference to FIGS. 9 and 10. In a step 310, a second semiconductor region 202, and separators 203 and 204 can be formed in a semiconductor substrate SS which includes a first semiconductor region 201. The separators 203 and 204 can be formed by, for example, an insulator (for example, an STI (Shallow Trench Isolation)) and/or a semiconductor region of the second conductivity type.

Further, in the step 310, a photoresist pattern having an opening can be formed on the semiconductor substrate SS, annealing can be performed after ions (impurity) are implanted into the second semiconductor region 202 via the opening, and charge accumulation regions 205a and 205b of the first conductivity type can be formed. In the step 310, next, gate electrodes which include the transfer electrodes 251a and 251b, and a gate insulation film 270 of a transistor can be formed, and diffusion layers (not shown) of the source and drain of the transistor can be formed in the semiconductor substrate SS. In the step 310, next, a fourth semiconductor region 206 of the second conductivity type is formed in the semiconductor substrate SS, and an insulation film 271 is further formed so as to cover the semiconductor substrate SS and the gate electrodes which include the transfer electrodes 251a and 251b.

Then, in a step 320, a light blocking film is formed by a metal film (electrically conductive material film) of tungsten, aluminium, or the like or a metal compound film of TiN or the like, and this undergoes patterning. By this patterning, an electrically conductive member (metal member) 2211 of the separator 221 is formed simultaneously with the light blocking portion 272.

Then, in a step 330, an insulation film 261 can be formed so as to cover the light blocking portion 272 and the electrically conductive member 2211, and an insulation film 222 can further be formed so as to cover the insulation film 261. The insulation film 222 can be used as an etching stopper film at the time of etching to form the waveguide WG. The insulation film 222 can be arranged in a region where at least the waveguide WG is formed, and can typically be arranged so as to have a region wider than the lower face of the waveguide WG. The insulation film 222 may be arranged so as to cover at least a part of the light blocking portion 272. The insulation film 222 may be arranged so as to cover all over the semiconductor substrate SS. Then, in a step 340, a wiring structure WS, the light waveguide WG, a color filter layer 230, and a microlens 231 can be formed, as in the first embodiment.

In the third embodiment, the electrically conductive member 2211 of the optical separator 221 is formed by the light blocking film simultaneously with the light blocking portion 272, simplifying a process and facilitating the manufacture. In addition, it is possible, by forming the light blocking portion 272 and the electrically conductive member 2211 of the separator 221 simultaneously, to reduce a sensitivity difference between the plurality of photoelectric converters PEC1 and PEC2 or between pixels caused by an alignment shift between the light blocking portion 272 and the electrically conductive member 2211.

In the above-described example, a gate electrode film is not arranged below the electrically conductive member 2211. However, the gate electrode film of a region where the separator 221 should be formed may be left when a gate electrode film is patterned to form the gate electrodes such as the transfer electrodes 251a and 251b. In this case, it is possible to obtain the separator 221 having a structure in which the electrically conductive member 2211 is stacked on the gate electrode film. This makes it possible to increase the distance between the upper face of the separator 221 and a first face S1 of the semiconductor substrate SS.

Figure 11A:
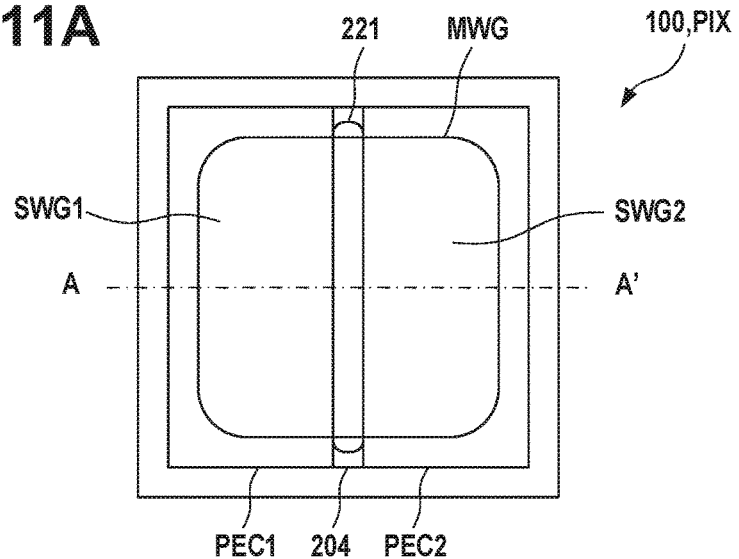
FIGS. 11A and 11B are a schematic plan view and a schematic sectional view showing one pixel of a solid-state image sensor according to the fourth embodiment of the present invention.
Figure 11B:
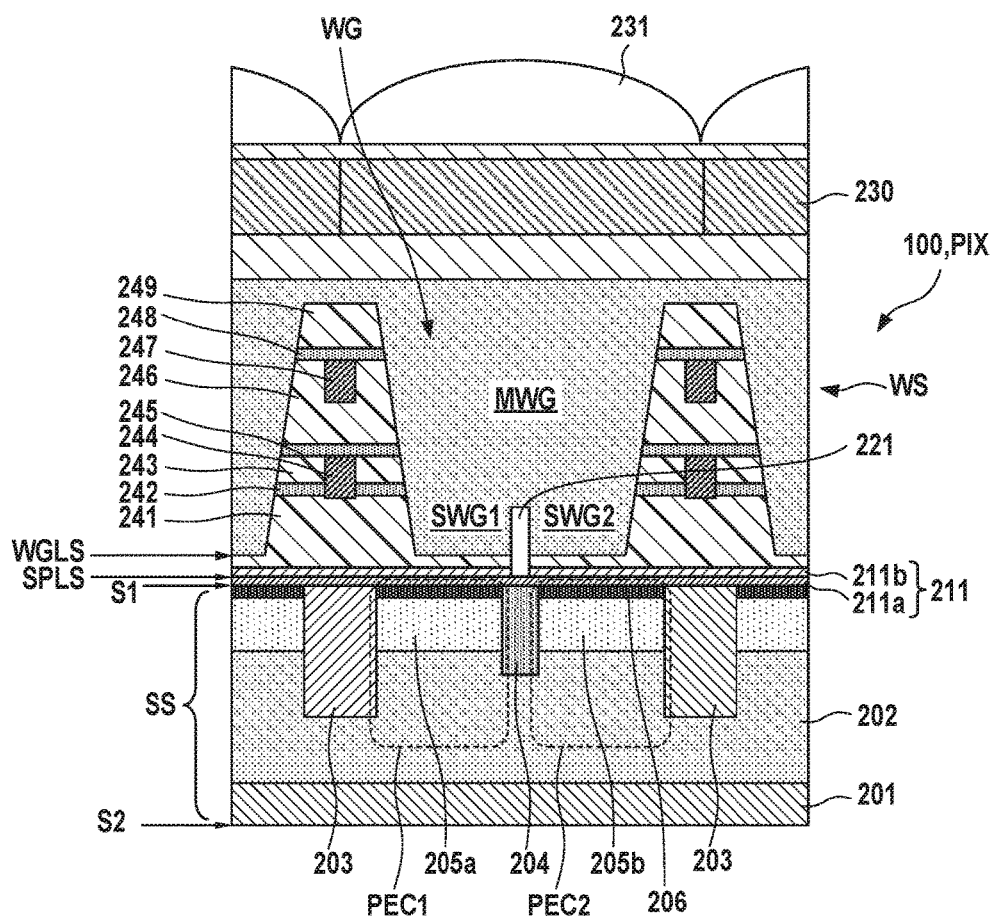

The fourth embodiment of the present invention will be described below with reference to FIGS. 11A to 15. Note that matters that are not mentioned in the fourth embodiment can comply with the first to third embodiments. FIG. 11A is a schematic plan view showing one pixel PIX as a part of a solid-state image sensor 100 according to the fourth embodiment of the present invention. FIG. 11B is a schematic sectional view taken along a line A-A' in FIG. 11A. The solid-state image sensor 100 is a solid-state image sensor having a focus detection function, and the pixel PIX that includes a plurality of pixels arranged two-dimensionally all or some of which have a focus detection function as shown in FIGS. 11A and 11B. Each pixel without the focus detection function typically includes a single photoelectric converter.

In the fourth embodiment, the lower portion of an optical separator 221 is buried in insulation films (insulation film 211) between the lower face of a light waveguide WG and the first face of a semiconductor substrate SS. In other words, it is desirable that the distance between a lower face SPLS of the separator 221 and the semiconductor substrate SS (a first face S1 thereof) is smaller than the distance between a lower face WGLS of the light waveguide WG and the semiconductor substrate SS (the first face S1 thereof). Alternatively, the distance between the lower face SPLS of the separator 221 and a second face S2 of the semiconductor substrate SS is smaller than the distance between the second face S2 and the lower face WGLS of the light waveguide WG. Such an arrangement is advantageous in improving the separation characteristics of a light beam 111 entering a first photoelectric converter PEC1 and a second light beam 112 entering a second photoelectric converter PEC2. The lower face SPLS of the separator 221 may be positioned between a plane with the upper face of the insulation film 211 and a plane with the lower face. Alternatively, the lower face SPLS of the separator 221 may be positioned between a plane with the first face S1 of the semiconductor substrate SS and a plane with the second face S2. The separator 221 may include or may not include an electrically conductive member such as a metal. Further, the separator 221 may be formed by a gap. In the fourth embodiment, the separator 221 can be a gap having a function of separating a plurality of sub waveguides SWG1 and SWG2 from each other, and the lower face SPLS of the separator 221 can be defined as the lower face of the gap.

The insulation film 211 that can function as an antireflection film can be arranged between the light waveguide WG and the first face S1 of the semiconductor substrate SS. The insulation film 211 may also be arranged between a wiring structure WS and the first face S1 of the semiconductor substrate SS. The insulation film 211 may be formed by a single insulation layer or may be formed by a plurality of insulation layers 211a and 211b. In one example, the insulation layer 211a can be a silicon nitride film, and the insulation layer 211b can be a silicon oxide film or a silicon oxycarbide film. A part of a thin interlayer insulation film 241 may be arranged between the insulation film 211 and the light waveguide WG. Each of the wiring structure WS, a color filter layer 230, a microlens 231, and the like can have the same structure as in the first to third embodiments.

It is preferable that the refractive index of the waveguide WG is higher than those of the interlayer insulation film 241 and interlayer insulation films 243, 246, and 249, and higher than that of the insulation layer 211b which forms the uppermost layer of the insulation film 211. An optical separator 221 can have a refractive index lower than that of the light waveguide WG and that of the insulation layer 211b. Alternatively, the optical separator 221 can be made of a material such as a metal that reflects light.

Figure 12:
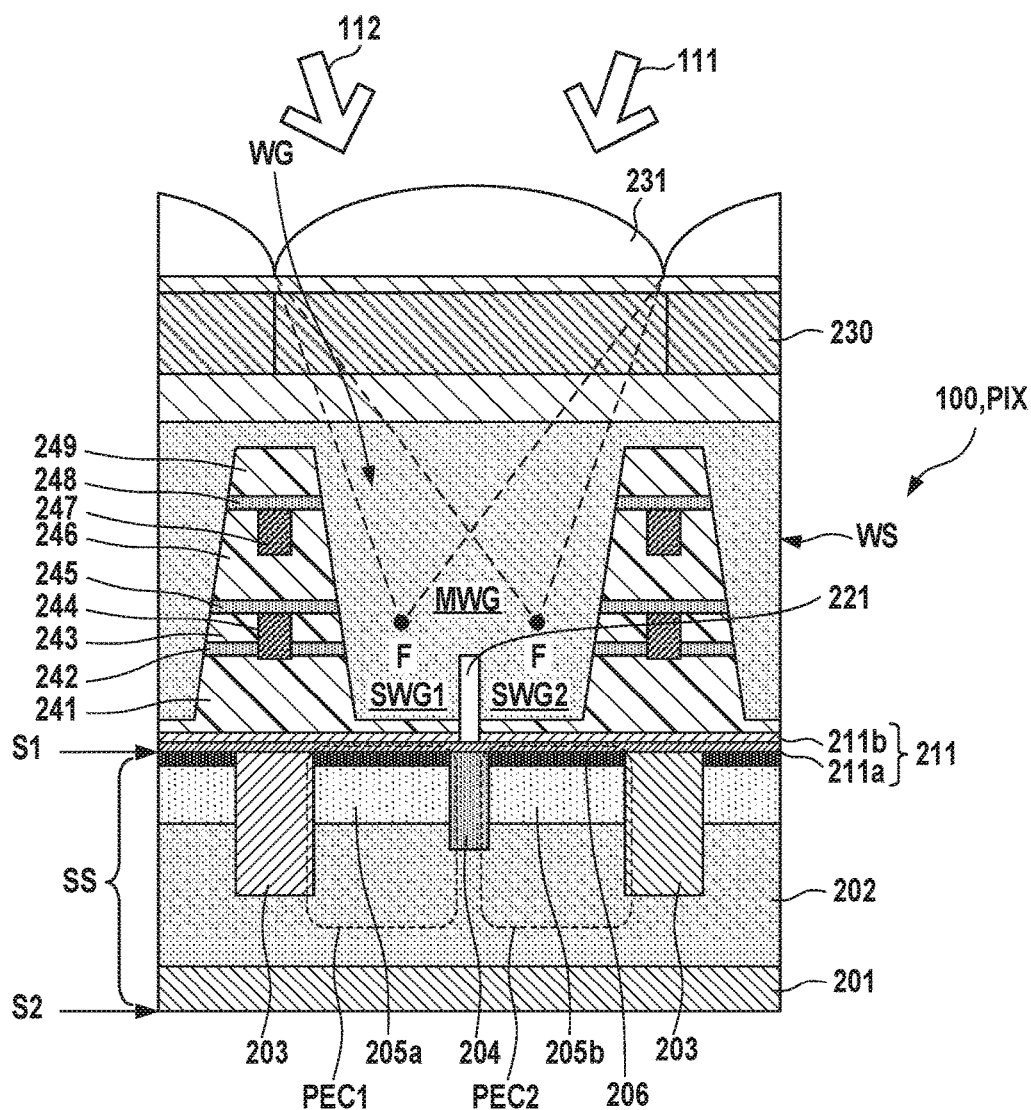
FIG. 12 is a schematic sectional view for explaining one pixel of the solid-state image sensor according to the fourth embodiment of the present invention.

FIG. 12 schematically shows the light beams 111 and 112 which pass through a plurality of regions different from each other in the pupil of an imaging lens, and enter the plurality of photoelectric converters PEC1 and PEC2 in one pixel of the solid-state image sensor 100. The first light beam 111 that has passed through the first region in the pupil of the imaging lens enters a main waveguide MWG, and then travels to the first sub waveguide SWG1 and further enters the first photoelectric converter PEC1. The second light beam 112 that has passed through the second region in the pupil of the imaging lens enters the main waveguide MWG, and then travels to the second sub waveguide SWG2 and further enters the second photoelectric converter PEC2. The first sub waveguide SWG1 and the second sub waveguide SWG2 are optically separated from each other by the separator 221. Therefore, the separation characteristics of the first light beam 111 and the second light beam 112 are improved so that the almost entire first light beam 111 enters the first photoelectric converter PEC1, and the almost entire second light beam 112 enters the second photoelectric converter PEC2. Moreover, the separation characteristics of the first light beam 111 and the second light beam 112 are further improved by making the distance between the lower face of the separator 221 and the semiconductor substrate SS (the first face S1 thereof) smaller than the distance between the lower face of the light waveguide WG and the semiconductor substrate SS (the first face S1 thereof). It is desirable that the distance between the upper face of the separator 221 and the first face S1 of the semiconductor substrate SS is smaller than the distance between the first face S1 of the semiconductor substrate SS, and the focus F of the microlens 231 which condenses the first light beam 111 and the second light beam 112.

Figure 13:
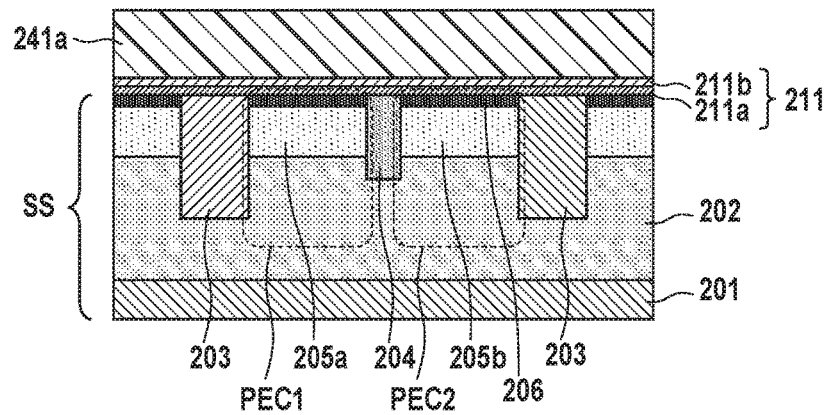
FIG. 13 shows sectional views of a method of manufacturing the solid-state image sensor according to the fourth embodiment of the present invention.
Figure 13:
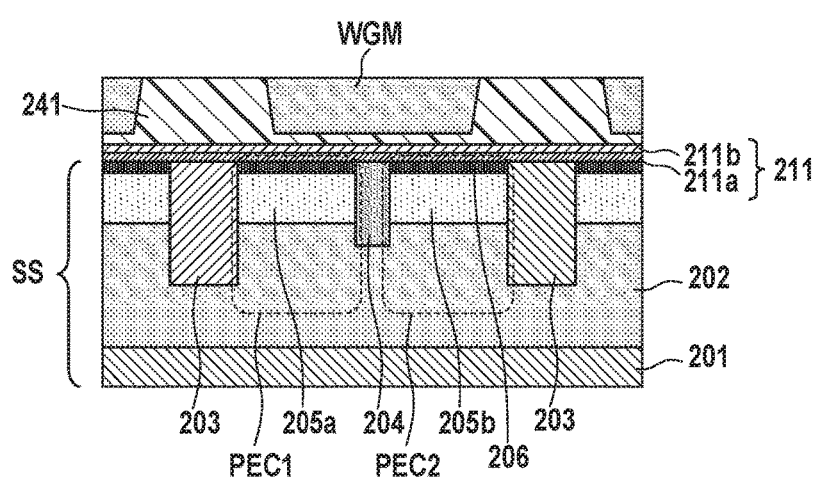
Figure 13:
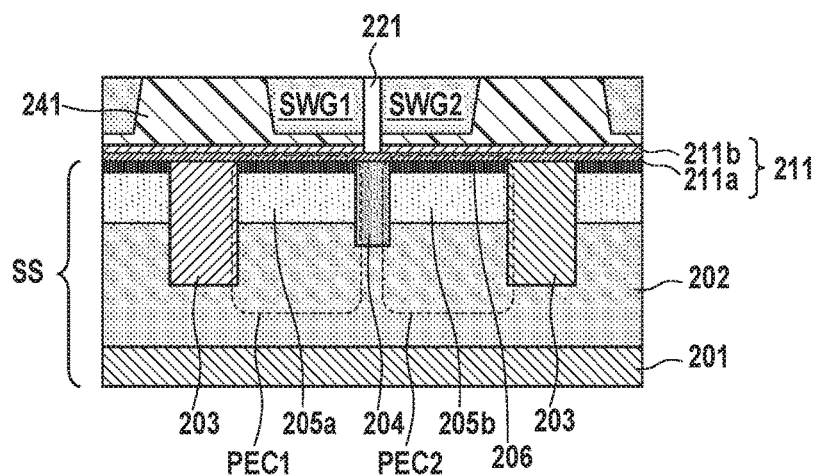
Figure 14:
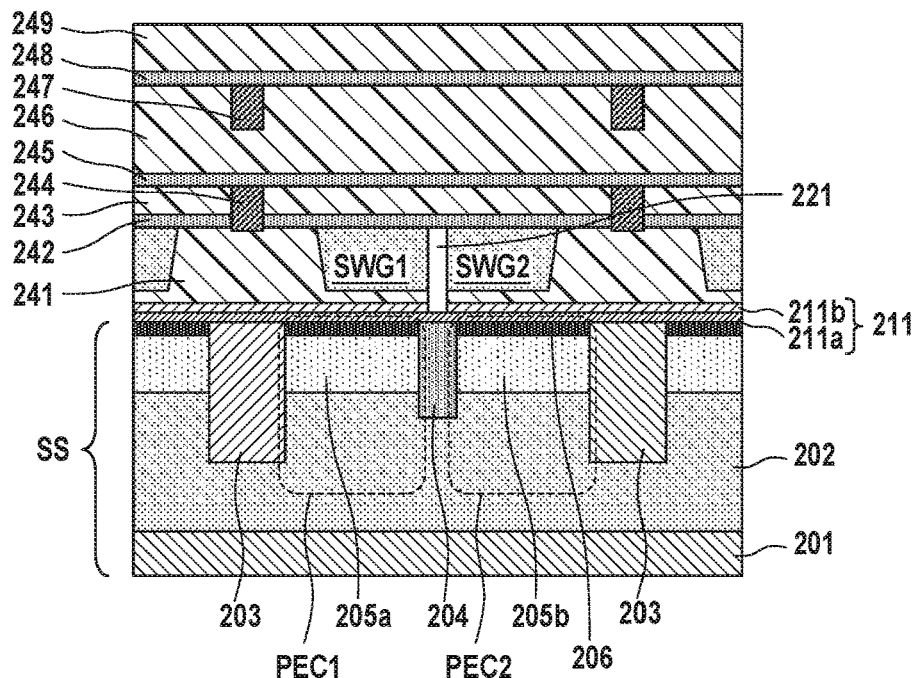
FIG. 14 shows sectional views of the method of manufacturing the solid-state image sensor according to the fourth embodiment of the present invention.
Figure 14:
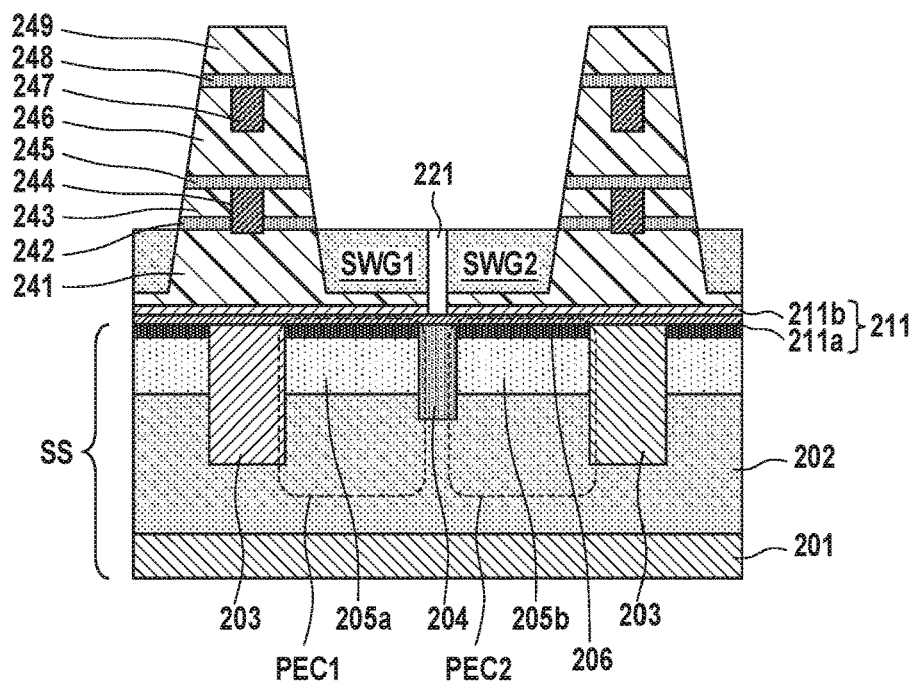
Figure 15:
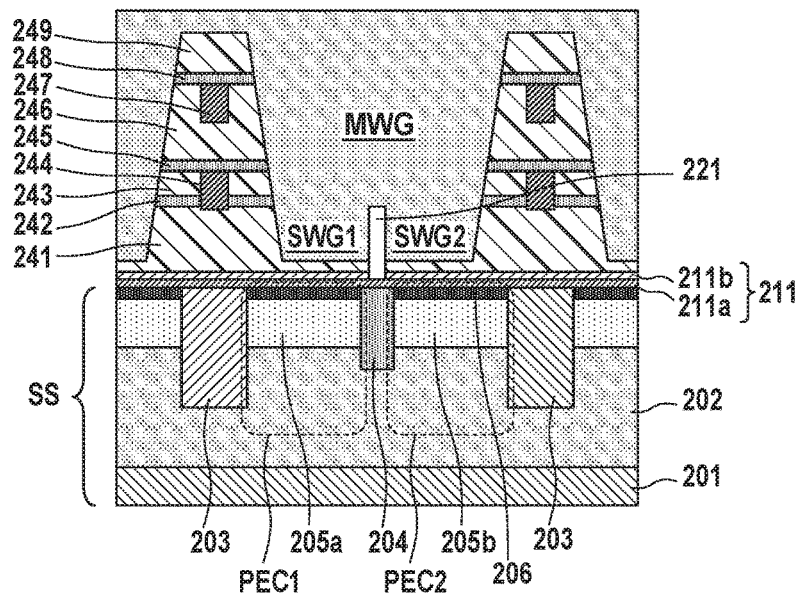
FIG. 15 shows sectional views of the method of manufacturing the solid-state image sensor according to the fourth embodiment of the present invention.
Figure 15:
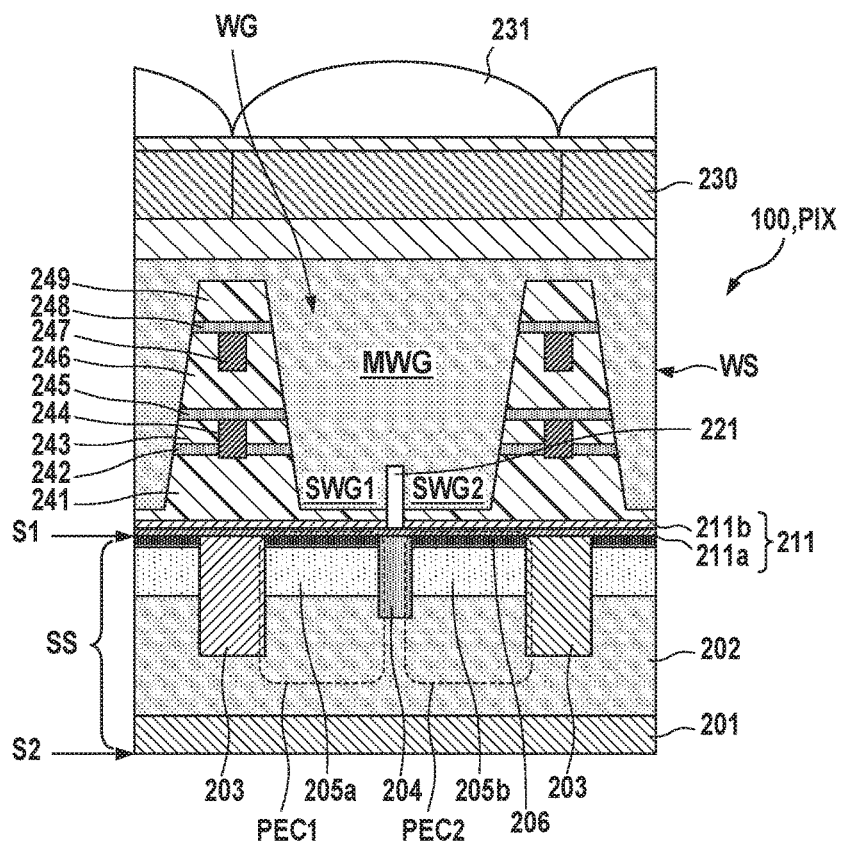

A method of manufacturing the solid-state image sensor 100 according to the fourth embodiment of the present invention will exemplarily be described below with reference to FIGS. 13 to 15. In a step 410, separators 203 and 204, and the photoelectric converters PEC1 and PEC2 can be formed in the semiconductor substrate SS which includes a first semiconductor region 201, and the insulation film 211 and an interlayer insulation film 241a can be formed on the semiconductor substrate SS. The separators 203 and 204 can be formed by, for example, an insulator (for example, an STI (Shallow Trench Isolation)) and/or a semiconductor region of the second conductivity type.

Then, in a step 420, an opening for forming the light waveguide WG is formed in the interlayer insulation film 241a by photolithography, and the opening is filled with an insulator WGM. The opening can be filled with the insulator WGM by, for example, depositing the insulator WGM of silicon nitride or the like by HDP-CVD (high density plasma chemical vapor deposition) and removing the extra insulator WGM by CMP or the like.

Then, in a step 430, the optical separator 221 formed by the gap can be formed by etching the insulation film 211 and the insulator WGM in a region where the separator 221 should be formed. Note that it is possible, by etching the insulation film 211, to make the distance between the semiconductor substrate SS and the lower face of the separator 221 smaller than the distance between the semiconductor substrate SS and the lower face of the light waveguide WG. The width of the separator 221 formed by the gap can fall within a range (for example, about 0.1 µm to 0.3 µm) in which the separation effect of the first light beam 111 and the second light beam 112 is obtained, and the gap is not buried in a forming step of an etching stopper film 242 to be performed next. It is desirable for a portion corresponding to the upper end of the gap forming the separator 221 to have a pointed shape by using, for example, a condition with many deposition components in the final stage of etching in the step 430. It is also preferable that the separator 221 is made of a material having a refractive index close to 1 or a difference in refractive index from an insulation film 211 being about 0.2 or more. In the step 430, a contact hole can further be formed in the interlayer insulation film 241.

Then, in a step 440, the etching stopper film 242, the interlayer insulation film 243, a wiring pattern 244, an anti-diffusion film 245, the interlayer insulation film 246, a wiring pattern 247, an anti-diffusion film 248, and the interlayer insulation film 249 are formed, as in the first embodiment. Then, in a step 450, an opening for forming the light waveguide WG can be formed in the wiring structure WS by photolithography. If the shape of the upper end of the separator 221 changes in the step 440, it is desirable that the upper end of the separator 221 is molded again to have a pointed shape by using, for example, a condition with many deposition components in the final stage of the step 450.

In a step 460, the opening formed in the wiring structure WS is filled with an insulator of silicon nitride or the like, forming the light waveguide WG. Then, in a step 470, an inner lens (not shown), a passivation film, a planarizing film, and the like are formed, and then the color filter layer 230 and the microlens 231 are formed.

In the above example, the wiring structure WS includes a two-layer wiring pattern. However, the number of layers for the wiring pattern can be determined arbitrarily. The sub waveguides SWG1 and SWG2, and the separator 221 may be formed not immediately after the interlayer insulation film 241a is formed but in the middle of formation of the interlayer insulation film 246 or 249. However, if the height of the upper face of the separator 221 is too high, incident light may be blocked or attenuated. It is therefore desirable that the distance between the upper face of the separator 221 and the first face S1 of the semiconductor substrate SS is smaller than the distance between the first face S1 of the semiconductor substrate SS and focuses F of the microlens 231 which condense the first light beam 111 and the second light beam 112.

Figure 16:
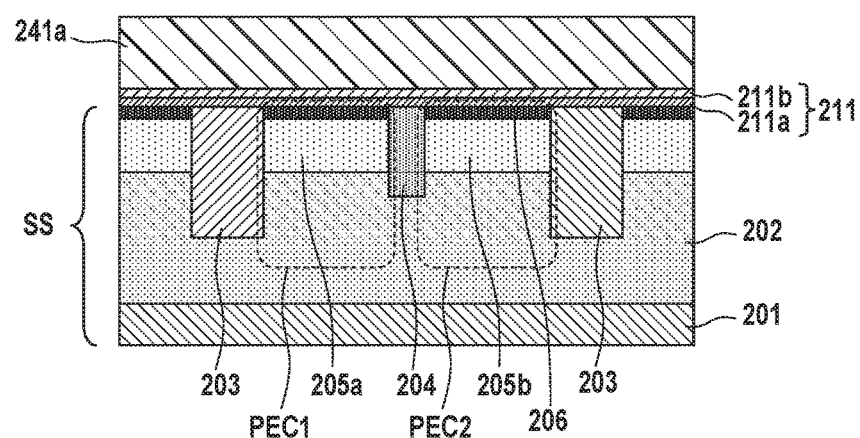
FIG. 16 shows sectional views of a method of manufacturing a solid-state image sensor according to the fifth embodiment of the present invention.
Figure 16:
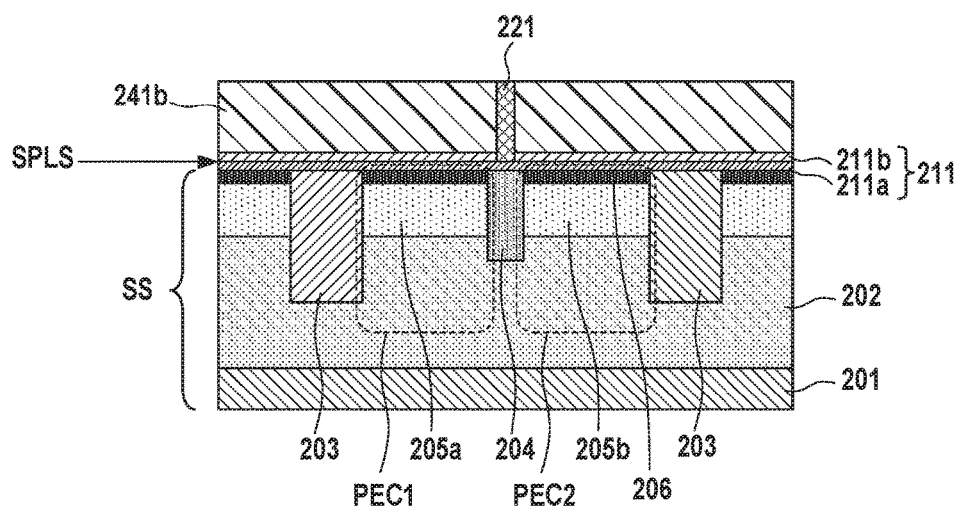
Figure 17:
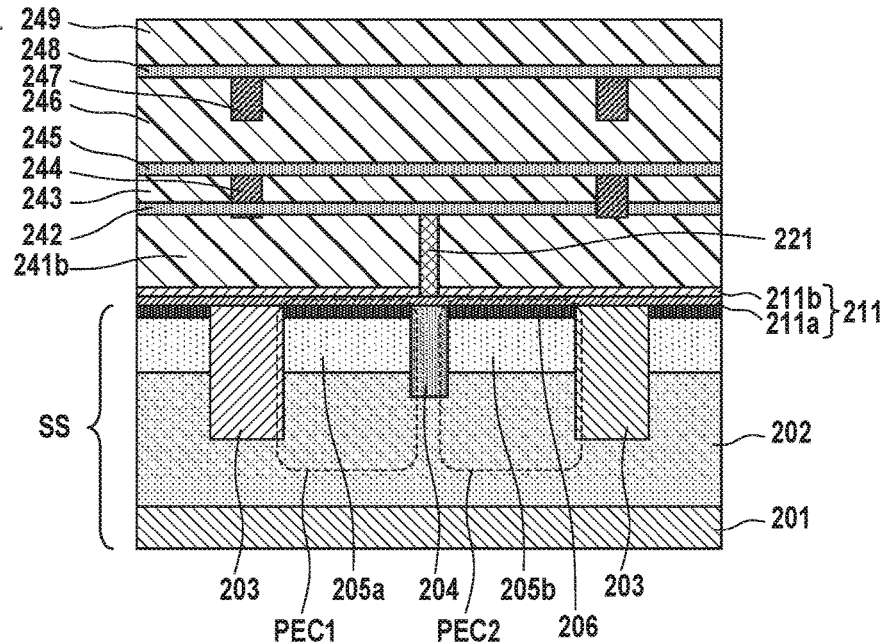
FIG. 17 shows sectional views of the method of manufacturing the solid-state image sensor according to the fifth embodiment of the present invention.
Figure 17:
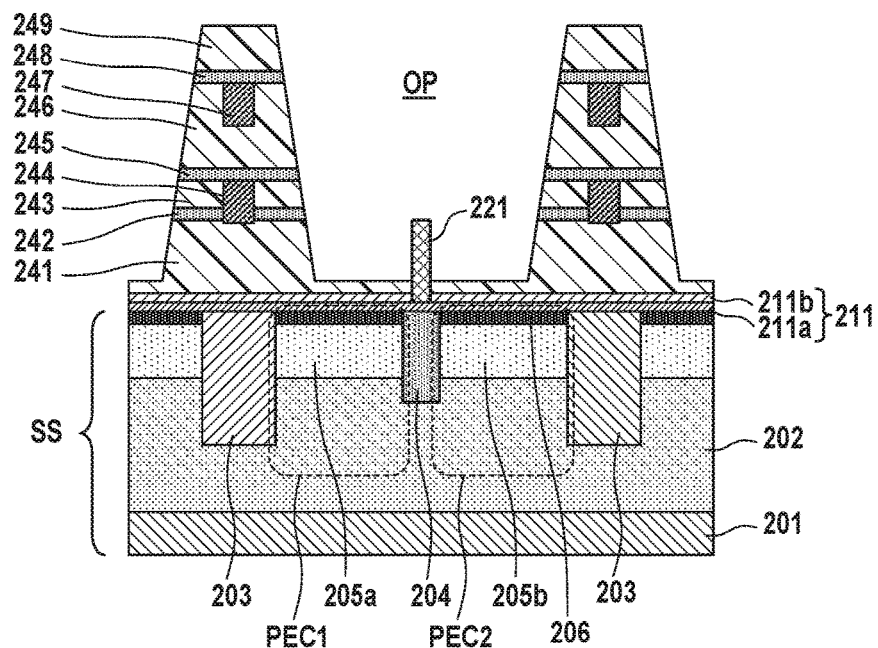
Figure 18:
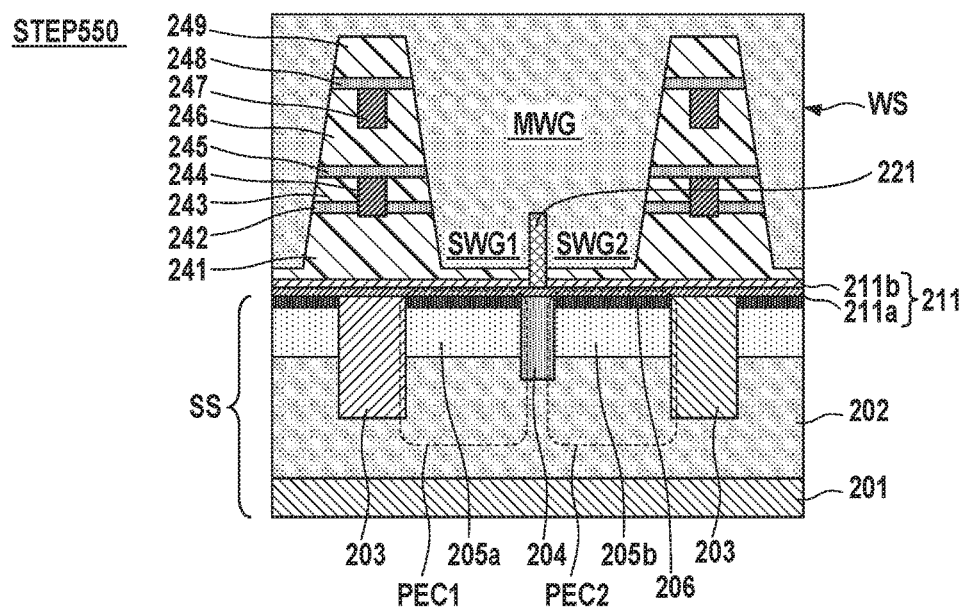
FIG. 18 shows sectional views of the method of manufacturing the solid-state image sensor according to the fifth embodiment of the present invention.
Figure 18:
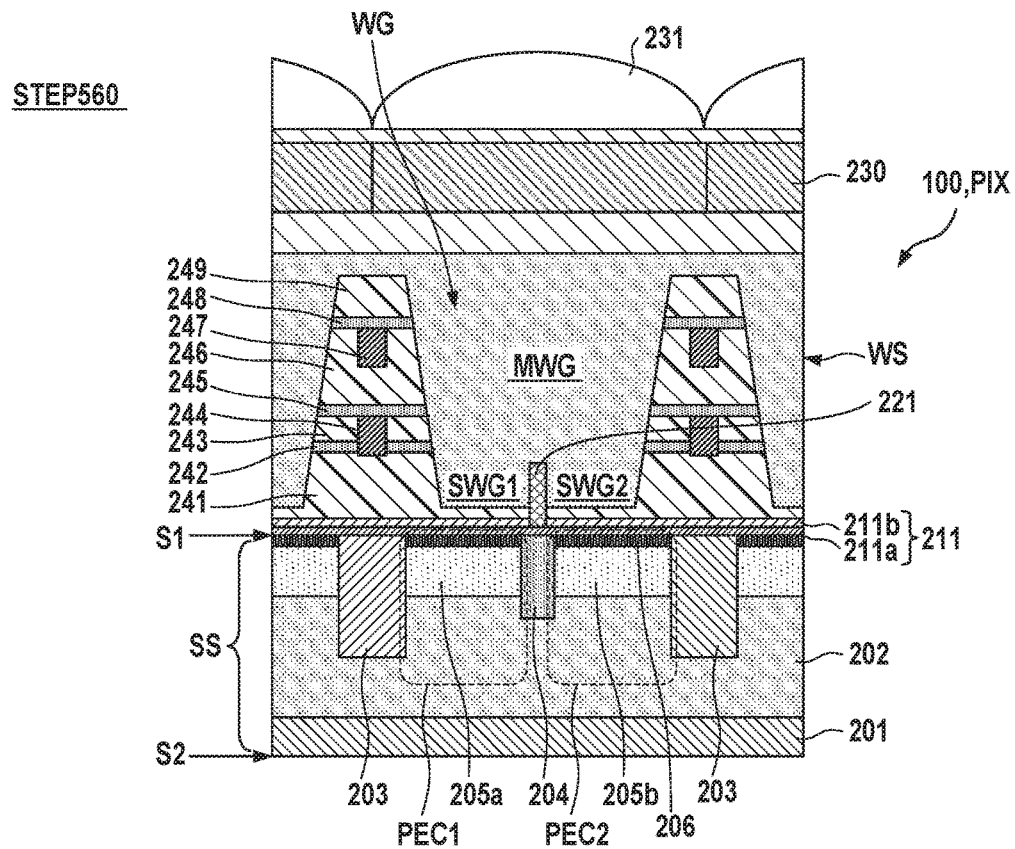

A method of manufacturing a solid-state image sensor 100 according to the fifth embodiment of the present invention will be described below with reference to FIGS. 16 to 18. Note that matters that are not mentioned in the fifth embodiment can comply with the first to fourth embodiments. The fifth embodiment is different from the fourth embodiment in that a separator 221 is made of a reflection material such as a metal. In the fifth embodiment, a lower face SPLS of the separator 221 can be defined as the lower face of a portion made of the reflection material.

In a step 510, separators 203 and 204, and photoelectric converters PEC1 and PEC2 can be formed in a semiconductor substrate SS which includes a first semiconductor region 201, and an insulation film 211 and an interlayer insulation film 241a can be formed on the semiconductor substrate SS. The separators 203 and 204 can be formed by, for example, an insulator (for example, an STI (Shallow Trench Isolation)) and/or a semiconductor region of the second conductivity type.

Then, in a step 520, the optical separator 221 is formed. More specifically, in the step 520, first, an opening for forming the separator 221 is formed by etching the insulation film 211 and an insulator WGM in a region to be formed. In the step 520, next, the opening can be filled with a metal such as tungsten after a barrier metal film of titanium, titanium nitride, or the like is formed on the surface in the opening. Subsequently, planarization such as CMP can be performed in order to remove the extra metal. Note that a contact hole (not shown) may be filled with the metal simultaneously when the opening for forming the separator 221 is filled with the metal.

Then, in a step 530, an etching stopper film 242, an interlayer insulation film 243, a wiring pattern 244, an anti-diffusion film 245, an interlayer insulation film 246, a wiring pattern 247, an anti-diffusion film 248, and an interlayer insulation film 249 can be formed. Consequently, a wiring structure WS can be formed. Then, in a step 540, first, an opening OP for forming a light waveguide WG can be formed in the wiring structure WS by photolithography. In a step 550, next, the opening OP is filled with an insulator of silicon nitride or the like, forming the light waveguide WG. Note that planarization such as CMP can be performed as needed after the opening OP is filled with the insulator. Then, in a step 560, an inner lens (not shown), a passivation film, a planarizing film, and the like are formed, and then a color filter layer 230 and a microlens 231 are formed.

A solid-state image sensor according to the sixth embodiment of the present invention will be described below with reference to FIGS. 19A to 24. Note that matters that are not mentioned in the sixth embodiment can comply with the first to fifth embodiments. FIG. 19A is a schematic plan view showing one pixel PIX as a part of a solid-state image sensor 100 according to the sixth embodiment of the present invention. FIG. 19B is a schematic sectional view taken along a line A-A' in FIG. 19A. The solid-state image sensor 100 is a solid-state image sensor having a focus detection function, and the pixel PIX that includes a plurality of pixels arranged two-dimensionally all or some of which have a focus detection function as shown in FIGS. 19A and 19B. Each pixel without the focus detection function typically includes a single photoelectric converter.

In common with the first to third embodiments, in the sixth embodiment, a separator 221 includes a first portion 2211a, and a second portion 2214 arranged between the first portion 2211a and a main waveguide MWG so as to cover the first portion 2211a. Note that the first portion 2211a corresponds to the electrically conductive member 2211 in the first to third embodiments, and the second portion 2214 corresponds to the cover portion 2212 in the first to third embodiments. However, the first portion 2211a may be an electrically conductive member or may be a non-electrically conductive member (insulation member). The second portion 2214 can function as, for example, an antireflection film or a scatterer which scatters light entering the separator 221. The solid-state image sensor 100 includes a wiring structure WS, a color filter layer 230, a microlens 231, and the like each of which can have the same structure as the first to fifth embodiments.

In one example, a light waveguide WG can be arranged in the wiring structure WS, the wiring structure WS can include a wiring pattern 244 and an anti-diffusion film 245 arranged so as to contact the wiring pattern 244, and the second portion 2214 can include a portion made of the same material as the anti-diffusion film 245. Furthermore, in one example, the wiring structure WS includes an interlayer insulation film 241, and an electrically conductive member 2211 includes a portion made of the same material as the interlayer insulation film 241.

Alternatively, the second portion 2214 may be made of the same material as an etching stopper film 242 simultaneously. More specifically, the wiring structure WS may include the etching stopper film 242 (second insulation film) arranged between an interlayer insulation film 243 (first insulation film) and a semiconductor substrate SS, and the second portion 2214 may include a portion made of the same material as the etching stopper film 242. Note that the wiring structure WS can include the wiring pattern 244 which extends through the interlayer insulation film 243 (first insulation film) and the etching stopper film 242 (second insulation film). The wiring structure WS can further include the interlayer insulation film 241 (third insulation film) arranged between the etching stopper film 242 (second insulation film) and the semiconductor substrate SS, and a contact plug arranged in a contact hole provided in the interlayer insulation film 241 (third insulation film). The contact plug is connected to the wiring pattern 244. The wiring pattern 244 can contain copper.

The first portion 2211a can contain at least one of, for example, silicon oxide and silicon oxycarbide. The second portion 2214 can contain at least one of, for example, silicon carbide, silicon oxycarbide, silicon carbonitride, silicon oxynitride, and silicon nitride. The refractive index of the waveguide WG is higher than those of the interlayer insulation films 241 and 243, and interlayer insulation films 246 and 249, and the electrically conductive member 2211 of the separator 221.

The solid-state image sensor 100 can include an insulation film 211 between the light waveguide WG and the semiconductor substrate SS, and between the separator 221 and the semiconductor substrate SS. The insulation film 211 can function as an antireflection film. The insulation film 211 may be formed by a single insulation layer or may be formed by a plurality of insulation layers 211a and 211b. In one example, the insulation layer 211a can be a silicon nitride film, and the insulation layer 211b can be a silicon oxide film or a silicon oxycarbide film.

Figure 20:
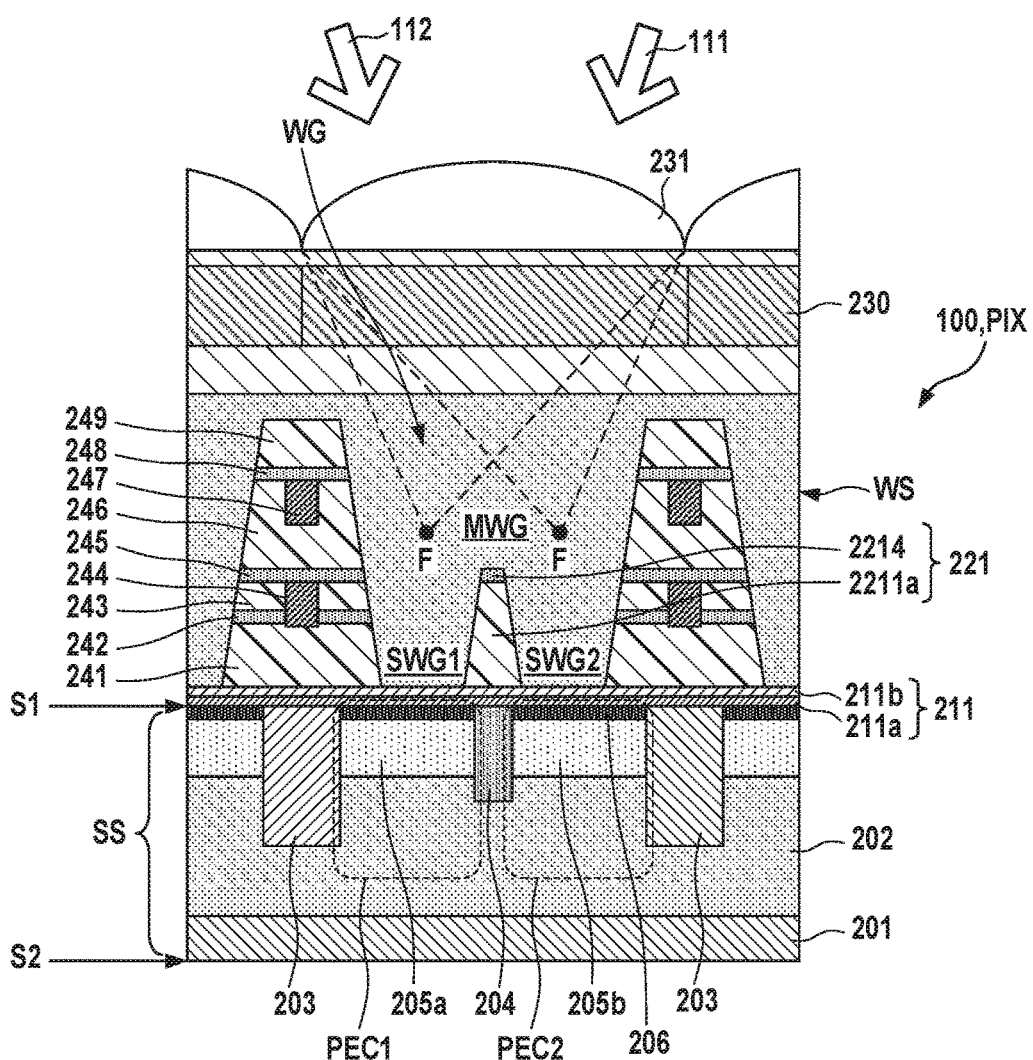
FIG. 20 is a schematic sectional view for explaining one pixel of the solid-state image sensor according to the sixth embodiment of the present invention.
Figure 21:
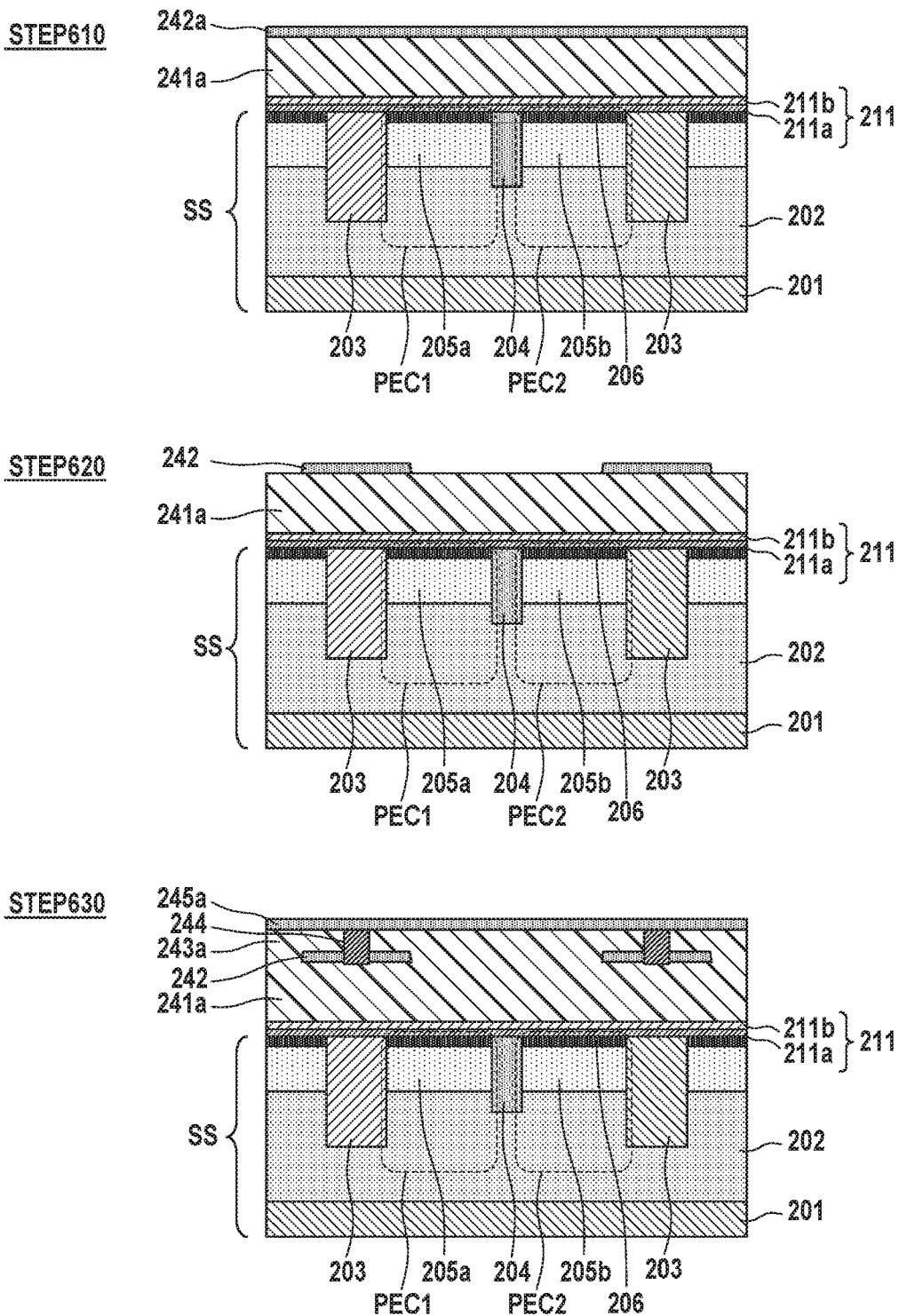
FIG. 21 shows sectional views of a method of manufacturing the solid-state image sensor according to the sixth embodiment of the present invention.
Figure 22:
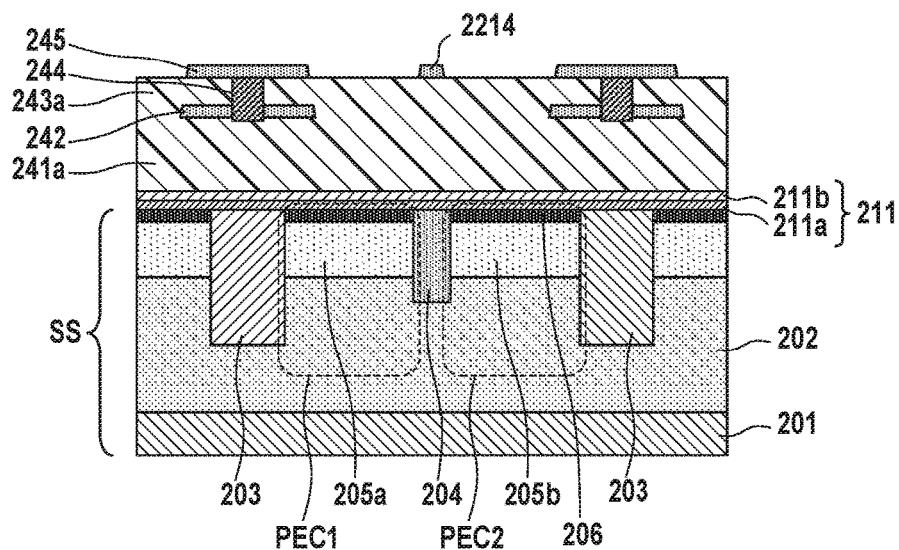
FIG. 22 shows sectional views of the method of manufacturing the solid-state image sensor according to the sixth embodiment of the present invention.
Figure 22:
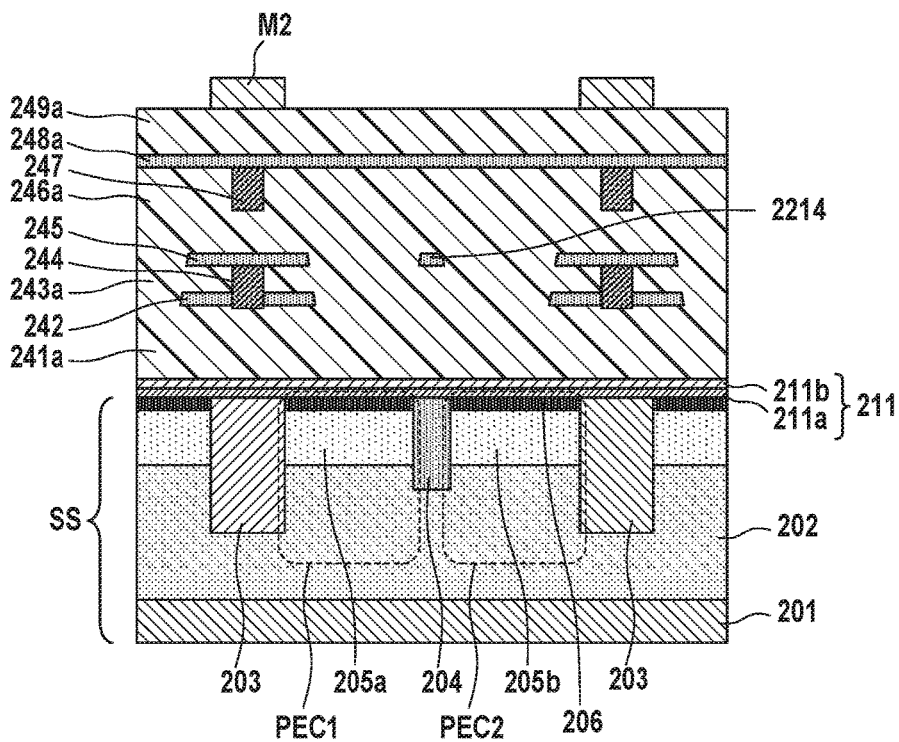
Figure 23:
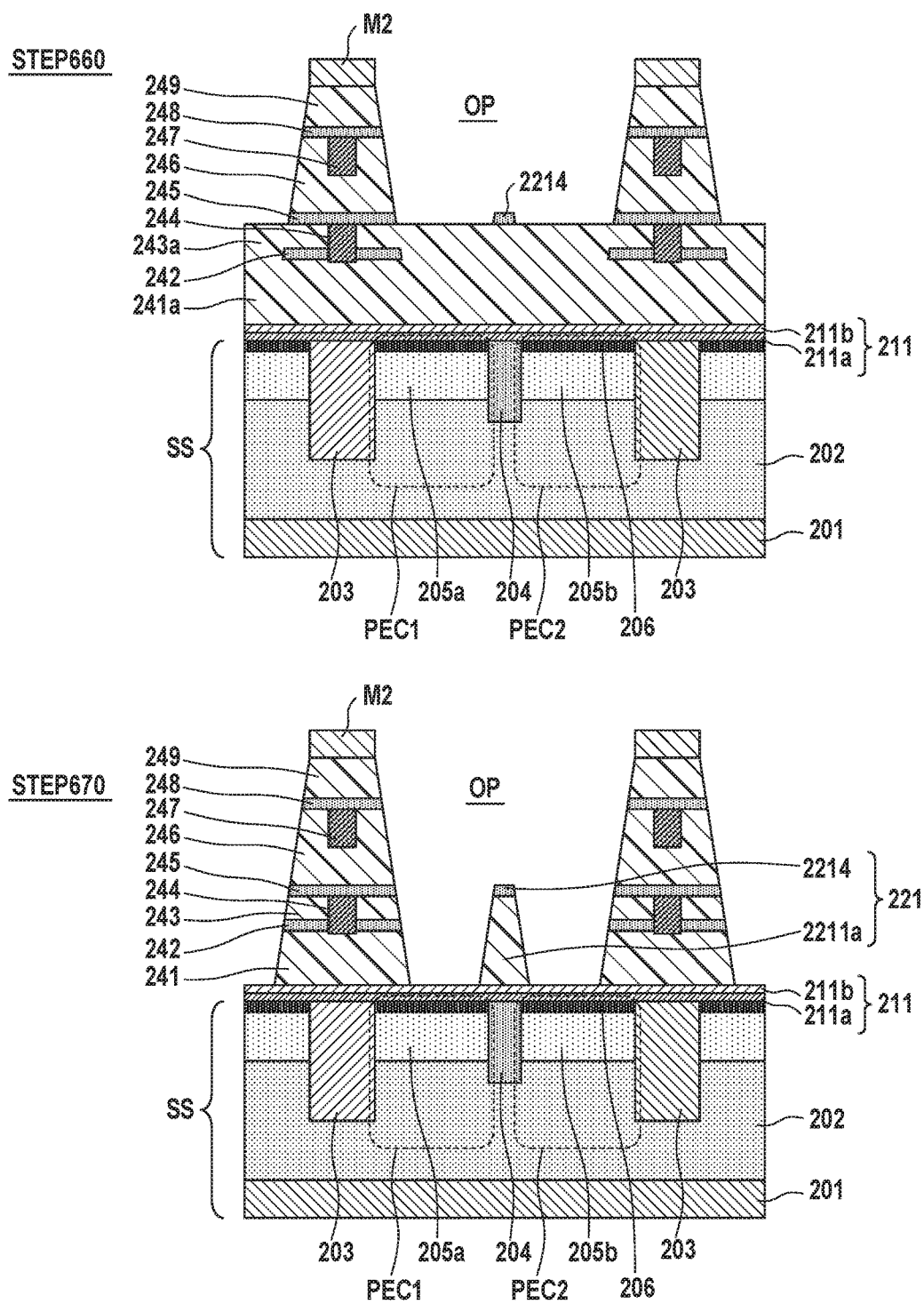
FIG. 23 shows sectional views of the method of manufacturing the solid-state image sensor according to the sixth embodiment of the present invention.
Figure 24:
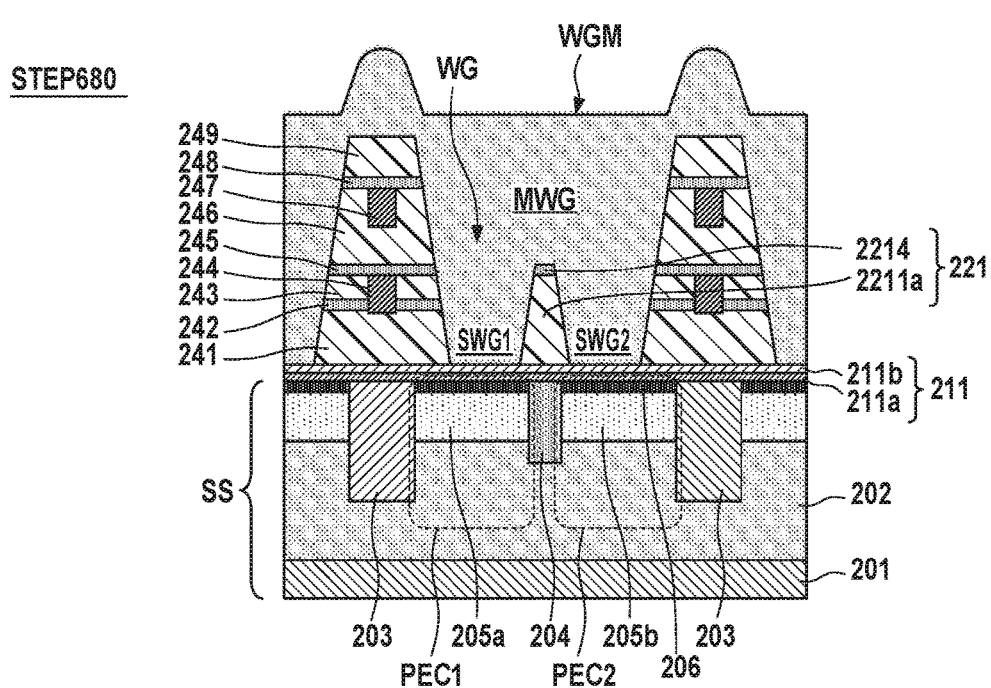
FIG. 24 shows sectional views of the method of manufacturing the solid-state image sensor according to the sixth embodiment of the present invention.
Figure 24:
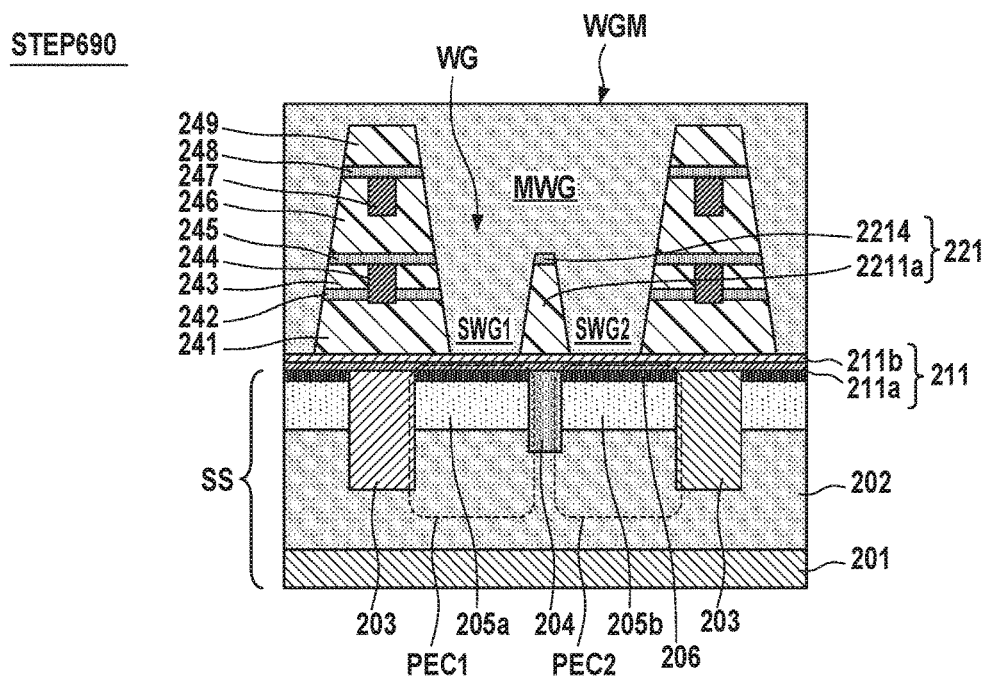
Figure 26:
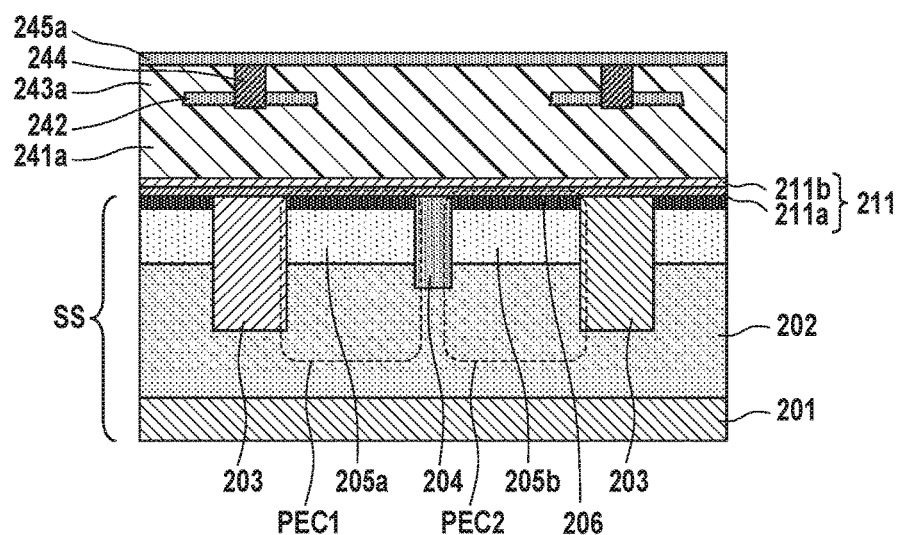
FIG. 26 shows sectional views of a method of manufacturing the solid-state image sensor according to the seventh embodiment of the present invention.
Figure 26:
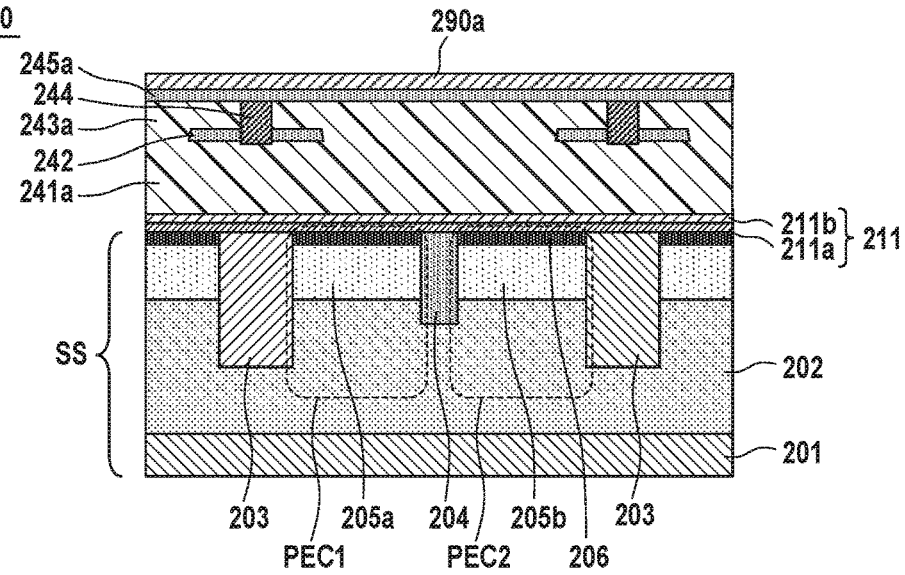
Figure 27:
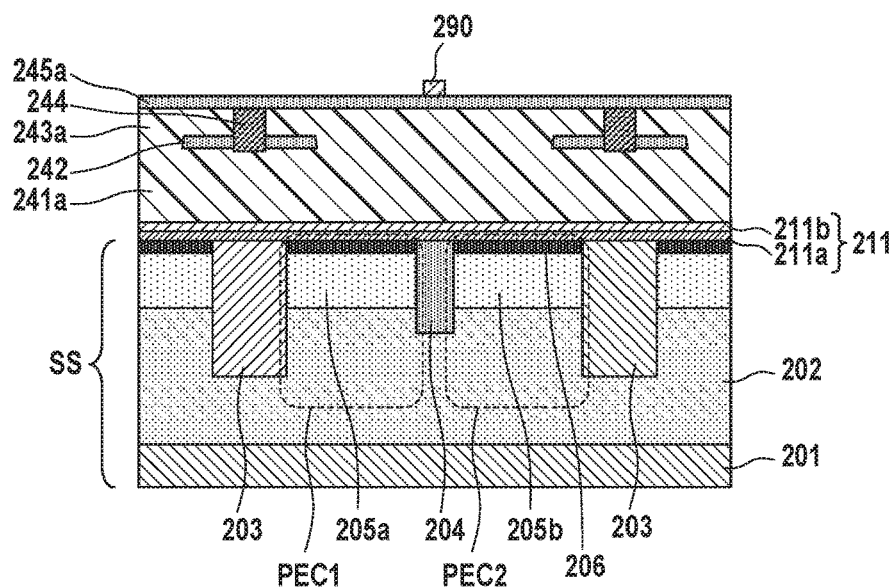
FIG. 27 shows sectional views of the method of manufacturing the solid-state image sensor according to the seventh embodiment of the present invention.
Figure 27:
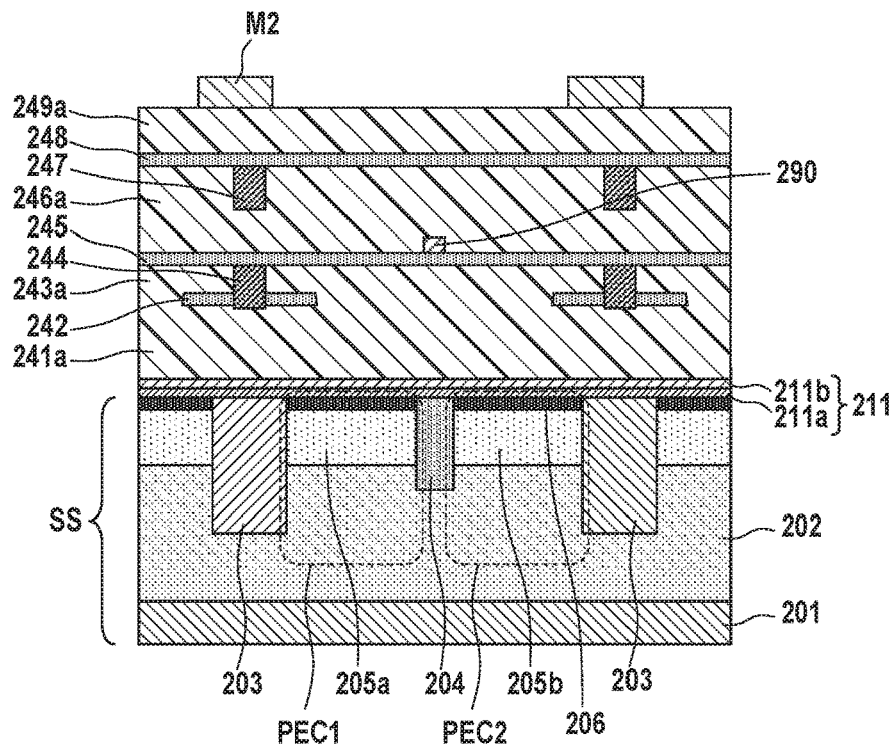
Figure 28:
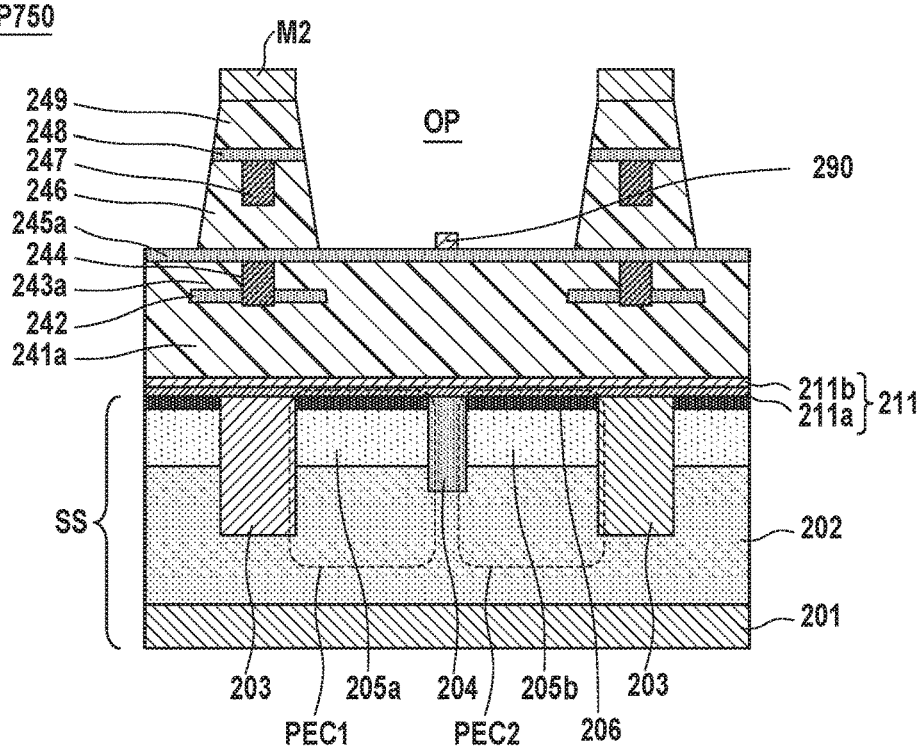
FIG. 28 shows sectional views of the method of manufacturing the solid-state image sensor according to the seventh embodiment of the present invention.
Figure 28:
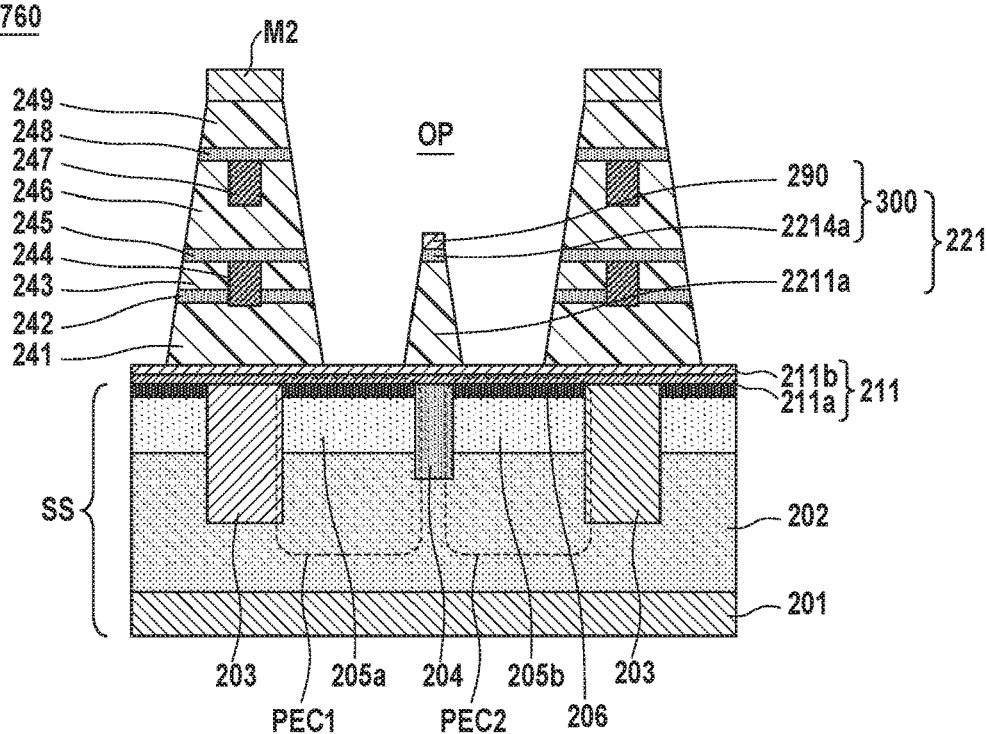

FIG. 20 schematically shows light beams 111 and 112 which pass through a plurality of regions different from each other in the pupil of an imaging lens, and enter a plurality of photoelectric converters PEC1 and PEC2 in one pixel of the solid-state image sensor 100. The first light beam 111 that has passed through the first region in the pupil of the imaging lens enters the main waveguide MWG, and then travels to a first sub waveguide SWG1 and further enters the first photoelectric converter PEC1. The second light beam 112 that has passed through the second region in the pupil of the imaging lens enters the main waveguide MWG, and then travels to a second sub waveguide SWG2 and further enters the second photoelectric converter PEC2. The first sub waveguide SWG1 and the second sub waveguide SWG2 are optically separated from each other by the separator 221. Therefore, the separation characteristics of the first light beam 111 and the second light beam 112 are improved so that the almost entire first light beam 111 enters the first photoelectric converter PEC1, and the almost entire second light beam 112 enters the second photoelectric converter PEC2.

A method of manufacturing the solid-state image sensor 100 according to the sixth embodiment of the present invention will exemplarily be described below with reference to FIGS. 21 to 25. In a step 610, separators 203 and 204, and the photoelectric converters PEC1 and PEC2 can be formed in the semiconductor substrate SS which includes a first semiconductor region 201, and the insulation film 211, an interlayer insulation film 241a, and an etching stopper film 242a can be formed on the semiconductor substrate SS. The separators 203 and 204 can be formed by, for example, an insulator (for example, an STI (Shallow Trench Isolation)) and/or a semiconductor region of the second conductivity type. Note that in the interlayer insulation film 241a, contact holes can be formed, and contact plugs can be formed in the contact holes.

Then, in a step 620, a region of the etching stopper film 242a where the light waveguide WG should be formed can be removed by patterning the etching stopper film 242a, and the etching stopper film 242 serving as an etching stopper film can be formed. In this example, although the etching stopper film 242a in a region that should be the separator 221 is also removed, the etching stopper film 242a in the region that should be the separator 221 may be left.

Then, in a step 630, an interlayer insulation film 243a (fourth insulation film), the wiring pattern 244, and an anti-diffusion film 245a can be formed. At this time, trenches are formed in the interlayer insulation film 243a by etching, and the etching stopper film 242 can be used in order to control the stop of this etching. After etching is stopped by using the etching stopper film 242, etching can further be performed so as to expose the contact plugs buried in the interlayer insulation film 241a. Then, the wiring pattern 244 can be formed by depositing an electrically conductive material so as to fill the trenches with an electrically conductive material to form the wiring pattern and removing the unnecessary electrically conductive material by CMP (Chemical Mechanical Polishing) or the like. The steps 610 and 630 above can be understood as steps of forming insulation films (first insulation films) that include the interlayer insulation films 241a and 243a.

Then, in a step 640, the anti-diffusion film 245a is patterned so as to remove the region of the anti-diffusion film 245a where the plurality of sub waveguides SWG1 and SWG2 should be formed, and the anti-diffusion film 245 and the second portion 2214 (first mask) of the separator 221 are formed. The second portion 2214 formed by patterning the anti-diffusion film 245a functions as a hard mask (first mask) for defining the sub waveguides SWG1 and SWG2 when an opening for forming the light waveguide WG in the wiring structure WS is formed by etching.

Then, in a step 650, an interlayer insulation film 246a, a wiring pattern 247, an anti-diffusion film 248a, an interlayer insulation film 249a, and a second mask M2 can be formed. Note that the wiring pattern 247 is formed by a dual damascene process after the interlayer insulation film 246a is formed. Then, the anti-diffusion film 248a can be formed so as to cover the interlayer insulation film 246a and the wiring pattern 247, and subsequently, the interlayer insulation film 249a can be formed so as to cover the anti-diffusion film 248a. Consequently, the wiring structure WS is formed. The step 650 can be understood as a step of forming insulation films (second insulation films) that include the interlayer insulation films 246a and 249a. In the step 650, next, the second mask M2 with an opening that defines an opening OP for forming the waveguide WG is formed by photoresist or the like.

Then, in steps 660 and 670, the opening OP is formed in the wiring structure WS. Note that a state indicated as the step 660 is a state in the middle of formation of the opening OP in the wiring structure WS. Films of the wiring structure WS that should be etched in forming the opening OP are the interlayer insulation film 249a, the anti-diffusion film 248, the interlayer insulation film 246a, and the interlayer insulation films 243a and 241a. In forming the opening OP, an etching condition can be changed over a plurality of times in accordance with the films that should be etched. First, the interlayer insulation film 249a, the anti-diffusion film 248, and the interlayer insulation film 246a are etched via the opening of the second mask M2. Then, at a point of time when the second portion 2214 of the separator 221 is exposed, the second portion 2214 serving as the first mask can function as an etching hard mask that defines the sub waveguides SWG1 and SWG2. It is possible, by patterning the etching stopper film 242 positioned downward of the second portion 2214 in advance as described above, to etch the interlayer insulation film 243a and the interlayer insulation film 241a consecutively. The first portion 2211a of the separator 221 is formed by this etching.

Then, in a step 680, the insulator WGM is deposited so as to fill the opening OP with the insulator WGM. The insulator WGM can be made of, for example, silicon nitride. The insulator WGM can be deposited by, for example, HDP-CVD (high density plasma chemical vapor deposition). Then, in a step 690, the extra insulator WGM can be planarized by removing it by CMP or the like. Consequently, the waveguide WG is formed. The extra insulator WGM may be removed until the interlayer insulation film 249 is exposed.

Then, an inner lens (not shown), a passivation film, a planarizing film, and the like are formed, and then the color filter layer 230 and the microlens 231 are formed, obtaining the solid-state image sensor 100 exemplified in FIGS. 19A and 19B.

According to the sixth embodiment, it is possible, by forming the first mask for defining the plurality of sub waveguides SWG1 and SWG2, to simplify a process of forming the light waveguide WG with the plurality of sub waveguides SWG1 and SWG2, and to facilitate manufacturing the solid-state image sensor 100. It is also possible to further simplify the process by using, as the first mask, the second portion 2214 of the separator 221. Patterning of the anti-diffusion film 245a in order to form the second portion 2214 can perform alignment of a photomask based on an alignment mark formed in a layer close to the first face S1 of the semiconductor substrate SS. It is therefore possible to increase the alignment accuracy of the sub waveguides SWG1 and SWG2 with respect to the photoelectric converters PEC1 and PEC2, and to reduce the sensitivity difference between the photoelectric converters PEC1 and PEC2 or between pixels.

In the example above, the wiring structure WS has a two-layer wiring pattern. However, the number of layers for the wiring pattern can be determined arbitrarily. The light waveguide WG may partially be formed while the wiring structure WS is formed. The second portion 2214 may be formed by patterning not the anti-diffusion film 245a but the etching stopper film 242 as described above or may be formed by patterning another insulation film. A specific insulation film to be patterned to form the second portion 2214 can be decided in accordance with the required position of the upper face of the separator 221.

A method of manufacturing a solid-state image sensor according to the seventh embodiment of the present invention will exemplarily be described below with reference to FIGS. 25 to 28. Note that matters that are not mentioned in the seventh embodiment can comply with the first to sixth embodiments. In the seventh embodiment, a mask which defines openings for a plurality of sub waveguides SWG1 and SWG2 is formed by a plurality of films, as exemplarily shown in FIG. 25. More specifically, a second portion 300 which forms a separator 221 as the mask is used, and the second portion 300 is formed by a plurality of films (2214a and 290).

First, in a step 710, an insulation film 211, an interlayer insulation film 241a, an etching stopper film 242, a wiring pattern 244, and an anti-diffusion film 245a are formed on a semiconductor substrate SS which includes a photoelectric converter and the like by the same method as in steps 610 to 630 of the sixth embodiment. Then, in a step 720, a hard mask film 290a is formed on the anti-diffusion film 245a. The hard mask film 290a can be made of at least one of, for example, silicon carbide, silicon oxycarbide, silicon carbonitride, silicon oxynitride, and silicon nitride. It is desirable that the hard mask film 290a is different from the anti-diffusion film 245a in material but may be the same. Further, the hard mask film 290a is preferably an insulation film. If the hard mask film 290a is a metal film, a light waveguide WG includes the metal film inside. Consequently, light entering the light waveguide WG may be absorbed or reflected, causing a sensitivity decrease or sensitivity variation by a light loss.

Then, in a step 730, the hard mask film 290a is patterned, and a hard mask 290 serving as the first mask is formed. Then, in a step 740, an interlayer insulation film 246a, a wiring pattern 247, an anti-diffusion film 248a, an interlayer insulation film 249a, and a second mask M2 can be formed, as in the step 650 of the sixth embodiment.

Then, in steps 750 and 760, an opening OP is formed in a wiring structure WS. Note that a state indicated as the step 750 is a state in the middle of formation of the opening OP in the wiring structure WS. Films of the wiring structure WS that should be etched in forming the opening OP are the interlayer insulation film 249a, an anti-diffusion film 248, the interlayer insulation film 246a, an interlayer insulation film 243a, and the interlayer insulation film 241a. In forming the opening OP, an etching condition can be changed over a plurality of times in accordance with the films that should be etched.

First, the second mask M2 is used as an etching mask to etch the interlayer insulation film 249a, the anti-diffusion film 248, and the interlayer insulation film 246a via the opening of the second mask M2. Then, after the surface of the second portion 300 of the separator 221, that is, the surface of the hard mask 290 is exposed, the hard mask 290 is used as an etching mask to pattern the anti-diffusion film 245a. This allows an anti-diffusion film 245 patterned so as to define a plurality of openings for the plurality of sub waveguides SWG1 and SWG2 to function as a mask which assists the hard mask 290 serving as the first mask. That is, a mask of stacked structure is formed by the hard mask 290 and the anti-diffusion film 245. This mask of stacked structure can form the second portion 300 of the separator 221. According to the mask of stacked structure, it is possible to increase etching selectivity to the interlayer insulation films 243a and 241a.

Figure 30:
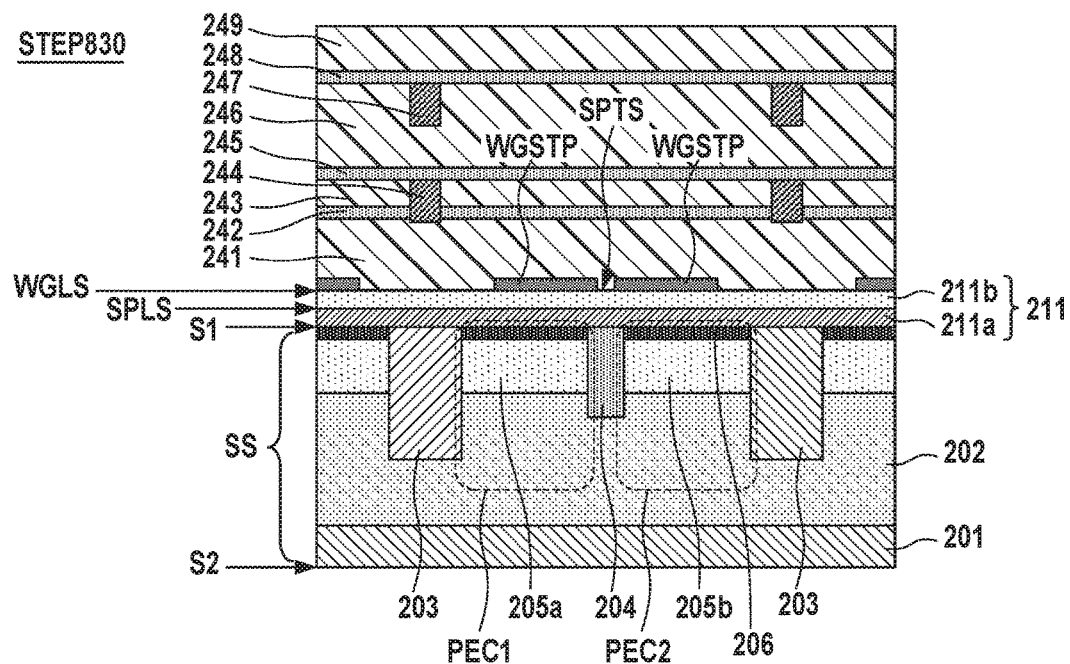
FIG. 30 shows sectional views of the method of manufacturing the solid-state image sensor according to the eighth embodiment of the present invention.
Figure 30:
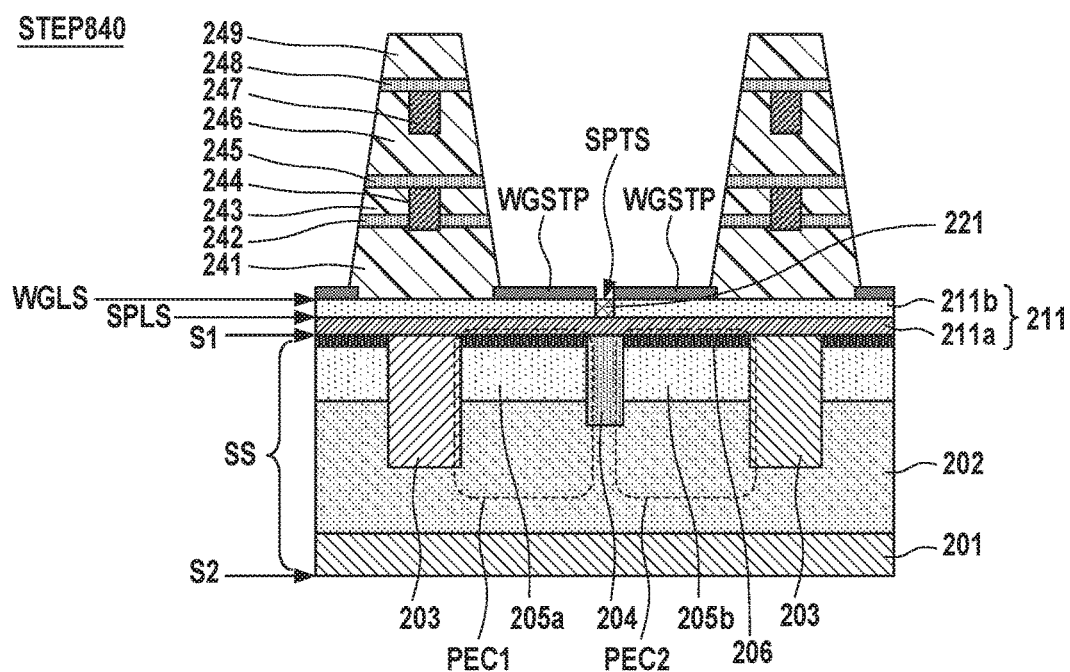
Figure 31:
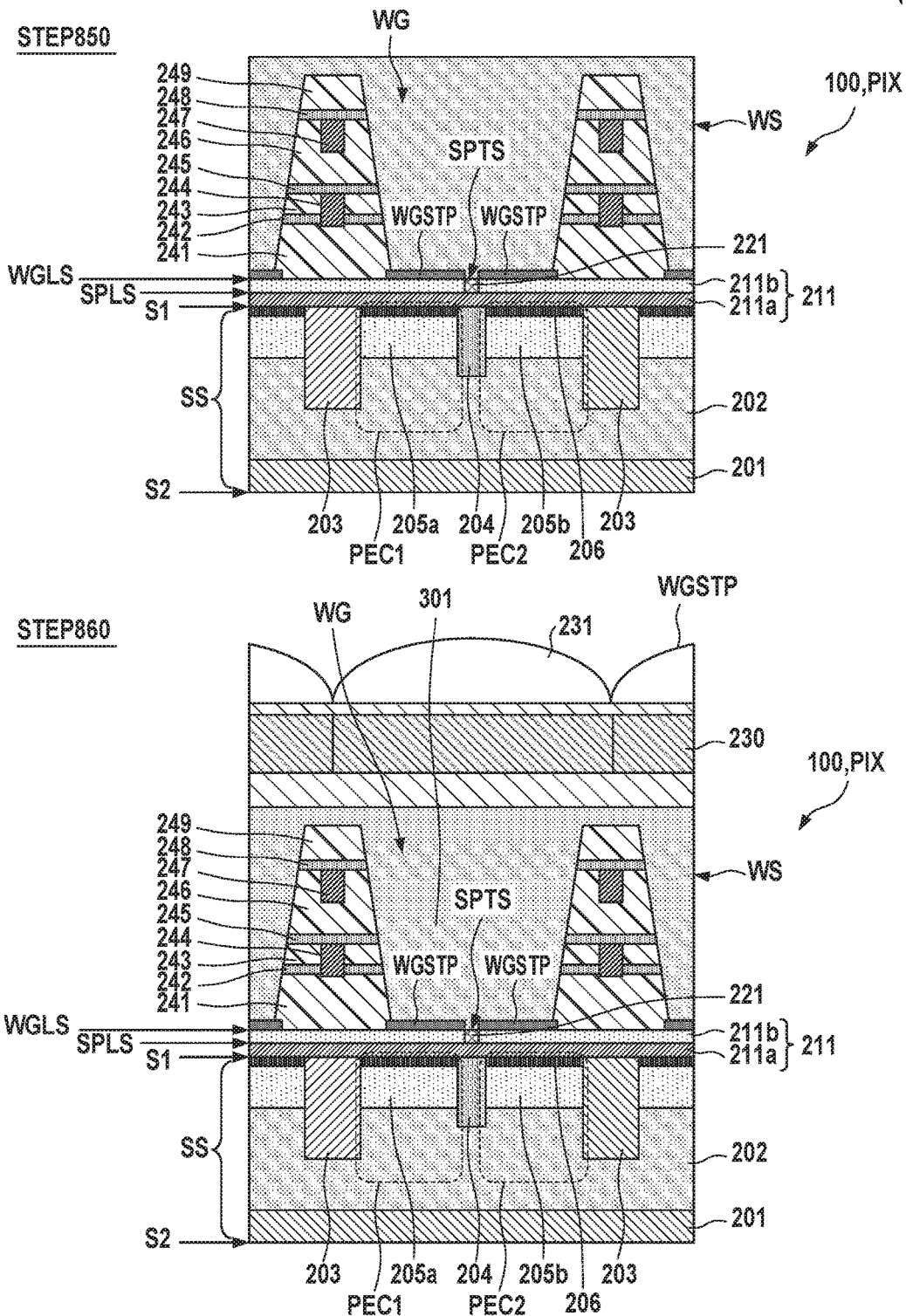
FIG. 31 shows sectional views of the method of manufacturing the solid-state image sensor according to the eighth embodiment of the present invention.
Figure 32A:
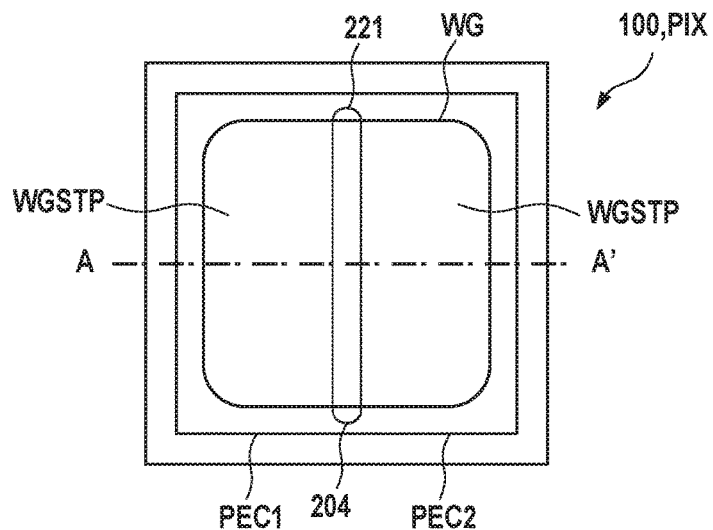
FIGS. 32A and 32B are schematic sectional views showing one pixel of the solid-state image sensor according to the eighth embodiment of the present invention.
Figure 32B:
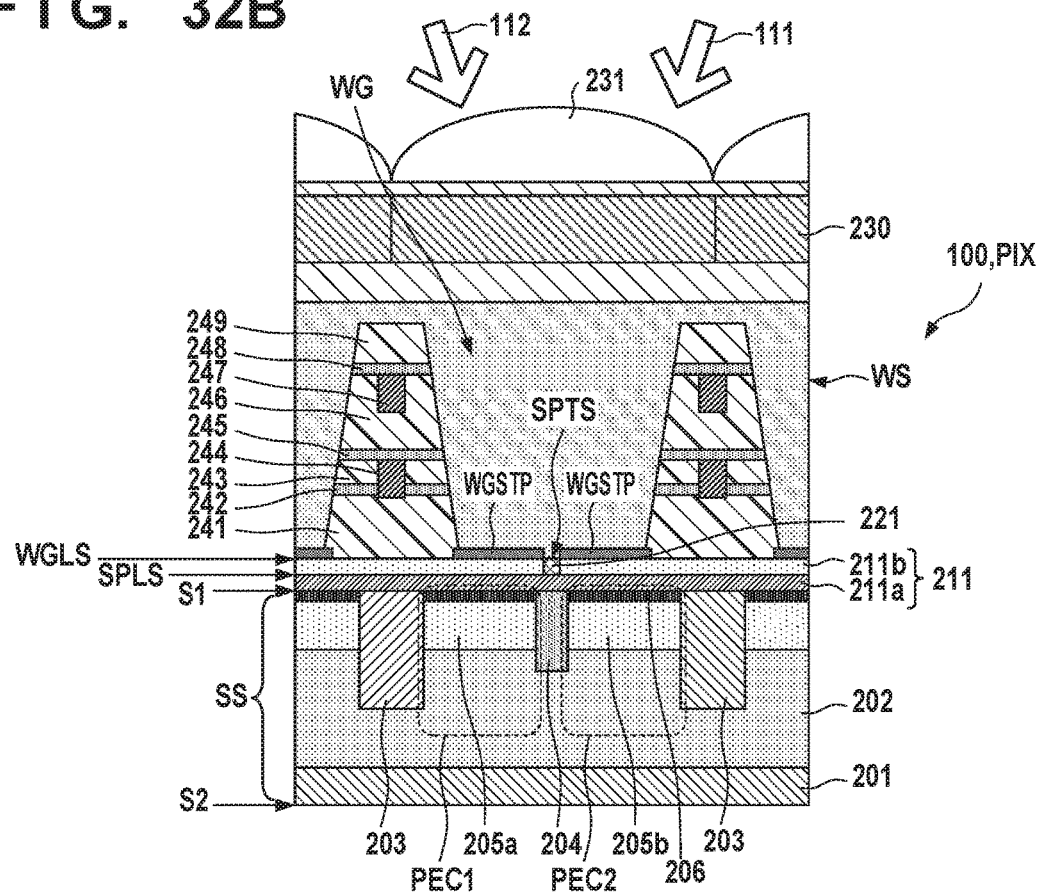

The eighth embodiment of the present invention will be described below with reference to FIGS. 29 to 32B. FIG. 32A is a schematic plan view showing one pixel PIX as a part of a solid-state image sensor 100 according to the eighth embodiment of the present invention. FIG. 32B is a schematic sectional view taken along a line A-A' in FIG. 32A. The solid-state image sensor 100 is a solid-state image sensor having a focus detection function, and the pixel PIX that includes a plurality of pixels arranged two-dimensionally all or some of which have a focus detection function as shown in FIGS. 32A and 32B. Each pixel without the focus detection function typically includes a single photoelectric converter.

The pixel PIX includes a plurality of photoelectric converters PEC1 and PEC2 arranged in a semiconductor substrate SS, and a light waveguide WG provided for the plurality of photoelectric converters PEC1 and PEC2. The light waveguide WG is surrounded by insulation films (interlayer insulation films 241, 243, 246, 249, and the like) so as to pass light entering the plurality of photoelectric converters PEC and PEC2. The light waveguide WG can be formed by, for example, an insulator (first insulator) 301, and an etching stopper film (second insulator) WGSTP arranged between the insulator 301 and the semiconductor substrate SS. At least a part of a lower face WGLS of the light waveguide WG can be formed by the lower face of the etching stopper film WGSTP. The insulator 301 and the etching stopper film WGSTP have compositions different from each other, and thus have mutual etching selectivities. The insulator 301 and the etching stopper film WGSTP can have refractive indices different from each other.

The pixel PIX includes an optical separator 221. In this example, the number of photoelectric converters in one pixel PIX is two, and one separator 221 is provided accordingly. However, the number of photoelectric converters in one pixel PIX may be other than two (for example, four). In that case, the configuration and arrangement of the separator 221 can be modified in accordance with the arrangement of such photoelectric converters.

A light beam 111 that has passed through the first region in the pupil of an imaging lens (not shown) enters the first photoelectric converter PEC1. A light beam 112 that has passed through the second region different from the first region in the pupil enters the second photoelectric converter PEC2. The phase difference between two light beams is detected based on signals detected by photoelectric conversion in the first photoelectric converters PEC1 of the plurality of pixels PIX and signals detected by photoelectric conversion in the second photoelectric converters PEC2 of the plurality of pixels PIX. Consequently, a focus (defocus amount) is detected. The separator 221 optically separates the light beam 111 (light) entering the first photoelectric converter PEC1 and the light beam 112 (light) entering the second photoelectric converter PEC2.

The semiconductor substrate SS can be formed by, for example, a silicon substrate. The semiconductor substrate SS can include, for example, a first semiconductor region 201 of the first conductivity type, a second semiconductor region 202 of the second conductivity type arranged on the first semiconductor region 201, and charge accumulation regions (third semiconductor regions) 205a and 205b of the first conductivity type arranged on the second semiconductor region 202. The semiconductor substrate SS can further include a fourth semiconductor region 206 of the second conductivity type on the charge accumulation regions 205a and 205b. The first photoelectric converter PEC1 can be formed by the second semiconductor region 202, the charge accumulation region 205a, and the fourth semiconductor region 206. The second photoelectric converter PEC2 can be formed by the second semiconductor region 202, the charge accumulation region 205b, and the fourth semiconductor region 206. The first conductivity type and the second conductivity type are conductivity types different from each other. In one example, the first conductivity type is an n type, and the second conductivity type is a p type. In another example, the first conductivity type is the p type, and the second conductivity type is the n type.

The charge accumulation regions 205a and 205b of the plurality of photoelectric converters PEC1 and PEC2 are electrically separated by the fifth semiconductor region of the second conductivity type serving as an electrical separator 204. The charge accumulation portions of the adjacent pixels PIX are electrically separated by electrical separators 203.

Although not shown, a charge-voltage converter (floating diffusion) and a transistor such as a transfer transistor which transfers the charges of the charge accumulation portions to the charge-voltage converter can further be arranged in the semiconductor substrate SS. The electrical separators 203 and 204 can be formed by, for example, an insulator (for example, an STI (Shallow Trench Isolation)) and/or a semiconductor region of the second conductivity type.

The semiconductor substrate SS has a first face S1 and a second face S2 on sides opposite to each other. The light waveguide WG is arranged on the side of the first face S1 of the semiconductor substrate SS. An insulation film 211 can be arranged between the light waveguide WG and the first face S1 of the semiconductor substrate SS. The insulation film 211 can be formed by one or a plurality of insulation layers. The insulation film 211 can function as an antireflection film.

A wiring structure WS is arranged on the side of the first face S1 of the semiconductor substrate SS. A color filter layer 230 and a microlens 231 can be arranged above the wiring structure WS. The wiring structure WS can include, for example, the interlayer insulation films 241, 243, 246, and 249, an etching stopper film (insulation film) 242, anti-diffusion films (insulation films) 245 and 248, wiring patterns 244 and 247, a contact plug, a via plug, and the like. The wiring pattern 244 can be arranged so as to extend through the etching stopper film 242. The anti-diffusion film 245 can be arranged so as to cover the upper face of the wiring pattern 244. The anti-diffusion film 248 can be arranged so as to cover the upper face of the wiring pattern 247. The wiring patterns 244 and 247 can contain, for example, copper as a principal component.

Alternatively, the wiring patterns 244 and 247 can contain, as a principal component, aluminum or tungsten. The light waveguide WG has a taper shape with the area of its upper face being larger than that of its lower face, and the wiring pattern 244 can be arranged inside the upper face of the light waveguide WG, increasing the layout freedom of the wiring pattern 244. Each of the interlayer insulation films 241, 243, 246, and 249 can include at least one of, for example, a silicon oxide film and a silicon oxycarbide film. Each of the etching stopper film 242, and the anti-diffusion films 245 and 248 can include at least one of, for example, a silicon carbide film, a silicon oxycarbide film, a silicon carbonitride film, a silicon oxynitride film, and a silicon nitride film. The light waveguide WG is surrounded by insulation films such as the interlayer insulation films 241, 243, 246, and 249, the etching stopper film 242, the anti-diffusion films 245 and 248, and the like.

The waveguide WG can be formed by forming an opening in the wiring structure WS and filling the opening with an insulator. The refractive index of the insulator is higher than those of the interlayer insulation films 241, 243, 246, and 249. The insulator that forms the waveguide WG can be, for example, silicon nitride.

In the eighth embodiment, the optical separator 221 can be arranged in a region, for example, the insulation film 211 between a plane with the lower face WGLS of the light waveguide WG and the first face S1 of the semiconductor substrate SS. Alternatively, the optical separator 221 can include a portion arranged in the region, for example, the insulation film 211 between the plane with the lower face WGLS of the light waveguide WG and the first face S1 of the semiconductor substrate SS. In another aspect, the optical separator 221 can be arranged in a region, for example, the insulation film 211 between the first face S1 of the semiconductor substrate SS and a face with the lower face of the insulation films (interlayer insulation films 241, 243, 246, 249, and the like) that surround the light waveguide WG. Alternatively, the optical separator 221 can include a portion arranged in the region, for example, the insulation film 211 between the first face S1 of the semiconductor substrate SS and the face with the lower face of the insulation films (interlayer insulation films 241, 246, 249, and the like) that surround the light waveguide WG.

It is desirable that the distance between the lower face SPLS of the separator 221 and the semiconductor substrate SS (the first face S1 thereof) is smaller than the distance between the lower face WGLS of the light waveguide WG and the semiconductor substrate SS (the first face S1 thereof). Alternatively, it is desirable that the distance between the lower face SPLS of the separator 221 and the second face S2 of the semiconductor substrate SS is smaller than the distance between the second face S2 and the lower face WGLS of the light waveguide WG. Such an arrangement is advantageous in improving the separation characteristics of the light beam 111 entering the first photoelectric converter PEC1 and the light beam 112 entering the second photoelectric converter PEC2. Furthermore, the distance between an upper face SPTS of the separator 221 and the first face S1 of the semiconductor substrate SS can be equal to or smaller than the distance between the lower face WGLS of the light waveguide WG and the first face S1 of the semiconductor substrate SS. According to such an arrangement, the height of the separator 221 can be set low, making it possible to suppress a sensitivity decrease by reflection, the entry of the light beam 111 into the second photoelectric converter PEC2, and the entry of the light beam 112 into the first photoelectric converter PEC1. The separator 221 can be formed by a gap. However, it may be filled with an electrically conductive member such as a metal or may be filled with an insulation film having a lower refractive index than in the light waveguide.

The insulation film 211 may also be arranged between the wiring structure WS and the first face S1 of the semiconductor substrate SS. The insulation film 211 is formed by a plurality of insulation layers 211a and 211b. In one example, the insulation layer 211a can be a silicon nitride film, and the insulation layer 211b can be a silicon oxide film or a silicon oxycarbide film.

Figure 29:
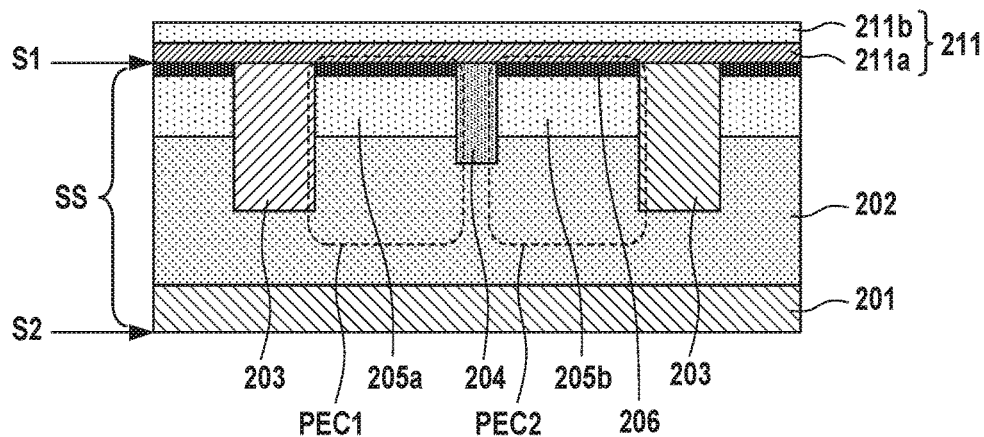
FIG. 29 shows sectional views of a method of manufacturing a solid-state image sensor according to the eighth embodiment of the present invention.
Figure 29:
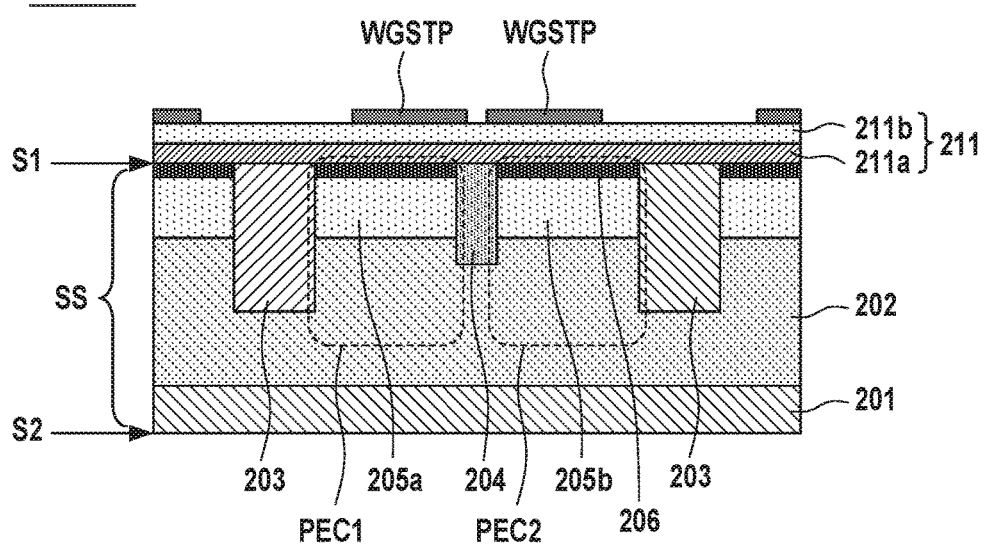

A method of manufacturing the solid-state image sensor 100 of the eighth embodiment of the present invention will exemplarily be described below with reference to FIGS. 29 to 31. In a step 810, the electrical separators 203 and 204, and the photoelectric converters PEC1 and PEC2 can be formed in the semiconductor substrate SS which includes the first semiconductor region 201, and the insulation film 211 can be formed on the semiconductor substrate SS. The separators 203 and 204 can be formed by, for example, an insulator (for example, an STI (Shallow Trench Isolation)) and/or a semiconductor region of the second conductivity type.

Then, in a step 820, the etching stopper film WGSTP that functions as an etching stopper film is formed when an opening is formed in the insulation films (interlayer insulation films 241, 243, 246, 249, and the like) for the light waveguide WG. The etching stopper film WGSTP can be formed by, for example, patterning an insulation film of silicon nitride or the like through photolithography and anisotropic etching. The etching stopper film WGSTP is patterned to have a slit above the separator 204.

Then, in a step 830, contact holes are formed in the interlayer insulation film 241, and the etching stopper film 242, the interlayer insulation film 243, the wiring pattern 244, the anti-diffusion film 245, the interlayer insulation film 246, the wiring pattern 247, the anti-diffusion film 248, and the interlayer insulation film 249 are formed.

Then, in a step 840, an opening (first opening) for forming the light waveguide WG can be formed, by photolithography and etching, in the wiring structure WS (the interlayer insulation films 241, 243, 246, 249, and the like). Note that the etching stopper film WGSTP functions as an etching hard mask having a slit (second opening) for forming the separator 221. Using the etching stopper film WGSTP, the separator 221 as a trench corresponding to the slit (second opening) can be formed simultaneously with formation of the opening (first opening) for the light waveguide WG. More specifically, the separator 221 or the trench for the separator 221 can be formed in the insulation film 211 by etching the insulation film 211 via the second opening when the first opening for the light waveguide WG is formed in the wiring structure WS.

Then, in a step 850, the opening (first opening) formed in the wiring structure WS is filled with an insulator 301 of silicon nitride or the like, forming the light waveguide WG. At this time, the opening is filled with the insulator 301 up to the lower face WGLS of the light waveguide by optimizing a condition used for filling. Consequently, the insulator 301 can be positioned in the etching stopper film WGSTP, and the separator 221 can be formed as a gap below the insulator 301 in the etching stopper film WGSTP.

Then, in a step 860, an inner lens (not shown), a passivation film, a planarizing film, and the like are formed, and then the color filter layer 230 and the microlens 231 are formed. In the above example, the wiring structure WS includes a two-layer wiring pattern. However, the number of layers for the wiring pattern can be determined arbitrarily.

As a modification of this embodiment, an etching step of forming the separator 221 or the trench for the separator 221 by using the etching stopper film WGSTP as the etching hard mask may be added between the step 820 and the step 830. In this case, in the step 830, the interlayer insulation film 241 may or may not be positioned in the opening of the etching stopper film WGSTP. Further, the light waveguide WG may not be formed.

It is advantageous, in order to improve a focus detection accuracy or increase the light-receiving sensitivity of the solid-state image sensor, to form the upper face of each separator that separates the plurality of light beams from each other limitedly to the lower face or lower of the light waveguide.

The ninth embodiment applicable to the first to eighth embodiments will be described below. The ninth embodiment provides an arrangement in which a separator 221 provided in a pixel away from the center of a pixel array region is shifted from the center of that pixel. The separator 221 can be shifted in a direction approaching the center of the pixel array region.

For convenience of providing a concrete example, an example will be described below in which the ninth embodiment is applied to the fourth embodiment. However, the ninth embodiment can also be applied to the first to third embodiments and the fifth to eighth embodiments. FIGS. 11A and 11B show the arrangement of the separator 221 in a pixel PIX arranged in the center of a pixel array region formed by arranging a plurality of pixels so as to form a plurality of rows and a plurality of columns. In FIGS. 11A and 11B, the separator 221 is arranged so as to cross the center of the pixel PIX. In other words, in FIGS. 11A and 11B, a first photoelectric converter PEC1 and a second photoelectric converter PEC2 have a symmetrical structure with respect to a symmetry axis, and the separator 221 is arranged on the symmetry axis.

Figure 33A:
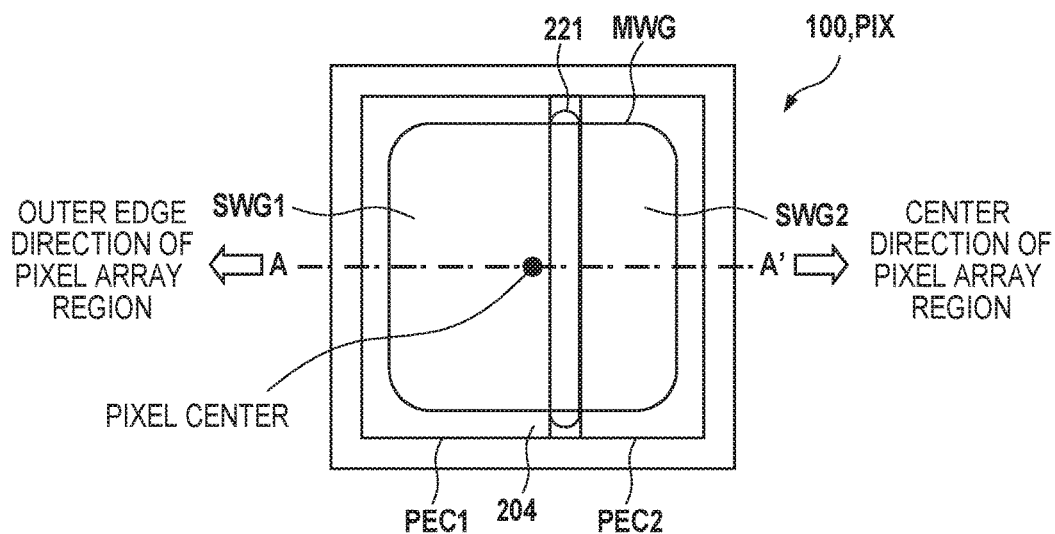
FIGS. 33A and 33B are schematic sectional views showing one pixel of a solid-state image sensor according to the ninth embodiment of the present invention.
Figure 33B:
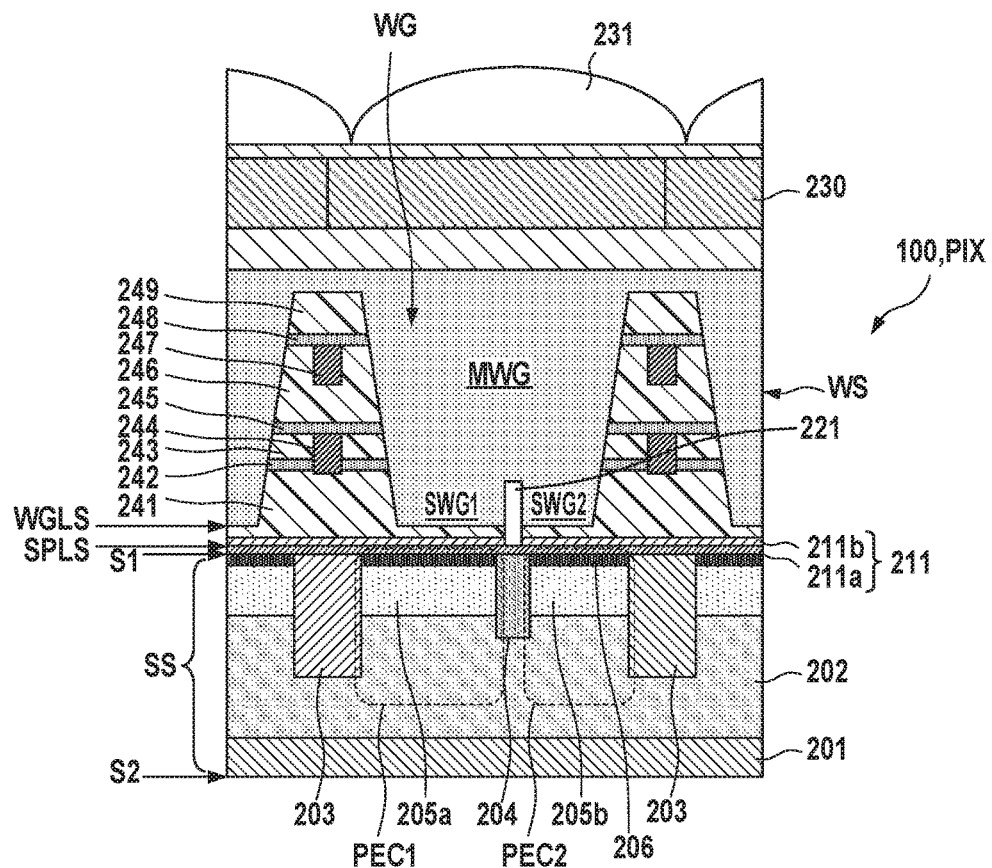

FIGS. 33A and 33B show the arrangement of the separator 221 in the pixel PIX arranged at a position shifted, to an outer edge side, from the center of a pixel array region formed by arranging a plurality of pixels so as to form a plurality of rows and a plurality of columns. In FIGS. 33A and 33B, the separator 221 is arranged at a position shifted from the center of the pixel PIX to the center direction of a pixel array region. In accordance with this, a microlens 231 can also be arranged to be shifted from the center of the pixel PIX to the center direction of the pixel array region. Further, an electrical separator 204 between charge accumulation regions 205a and 205b of the plurality of photoelectric converters PEC1 and PEC2 can be arranged to be shifted in the center direction of the pixel array region so as to be arranged immediately below the optical separator 221.

As an application of the solid-state image sensor according to each embodiment described above, a camera in which the solid-state image sensor is assembled will exemplarily be described below. The concept of the camera includes not only a device mainly aiming at shooting but also an electronic device (for example, an electronic device such as a personal computer or a portable terminal) accessorily having a shooting function. It is also possible to mount the camera on transportation equipment including a moving apparatus such as an automobile, a ship, or an airplane. The camera includes the solid-state image sensor according to the present invention exemplified as each embodiment described above, and a processing unit which processes information based on a signal output from the solid-state image sensor. The processing unit can include a processor which processes digital data as image data. The processor can perform a process for calculating a defocus amount based on a signal from a pixel having the focus detection function of the solid-state image sensor and controlling, based on this, focus adjustment of an imaging lens. Alternatively, the processor can perform a process for calculating a distance to a shooting target from the principle of triangulation by a phase difference (parallax) based on a signal from the pixel having a phase difference detection function of the solid-state image sensor and measuring the distance based on this. In the camera, a distance measurement function is used to generate an image containing distance measurement information. Moreover, in the transportation equipment including the solid-state image sensor, the distance measurement function can be used to control the operation of the transportation equipment according to a distance between it and a surrounding object. In addition to the fact that the solid-state image sensor can include an A/D converter which generates the above-described image data, it can be provided individually from the solid-state image sensor. Similarly to the photoelectric converters PEC1 and 2, the A/D converter of the solid-state image sensor can be provided on a semiconductor substrate SS by using a salicide process or the like. Alternatively, the A/D converter of the solid-state image sensor can also be provided on another semiconductor substrate stacked on and electrically connected to the semiconductor substrate SS by using a through electrode (TSV), a junction electrode (bump), or the like.

The above-described solid-state image sensor 100 is a so-called front-side illumination solid-state image sensor with a wiring structure WS and a light waveguide WG being arranged on the side of a front side (first face S1) as the same face of the semiconductor substrate SS. The present invention is not limited to this but can also be applicable to a so-called back-side illumination solid-state image sensor with the light waveguide WG being arranged on the side of a back side (face S1) as one of two principal faces of the semiconductor substrate SS, and the wiring structure WS being arranged on the side of a back side (face S2) as the other of the two principal faces of the semiconductor substrate SS.

The above-described arrangement in which the plurality of photoelectric converters PEC1 and PEC2 are provided in one pixel PIX is suitable for achieving a focus detection function by a phase difference detection method but may also be used for another purpose. For example, it is possible to achieve a wide dynamic range by utilizing a characteristic difference (difference in saturated charge quantity or sensitivity) between the plurality of photoelectric converters PEC1 and PEC2. Alternatively, it is also possible to perform a process for a shake or blur at the time of image capturing by encoding an exposure period in the plurality of photoelectric converters PEC1 and PEC2, and using encoded signals from the plurality of photoelectric converters PEC1 and PEC2.

The above-described embodiments can be summarized by a plurality of aspects as follows.

[Aspect 1] There is provided an image sensor including a plurality of pixels, wherein at least one of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides arranged between the main waveguide and the semiconductor substrate, lights respectively entering the plurality of photoelectric converters respectively passing through the plurality of sub waveguides, and the plurality of sub waveguides are separated from each other by a separator including an electrically conductive member.

[Aspect 2] There is provided the sensor according to aspect 1, wherein the separator includes a cover portion arranged between the electrically conductive member and the main waveguide so as to cover the electrically conductive member.

[Aspect 3] There is provided the sensor according to aspect 2, wherein a refractive index of the cover portion is lower than that of a material configured to form the light waveguide.

[Aspect 4] There is provided the sensor according to aspect 2 or 3, wherein the cover portion includes a taper-shaped portion configured to taper as the taper-shaped portion becomes more spaced apart from the semiconductor substrate.

[Aspect 5] There is provided the sensor according to aspect 4, wherein a width of an upper face of the cover portion is narrower than that of an upper face of the electrically conductive member.

[Aspect 6] There is provided the sensor according to any one of aspects 2 to 5, wherein the cover portion functions as an antireflection film.

[Aspect 7] There is provided the sensor according to any one of aspects 2 to 5, wherein the cover portion scatters light entering the cover portion.

[Aspect 8] There is provided the sensor according to any one of aspects 2 to 7, wherein the cover portion is formed by an insulator.

[Aspect 9] There is provided the sensor according to any one of aspects 2 to 8, wherein the cover portion covers side faces of the electrically conductive member.

[Aspect 10] There is provided the sensor according to any one of aspects 2 to 8, wherein the cover portion does not cover at least some side faces of the electrically conductive member.

[Aspect 11] There is provided the sensor according to any one of aspects 1 to 10, wherein a distance between a lower face of the separator and the semiconductor substrate is smaller than that between a lower face of the light waveguide and the semiconductor substrate.

[Aspect 12] There is provided the sensor according to aspect 11, wherein an insulation film is arranged between the lower face of the light waveguide and the semiconductor substrate, and a lower portion of the separator is buried in the insulation film.

[Aspect 13] There is provided the sensor according to aspect 12, wherein the insulation film is an antireflection film.

[Aspect 14] There is provided the sensor according to any one of aspects 11 to 13, wherein the lower face of the separator is positioned between the semiconductor substrate and a plane with the lower face of the light waveguide.

[Aspect 15] There is provided the sensor according to any one of aspects 1 to 14, wherein the electrically conductive member includes a metal material.

[Aspect 16] There is provided the sensor according to aspect 15, wherein the at least one of the plurality of pixels further includes a plurality of charge holding portions, respectively, configured to hold charges transferred from the plurality of photoelectric converters, a metal film is arranged so as to cover the plurality of charge holding portions, and the electrically conductive member is made of the same material as the metal film.

[Aspect 17] There is provided the sensor according to aspect 15, wherein a gate electrode is arranged on a gate insulation film on the semiconductor substrate, a metal film is arranged so as to cover the gate electrode, and the electrically conductive member is made of the same material as the metal film.

[Aspect 18] There is provided the sensor according to any one of aspects 1 to 14, wherein the electrically conductive member is made of the same material as a material configured to form a gate electrode.

[Aspect 19] There is provided the sensor according to aspect 18, wherein the gate electrode is arranged on a gate insulation film on the semiconductor substrate, and the electrically conductive member is arranged on the gate insulation film.

[Aspect 20] There is provided the sensor according to any one of aspects 1 to 19, wherein the at least one of the plurality of pixels further includes microlenses provided for the plurality of photoelectric converters.

[Aspect 21] There is provided the sensor according to aspect 20, wherein a distance between an upper face of the separator and the semiconductor substrate is smaller than that of a focus of each microlens and the semiconductor substrate.

[Aspect 22] There is provided an image sensor including a plurality of pixels, wherein at least one of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides arranged between the main waveguide and the plurality of photoelectric converters, lights respectively entering the plurality of photoelectric converters individually and respectively passing through the plurality of sub waveguides, the plurality of sub waveguides are separated from each other by a separator, and a distance between a lower face of the separator and the semiconductor substrate is smaller than that of a lower face of the light waveguide and the semiconductor substrate.

[Aspect 23] There is provided the sensor according to aspect 22, wherein the at least one of the plurality of pixels further includes microlenses provided for the plurality of photoelectric converters.

[Aspect 24] There is provided the sensor according to aspect 23, wherein a distance between an upper face of the separator and the semiconductor substrate is smaller than that of a focus of each microlens and the semiconductor substrate.

[Aspect 25] There is provided the sensor according to any one of aspects 22 to 24, wherein an insulation film is arranged between the lower face of the light waveguide and the semiconductor substrate, and a lower portion of the separator is buried in the insulation film.

[Aspect 26] There is provided the sensor according to aspect 25, wherein the insulation film is an antireflection film.

[Aspect 27] There is provided the sensor according to any one of aspects 22 to 26, wherein the lower face of the separator is positioned between the semiconductor substrate and a plane with the lower face of the light waveguide.

[Aspect 28] There is provided the sensor according to any one of aspects 22 to 27, wherein an upper portion of the separator has a taper shape which tapers as the separator becomes more spaced apart from the semiconductor substrate.

[Aspect 29] There is provided the sensor according to any one of aspects 22 to 28, wherein the separator is a gap.

[Aspect 30] There is provided the sensor according to any one of aspects 22 to 29, wherein the separator includes an electrically conductive member.

[Aspect 31] There is provided an image sensor including a plurality of pixels, wherein at least one of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides arranged between the main waveguide and the semiconductor substrate and through which the light entering each of the plurality of photoelectric converters passes, and the plurality of sub waveguides are separated from each other by a separator, and the separator includes a first portion and a second portion arranged between the first portion and the main waveguide so as to cover the first portion.

[Aspect 32] There is provided the sensor according to aspect 31, wherein the light waveguide is arranged in a wiring structure, the wiring structure includes a wiring pattern and an anti-diffusion film arranged so as to contact the wiring pattern, and the second portion includes a portion made of the same material as the anti-diffusion film.

[Aspect 33] There is provided the sensor according to aspect 32, wherein the wiring structure includes an interlayer insulation film, and the first portion includes a portion made of the same material as the interlayer insulation film.

[Aspect 34] There is provided the sensor according to aspect 31, wherein the light waveguide is arranged in a wiring structure, the wiring structure includes a first insulation film, and a second insulation film arranged between the first insulation film and the semiconductor substrate, and the second portion includes a portion made of the same material as the second insulation film.

[Aspect 35] There is provided the sensor according to aspect 34, wherein the wiring structure further includes a wiring pattern configured to extend through the first insulation film and the second insulation film.

[Aspect 36] There is provided the sensor according to aspect 34 or 35, wherein the wiring structure further includes a third insulation film arranged between the second insulation film and the semiconductor substrate, and a contact plug configured to extend through the third insulation film.

[Aspect 37] There is provided an image sensor including a plurality of pixels, wherein at least one of the plurality of pixels includes a plurality of photoelectric converters arranged in a semiconductor substrate, a light waveguide provided for the plurality of photoelectric converters, and an optical separator, light entering each of the plurality of photoelectric converters is separated by the separator, and the separator includes a portion arranged between the semiconductor substrate and a plane with a lower face of the light waveguide.

[Aspect 38] There is provided the sensor according to aspect 37, wherein the light waveguide is surrounded by an insulation film so as to pass the light entering the plurality of photoelectric converters, and the portion is arranged between the semiconductor substrate and a plane with a lower face of the insulation film.

[Aspect 39] There is provided the sensor according to aspect 37 or 38, wherein the light waveguide includes a first insulator, and a second insulator arranged between the first insulator and the semiconductor substrate, and the portion is arranged between the semiconductor substrate and a plane with a lower face of the second insulator.

[Aspect 40] There is provided the sensor according to any one of aspects 37 to 39, wherein the separator has a gap.

[Aspect 41] There is provided the sensor according to any one of aspects 1 to 40, wherein the separator of a pixel arranged at a position away from a center of a pixel array formed by the plurality of pixels is arranged to be shifted from a center of the pixel to a direction approaching the center of the pixel array.

[Aspect 42] There is provided the sensor according to aspect 41, wherein each of the plurality of pixels includes a microlens, and the microlens of the pixel arranged at the position away from the center of the pixel array is arranged to be shifted from the center of the pixel to the direction approaching the center of the pixel array.

[Aspect 43] There is provided the sensor according to aspect 41 or 42, wherein each of the plurality of pixels includes an electrical separator configured to electrically separate the plurality of photoelectric converters from each other, and the electrical separator of the pixel arranged at the position away from the center of the pixel array is arranged to be shifted from the center of the pixel to the direction approaching the center of the pixel array.

[Aspect 44] There is provided a method of manufacturing an image sensor including a plurality of pixels, at least one of the plurality of pixels including a plurality of photoelectric converters arranged in a semiconductor substrate and a light waveguide provided for the plurality of photoelectric converters, the light waveguide including a main waveguide surrounded by an insulation film so as to pass light entering the plurality of photoelectric converters, and a plurality of sub waveguides arranged between the main waveguide and the semiconductor substrate, lights respectively entering the plurality of photoelectric converters individually and respectively passing through the plurality of sub waveguides, and the plurality of sub waveguides being separated from each other by a separator including an electrically conductive member, the manufacturing method comprising:

forming an electrically conductive material film on the semiconductor substrate;

forming the electrically conductive member by patterning the electrically conductive material film;

forming a wiring structure on the separator; and forming the light waveguide in the wiring structure.

[Aspect 45] There is provided the method according to aspect 44, wherein the electrically conductive material film is a metal film.

[Aspect 46] There is provided the method according to aspect 45, wherein the at least one of the plurality of pixels further includes a plurality of charge holding portions, respectively, configured to hold charges transferred from the plurality of photoelectric converters, and in the forming the electrically conductive member, a light blocking film configured to cover the plurality of charge holding portions is formed simultaneously with the electrically conductive member by patterning the electrically conductive material film.

[Aspect 47] There is provided the method according to aspect 44, wherein the electrically conductive material film is a film made of the same material as a material configured to form a gate electrode.

[Aspect 48] There is provided the method according to aspect 47, wherein in the forming the electrically conductive member, the gate electrode is formed simultaneously with the electrically conductive member by patterning a film of the same material as the material configured to form the gate electrode.

[Aspect 49] There is provided a method of manufacturing an image sensor including a plurality of pixels, at least one of the plurality of pixels including a plurality of photoelectric converters arranged in a semiconductor substrate and a light waveguide provided for the plurality of photoelectric converters, and the light waveguide including a main waveguide surrounded by an insulation film so as to pass light entering the plurality of photoelectric converters, and a plurality of sub waveguides arranged between the main waveguide and the semiconductor substrate and through which the light entering each of the plurality of photoelectric converters passes the manufacturing method comprising:

forming a first insulation film on the semiconductor substrate;

forming a first mask on the first insulation film;

forming a second insulation film on the first insulation film and the first mask;

forming a second mask on the second insulation film;

forming an opening for the light waveguide by etching the second insulation film and the first insulation film; and forming the light waveguide by filling the opening with an insulator, wherein in the forming each opening, an opening for the main waveguide is formed by etching the second insulation film so as to expose the first mask by using the second mask as an etching mask, and then a plurality of openings for the plurality of sub waveguides are formed by etching the first insulation film by using the second mask and the first mask as etching masks.

[Aspect 50] There is provided the method according to aspect 49, wherein the first mask includes an insulation film.

[Aspect 51] There is provided the method according to aspect 49, wherein the first mask includes at least one of a silicon carbide film, a silicon oxycarbide film, a silicon carbonitride film, a silicon oxynitride film, and a silicon nitride film.

[Aspect 52] There is provided the method according to any one of aspects 49 to 51, further comprising forming, after the first insulation film is formed, a wiring pattern by forming a trench in the first insulation film and filling the trench with an electrically conductive material, and forming, after the wiring pattern is formed, an anti-diffusion film configured to cover the first insulation film and the wiring pattern, wherein in the forming the first mask, the first mask is formed by patterning the anti-diffusion film so as to remove a region of the anti-diffusion film where the plurality of openings for the plurality of sub waveguides should be formed.

[Aspect 53] There is provided the method according to any one of aspects 49 to 51, further comprising, before the first insulation film is formed, forming a third insulation film, forming a fourth insulation film on the third insulation film, forming a trench in the fourth insulation film, and forming a wiring pattern by filing the trench with an electrically conductive material, wherein in the forming the first mask, the first mask is formed by patterning the third insulation film so as to remove a portion of the third insulation film where the plurality of openings for the plurality of sub waveguides should be formed.

[Aspect 54] There is provided the method according to any one of aspects 49 to 51, further comprising forming an insulation film after the first insulation film is formed and before the first mask is formed, wherein in the forming the openings, after the second insulation film is etched so as to expose the first mask by using the second mask as the etching mask, the insulation film is patterned by using the first mask as the etching mask, and a mask having a stacked structure of the first mask and the patterned insulation film is formed.

[Aspect 55] There is provided a method of manufacturing an image sensor including a plurality of pixels, at least one of the plurality of pixels including a plurality of photoelectric converters arranged in a semiconductor substrate, a light waveguide provided for the plurality of photoelectric converters, and an optical separator, light entering each of the plurality of photoelectric converters being separated by the separator, and the separator including a portion arranged between the semiconductor substrate and a plane with a lower face of the light waveguide, the manufacturing method comprising:

forming an insulation film on the semiconductor substrate where the plurality of photoelectric converters are formed;

forming, on the insulation film, an etching stopper film having an opening for forming the separator;

forming, on the etching stopper film, a wiring structure including an interlayer insulation film and a wiring pattern; and forming a first opening for the light waveguide by etching the interlayer insulation film and forming an opening for the separator by etching the insulation film via the opening.

[Aspect 56] There is provided a camera comprising:

an image sensor defined in any one of aspects 1 to 43; and a processing unit configured to process a signal output from the image sensor, wherein the processing unit performs a process for one of focus detection and distance measurement by a phase difference detection method by using the signal output from the image sensor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2016-158129, filed Aug. 10, 2016, and 2017-114551, filed Jun. 9, 2017, which are hereby incorporated by reference herein in their entirety.

What is claimed is:

1. An image sensor including a plurality of pixels, wherein at least a pixel of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides each arranged between the main waveguide and a corresponding photoelectric converter of the plurality of photoelectric converters, a gate electrode is arranged above the semiconductor substrate via a gate insulation film, and the plurality of sub waveguides are separated from each other by a separator including an electrically conductive member having a portion which is made of the same material as the gate electrode.

2. The sensor according to claim 1, wherein the separator includes a cover portion arranged to cover an upper and side faces of the electrically conductive member.

3. The sensor according to claim 2, wherein an insulating film is arranged between the plurality of sub waveguides and the semiconductor substrate, the insulating film and the cover portion being made from the same insulating material which is different from a material configured to form the light waveguide.

4. The sensor according to claim 2, wherein the cover portion includes a taper-shaped portion configured to taper as the taper-shaped portion becomes more spaced apart from the semiconductor substrate.

5. The sensor according to claim 1, wherein a distance between a lower face of the separator and the semiconductor substrate is smaller than that between a lower face of the light waveguide and the semiconductor substrate.

6. The sensor according to claim 1, wherein a first insulation film is arranged between the lower face of the light waveguide and the semiconductor substrate, and a second insulation film is arranged between the lower face of the light waveguide and an upper face of the first insulation film, and
a lower portion of the separator is buried in the second insulation film such that the lower portion of the separator contacts the upper face of the first insulation film.

7. An image sensor including a plurality of pixels, wherein at least a pixel of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides each arranged between the main waveguide and a corresponding photoelectric converter of the plurality of photoelectric converters, the plurality of sub waveguides are separated from each other by a separator including an electrically conductive member, and
each of the at least some of the pixels further includes a gate electrode arranged on a gate insulation film on the semiconductor substrate and a charge holding portion configured to hold charges transferred from at least one of the plurality of photoelectric converters, a metal film is arranged so as to cover at least one of the charge holding portion and the gate electrode, and the electrically conductive member is made of the same material as one of the gate electrode and the metal film.

8. An image sensor including a plurality of pixels, the sensor comprising:
a semiconductor substrate;
a first insulation film arranged above the semiconductor substrate;
a second insulation film arranged above the first insulation film; and
a third insulation film arranged above the second insulation film,
wherein at least a pixel of the plurality of pixels includes a plurality of photoelectric converters arranged in the semiconductor substrate and a light waveguide provided for the plurality of photoelectric converters, the light waveguide being arranged in an opening provided in the third insulation film,
the light waveguide includes a main waveguide surrounded by the third insulation film so as to pass light entering the plurality of photoelectric converters, and a plurality of sub waveguides each arranged between the main waveguide and an upper face of the second insulation film so as to being positioned above a corresponding photoelectric converter of the plurality of photoelectric converters,
the plurality of sub waveguides are separated from each other by a separator having a lower face contacting an upper face of the first insulation film, and
a distance between the lower face of the separator and the semiconductor substrate is smaller than that of a lower face of the light waveguide and the semiconductor substrate.

9. The sensor according to claim 8, wherein
a lower portion of the separator includes an electrically conductive member buried in the insulation film.

10. The sensor according to claim 8, wherein the lower face of the separator is positioned between the semiconductor substrate and a plane including the lower face of the light waveguide.

11. The sensor according to claim 8, wherein an upper portion of the separator has a taper shape which tapers as the separator becomes more spaced apart from the semiconductor substrate.

12. The sensor according to claim 8, wherein the separator has a gap.

13. An image sensor including a plurality of pixels, wherein at least a pixel of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides each arranged between the main waveguide and a corresponding photoelectric converter of the plurality of photoelectric converters, and the plurality of sub waveguides are separated from each other by a separator, and the separator includes a first portion and a second portion arranged between the first portion and the main waveguide so as to cover the first portion, the second portion including at least one of a silicon carbide film, a silicon oxycarbide film, a silicon carbonitride film, a silicon oxynitride film, and a silicon nitride film, the first portion being made of material different from that of the second portion.

14. The sensor according to claim 13, wherein the light waveguide is arranged in a wiring structure, the wiring structure includes a first insulation film, and a second insulation film arranged between the first insulation film and the semiconductor substrate, a distance between the first insulation film and the semiconductor substrate is the same as that between the second portion and the semiconductor substrate, the first portion includes a portion made of the same material as the second insulation film, and the second portion includes a portion made of the same material as the first insulation film.

15. An image sensor including a plurality of pixels, the sensor comprising:

a semiconductor substrate;

a first insulation film arranged above the semiconductor substrate;

a second insulation film arranged above the first insulation film; and a third insulation film arranged above the second insulation film, wherein at least a pixel of the plurality of pixels includes a plurality of photoelectric converters arranged in the semiconductor substrate, a light waveguide provided for the plurality of photoelectric converters and arranged in an opening provided in the third insulating film, and an optical separator having a lower face contacting an upper face of the first insulation film, light entering each of the plurality of photoelectric converters is separated by the separator, and the separator includes a portion arranged between the upper face of the first insulation film and a plane including the upper face of the second insulation layer.

16. The sensor according to claim 15, wherein the light waveguide includes a first insulator, and a second insulator arranged between the first insulator and the semiconductor substrate, and the portion is arranged between the semiconductor substrate and a plane including a lower face of the second insulator.

17. The sensor according to claim 15, wherein the separator has a gap.

18. The sensor according to claim 15, wherein the separator of a pixel arranged at a position away from a center of a pixel array formed by the plurality of pixels is arranged to be shifted from a center of the pixel to a direction approaching the center of the pixel array.

19. The sensor according to claim 18, wherein each of the plurality of pixels includes a region configured to electrically separate the plurality of photoelectric converters from each other, and the region of the pixel arranged at the position away from the center of the pixel array is arranged to be shifted from the center of the pixel to the direction approaching the center of the pixel array.

20. A device comprising:

an image sensor defined in claim 7; and a processing unit configured to process a signal output from the image sensor, wherein the processing unit performs a process for phase difference detection by using the signal output from the image sensor.

21. An image sensor including a plurality of pixels, wherein at least a pixel of the plurality of pixels includes a plurality of photoelectric converters arranged in a semiconductor substrate and a light waveguide provided for the plurality of photoelectric converters, the light waveguide includes a main waveguide surrounded by an insulation film so as to pass light entering the plurality of photoelectric converters, and a plurality of sub waveguides each arranged between the main waveguide and a corresponding photoelectric converter of the plurality of photoelectric converters, the plurality of sub waveguides are separated from each other by a separator including a member and a cover portion arranged to cover a top and side faces of the member, and an insulating film is arranged between the plurality of sub waveguides and the semiconductor substrate, the insulating film being connected to the cover portion and extending between the insulation film and the semiconductor substrate.

22. The sensor according to claim 21, wherein the insulating film and the cover portion being made from the same insulating material which is different from a material configured to form the light waveguide.

* * * * *